US012790135B2

(12) United States Patent
Hosek et al.

(10) Patent No.: US 12,790,135 B2
(45) Date of Patent: Nov. 10, 2026

(54) MAGNETICALLY GUIDED MATERIAL HANDLING ROBOT

(71) Applicants: Persimmon Technologies Corporation, Wakefield, MA (US); Sumitomo Heavy Industries, Ltd., Tokyo (JP)

(72) Inventors: Martin Hosek, Lowell, MA (US); Sripati Sah, Wakefield, MA (US); Scott Frash, Georgetown, MA (US)

(73) Assignee: Persimmon Technologies Corporation, Wakefield, MA (US)

( * ) Notice: Subject to any disclaimer, the term of this patent is extended or adjusted under 35 U.S.C. 154(b) by 411 days.

(21) Appl. No.: 18/381,742

(22) Filed: Oct. 19, 2023

(65) Prior Publication Data

US 2024/0043228 A1 Feb. 8, 2024

Related U.S. Application Data

(62) Division of application No. 16/788,993, filed on Feb. 12, 2020.

(Continued)

(51) Int. Cl.
*B65G 47/92* (2006.01)
*H02K 7/09* (2006.01)

(Continued)

(52) U.S. Cl.
CPC ............. *B65G 47/92* (2013.01); *H02K 11/21* (2016.01); *H02K 11/35* (2016.01); *H02K 41/033* (2013.01);

(Continued)

(58) Field of Classification Search
CPC ........ B65G 54/02; B65G 47/92; H02K 11/21; H02K 11/35; H02K 41/033; H10P 72/3204; H02N 15/00

(Continued)

(56) References Cited

U.S. PATENT DOCUMENTS 5,720,590 A 2/1998 Hofmeister
5,760,500 A 6/1998 Kondo et al.

(Continued)

FOREIGN PATENT DOCUMENTS

CN 104070644 A 10/2014
CN 106415813 A 2/2017

(Continued)

OTHER PUBLICATIONS

JP Office Action dated Jun. 25, 2026, JP Application No. 2025-129048.

*Primary Examiner* — Burton S Mullins
(74) *Attorney, Agent, or Firm* — McCarter & English, LLP

(57) ABSTRACT

An apparatus including a first device configured to support a substrate thereon; a first transport having the first device connected thereto, where the first transport includes: rails or maglev guides; a magnetic system configured to vertically space the first device over the rails or maglev guides with a gap between the first device and the rails or maglev guides, where the magnetic system comprises a first electromagnetic actuator at a first corner of a first side of the first device, a second electromagnetic actuator at a second corner of the first side of the first device, and a third electromagnetic actuator at a second opposite side of the first device, where the third electromagnetic actuator is not located proximate a corner of three sides of the first device; and a linear actuator configured to move the first device along the rails or maglev guides.

11 Claims, 62 Drawing Sheets

Related U.S. Application Data

(60) Provisional application No. 62/805,546, filed on Feb. 14, 2019.

(51) Int. Cl.

| | |
|---|---|
| ***H02K 11/21*** | (2016.01) |
| ***H02K 11/35*** | (2016.01) |
| ***H02K 41/03*** | (2006.01) |
| ***H02N 15/00*** | (2006.01) |
| ***H10P 72/30*** | (2026.01) |

(52) U.S. Cl.
CPC ......... *H02N 15/00* (2013.01); *H10P 72/3204* (2026.01)

(58) Field of Classification Search
USPC ........................................ 414/749.2; 198/679
See application file for complete search history.

(56) References Cited

U.S. PATENT DOCUMENTS

| | | | | |
|---|---|---|---|---|
| 5,780,943 | A * | 7/1998 | Ono | G03F 7/70691 310/90.5 |
| 6,590,633 | B1 | 7/2003 | Nishi et al. | |
| 6,724,466 | B2 | 4/2004 | Ono | 355/75 |
| 6,750,625 | B2 | 6/2004 | Binnard | 318/568.17 |
| 6,777,833 | B1 * | 8/2004 | Williams | H02K 41/03 310/90.5 |
| 7,034,474 | B2 * | 4/2006 | Yang | H02P 25/06 318/135 |
| 7,383,929 | B2 * | 6/2008 | Korenaga | F16F 15/03 318/135 |
| 7,988,398 | B2 | 8/2011 | Hofmeister | 156/345.31 |
| 8,084,897 | B2 * | 12/2011 | Zhu | G03F 7/70725 310/12.14 |
| 8,177,048 | B2 | 5/2012 | Sato et al. | |
| 8,522,958 | B2 | 9/2013 | Tobe et al. | |
| 8,851,817 | B2 | 10/2014 | Bonora et al. | |
| 9,248,568 | B2 | 2/2016 | Caveney et al. | |
| 9,947,564 | B2 | 4/2018 | Hiroki et al. | |
| 10,058,996 | B2 | 8/2018 | Hosek et al. | |
| 10,269,604 | B2 | 4/2019 | Hofmeister et al. | |
| 11,205,583 | B2 * | 12/2021 | Hofmeister | H01L 21/67709 |
| 11,964,831 | B2 * | 4/2024 | Hosek | B65G 47/92 |
| 2005/0105991 | A1 | 5/2005 | Hofmeister et al. | 414/217 |
| 2006/0061751 | A1 * | 3/2006 | Teng | G03F 7/70716 355/75 |
| 2008/0024749 | A1 | 1/2008 | Williams | 355/75 |
| 2013/0071218 | A1 | 3/2013 | Hosek et al. | |
| 2015/0076961 | A1 | 3/2015 | Thompson et al. | |
| 2015/0139770 | A1 | 5/2015 | Moura et al. | 5/128 |
| 2015/0214086 | A1 | 7/2015 | Hofmeister et al. | |
| 2015/0318197 | A1 | 11/2015 | Hiroki et al. | |
| 2016/0218029 | A1 | 7/2016 | Janakiraman et al. | |
| 2016/0229296 | A1 | 8/2016 | Hosek et al. | |
| 2017/0028546 | A1 | 2/2017 | Wilkas et al. | |
| 2017/0244341 | A1 | 8/2017 | Zahlen et al. | |
| 2018/0090253 | A1 | 3/2018 | Songatikamas et al. | |
| 2018/0108551 | A1 | 4/2018 | Hofmeister et al. | 50/90 |
| 2020/0244192 | A1 * | 7/2020 | Ehmann | H02N 15/00 |

FOREIGN PATENT DOCUMENTS

| | | | |
|---|---|---|---|
| EP | 1 805 792 | | 4/2006 |
| JP | S-6331940 | A | 2/1988 |
| JP | 2002104656 | A | 4/2002 |
| JP | 2010037092 | A | 2/2010 |
| JP | 2014120522 | A | 6/2014 |
| JP | 2017507870 | A | 3/2017 |

* cited by examiner

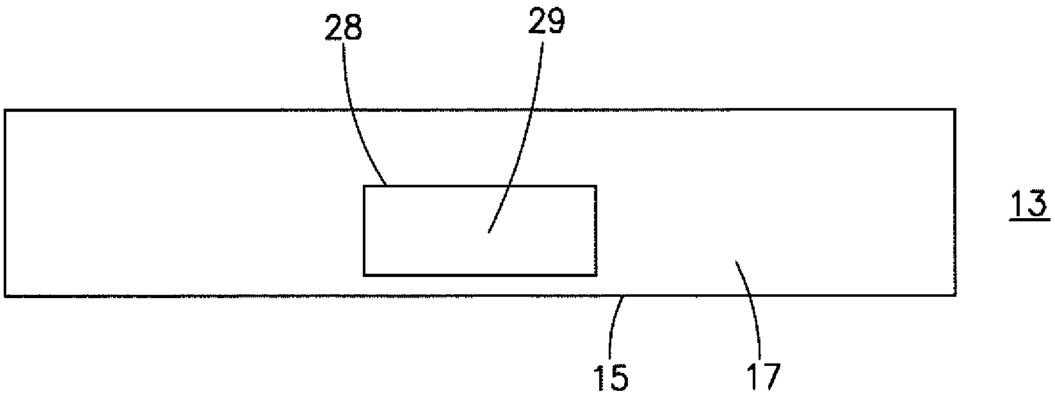
FIG.8
FIG.9
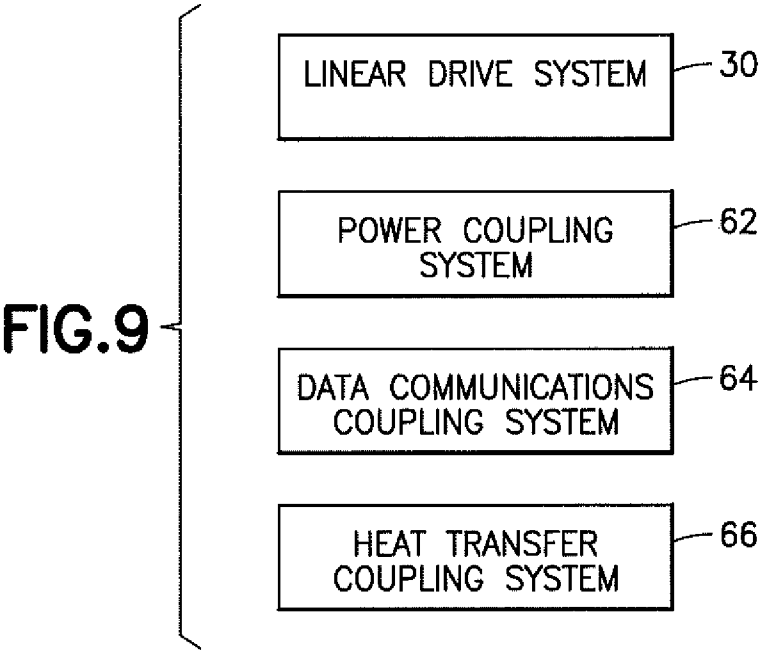

| FIG.38A | FIG.38B | FIG.38C |
|---|---|---|

| FIG.39A | FIG.39B | FIG.39C |
|---|---|---|

| FIG.40A | FIG.40B | FIG.40C |
|---|---|---|

| FIG.41A | FIG.41B | FIG.41C |
|---|---|---|

MAGNETICALLY GUIDED MATERIAL HANDLING ROBOT

CROSS REFERENCE TO RELATED APPLICATION

This application is a divisional application of U.S. Ser. No. 16/788,993, filed on Feb. 12, 2020, now U.S. Pat. No. 11,964,831, which claims priority under 35 USC 119(e) to U.S. Provisional Application No. 62/805,546 filed Feb. 14, 2019, both applications hereby being incorporated by reference in their entireties.

BACKGROUND

Technical Field

The example and non-limiting embodiments relate generally to a substrate transport robot assembly.

Brief Description of Prior Developments

Robots for transporting substrates are known. Linear drive systems for transporting a substrate transport robot is also known such as described in U.S. patent publication numbers US 2016/0229296 A1, US 2013/0071218 A1, US 2015/0214086 A1, and US 2017/0028546 A1 which are hereby incorporated by reference in their entireties.

SUMMARY

The following summary is merely intended to be exemplary. The summary is not intended to limit the scope of the claims.

In accordance with one aspect, an apparatus is provided comprising: a first device configured to support a substrate thereon; a first transport having the first device connected thereto, where the first transport is configured to support the first device for movement along a horizontal path, where the first transport comprises: at least two rails; a magnetic system configured to vertically space the first device over the at least two rails with a gap between the first device and the at least two rails, where the magnetic system comprises a first electromagnetic actuator at a first corner of a first side of the first device, a second electromagnetic actuator at a second corner of the first side of the first device, and a third electromagnetic actuator at a second opposite side of the first device, where the third electromagnetic actuator is not located proximate a corner of three sides of the first device; and a linear actuator configured to move the first device in the path along the at least two rails.

In accordance with another aspect, a method is provided comprising: connecting a first electromagnetic actuator proximate a first corner of a first side of a first device, where the first corner is at three sides of the first device, where the first device is configured to support a substrate thereon, where the first electromagnetic actuator is part of a magnetic system of a first transport having the first device connected thereto, where the first transport is configured to support the first device for movement along a horizontal path; connecting a second electromagnetic actuator proximate a second corner of the first side of a first device, where the second electromagnetic actuator is part of the magnetic system, where the second corner is at three sides of the first device; connecting a third electromagnetic actuator proximate a second opposite side of the first device, where the third electromagnetic actuator is part of the magnetic system, where the third electromagnetic actuator is not located proximate a corner of three sides of the first device; and locating the first device over at least two rails, where the first and second electromagnetic actuators are located at a first one of the rails and the third electromagnetic actuator is located at a different second one of the rails.

In accordance with another aspect, a method is provided comprising: controlling a first electromagnetic actuator to vertically space a first corner of a first device over a first rail, where the first electromagnetic actuator is part a first transport configured to vertically magnetically space the first device over the first rail and a second rail with a gap between the first device and the rails, where the first transport is configured to support the first device for movement along a horizontal path, where the first corner is at three sides of the first device, where the first device is configured to support a substrate thereon; controlling a second electromagnetic actuator of the magnetic system to vertically space a different second corner of the first device over the first rail, where the second corner is at three sides of the first device, where the first and second corners are at a first side of the first device; and controlling a third electromagnetic actuator of the magnetic system to vertically space the first device over the second rail, where the third electromagnetic actuator is located at an opposite second side of the first device, and where the third electromagnetic actuator is not located proximate a corner of three sides of the first device.

BRIEF DESCRIPTION OF THE DRAWINGS

The foregoing aspects and other features are explained in the following description, taken in connection with the accompanying drawings, wherein:

FIG. 8 is an end view of the substrate transport apparatus inside the transport chamber of the substrate processing apparatus;

FIG. 9 is a diagram illustrating various systems used with the apparatus shown in FIG. 1;

FIGS. 26A and 265 are schematic illustrations of an example of an electromagnetic actuator utilized in the magnetic support system shown in FIGS. 20-23;

DETAILED DESCRIPTION OF EMBODIMENTS

Figure 1:
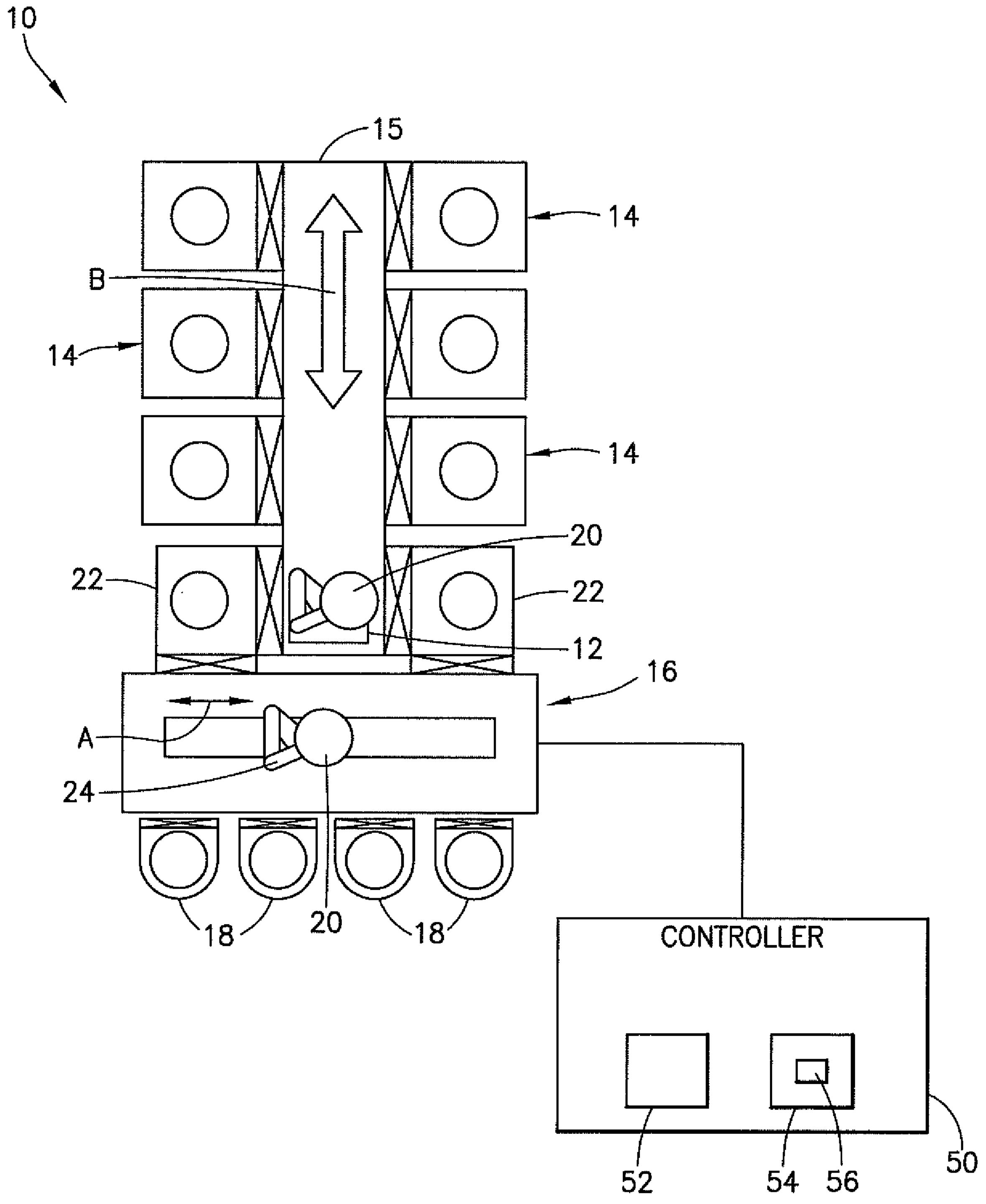
FIG. 1 is a schematic top view of a substrate processing apparatus comprising features as described herein.

Referring to FIG. 1, there is shown a schematic top plan view of an apparatus 10 incorporating features of an example embodiment. Although the features will be described with reference to the example embodiments shown in the drawings, it should be understood that features can be embodied in many alternate forms of embodiments. In addition, any suitable size, shape or type of elements or materials could be used.

The apparatus 10, in this example, is a substrate processing apparatus. The substrate processing apparatus 10 generally comprises a substrate transport apparatus 12 (also referred to as a linear vacuum robot), multiple substrate processing chambers 14, a transport chamber 15, an equipment front end module (EFEM) 16, and substrate cassette elevators 18. The transport chamber 15 may be maintained as a vacuum chamber or inert gas chamber for example. The transport apparatus 12 is located in the chamber 15 and is adapted to transport substrates 20, such as semiconductor wafers or flat panel displays for example, between and/or among the chambers 14, 15, and the stationing transfer chambers or load locks 22. The EFEM 16 is configured to transport the substrates 20 between the substrate cassette elevators 18 and stationing transfer chambers 22. In this example, the EFEM has a robot 24 having a scara arm. The robot 24 is configured to linearly move in the EFEM as indicated by arrow A. However, any suitable type of EFEM could be provided. The apparatus 10 includes a controller 50. The controller 50 comprises at least one processor 52 and at least one memory 54 comprising computer program code 56. The controller 50 is configured to control operations of the various devices and robots of the apparatus 10.

Figure 2:
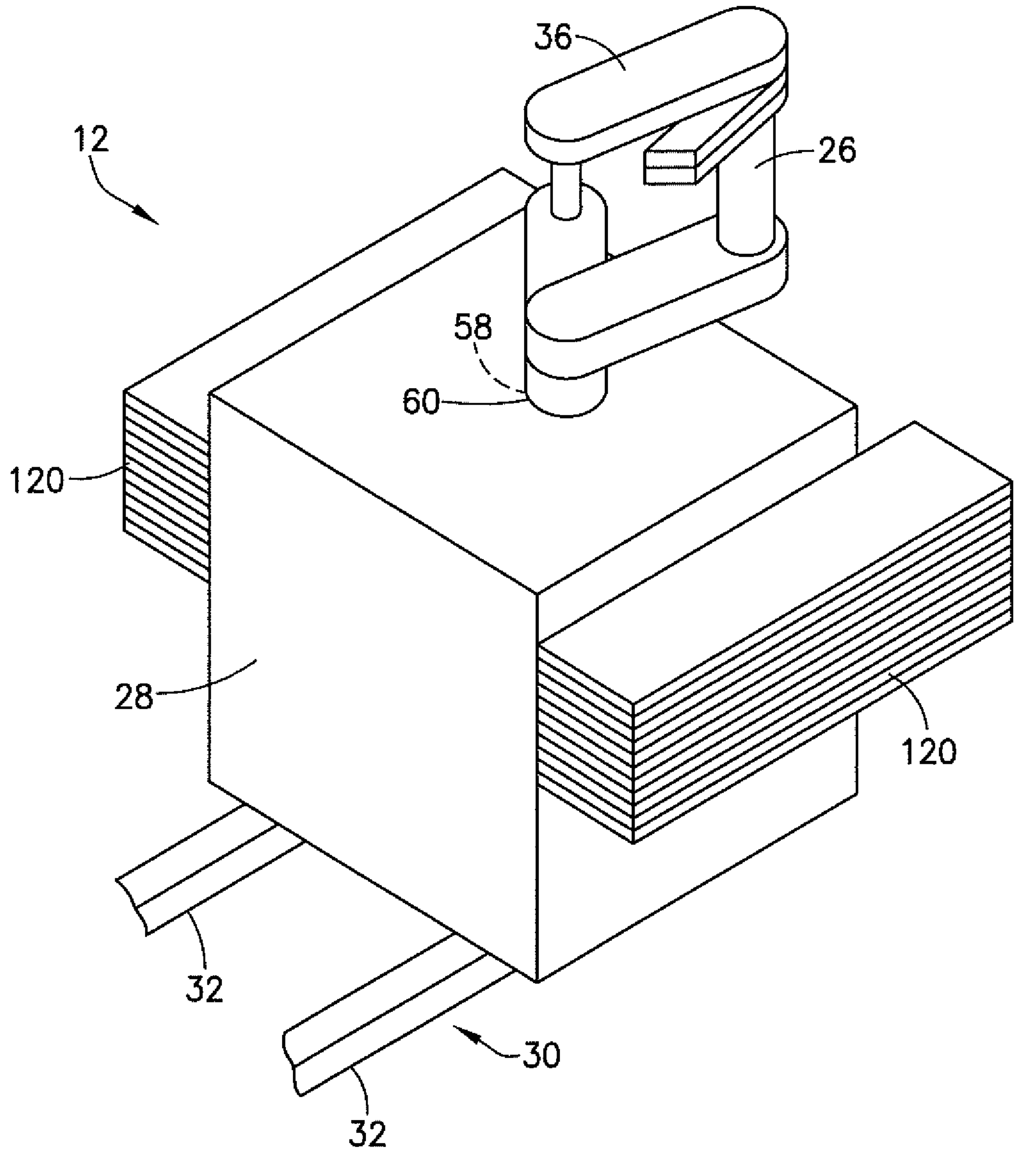
FIG. 2 is a perspective view of a substrate transport apparatus of the substrate processing apparatus shown in FIG. 1.
Figure 3:
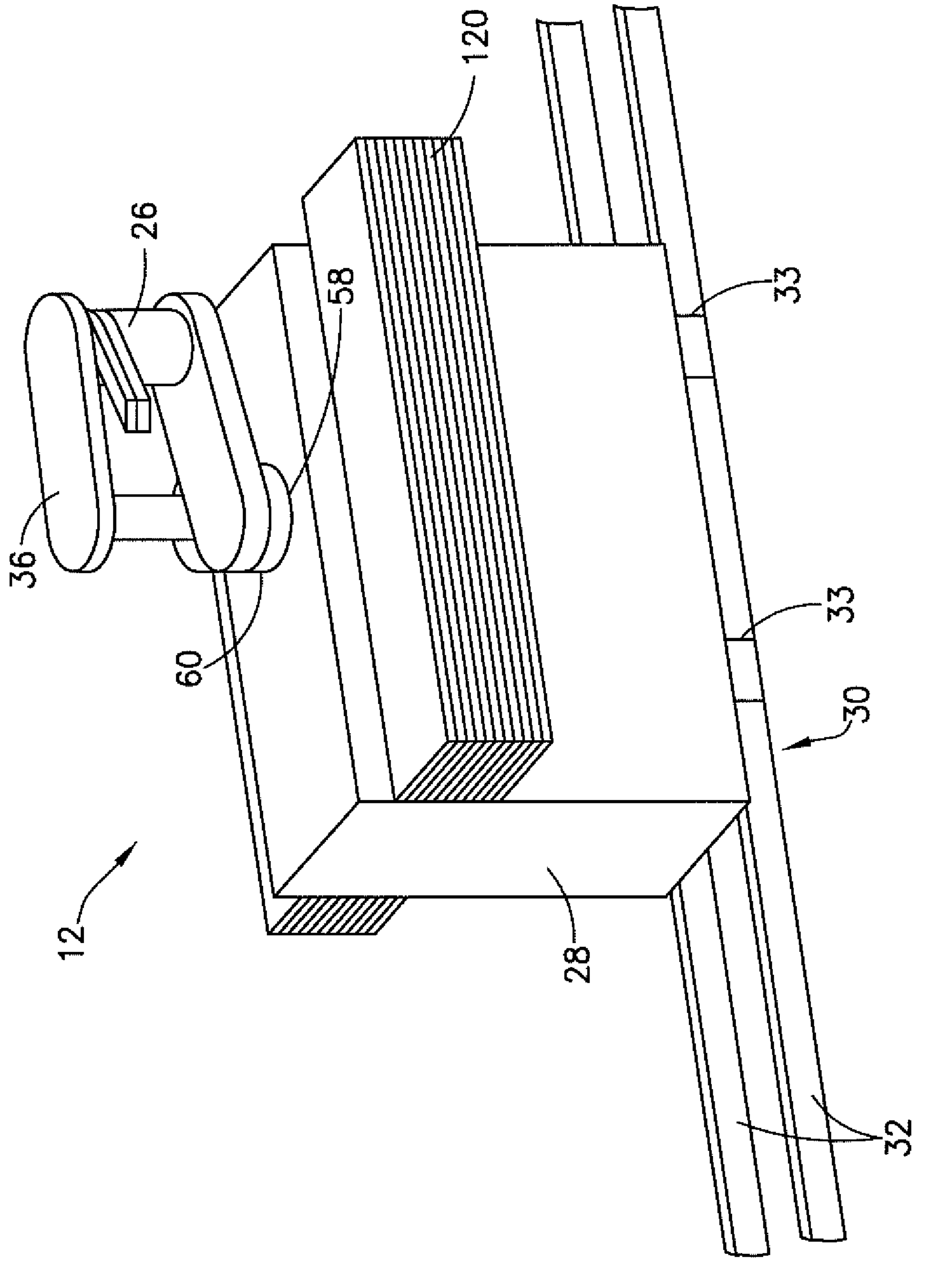
FIG. 3 is a perspective view of the substrate transport apparatus shown in FIG. 2.
Figure 4:
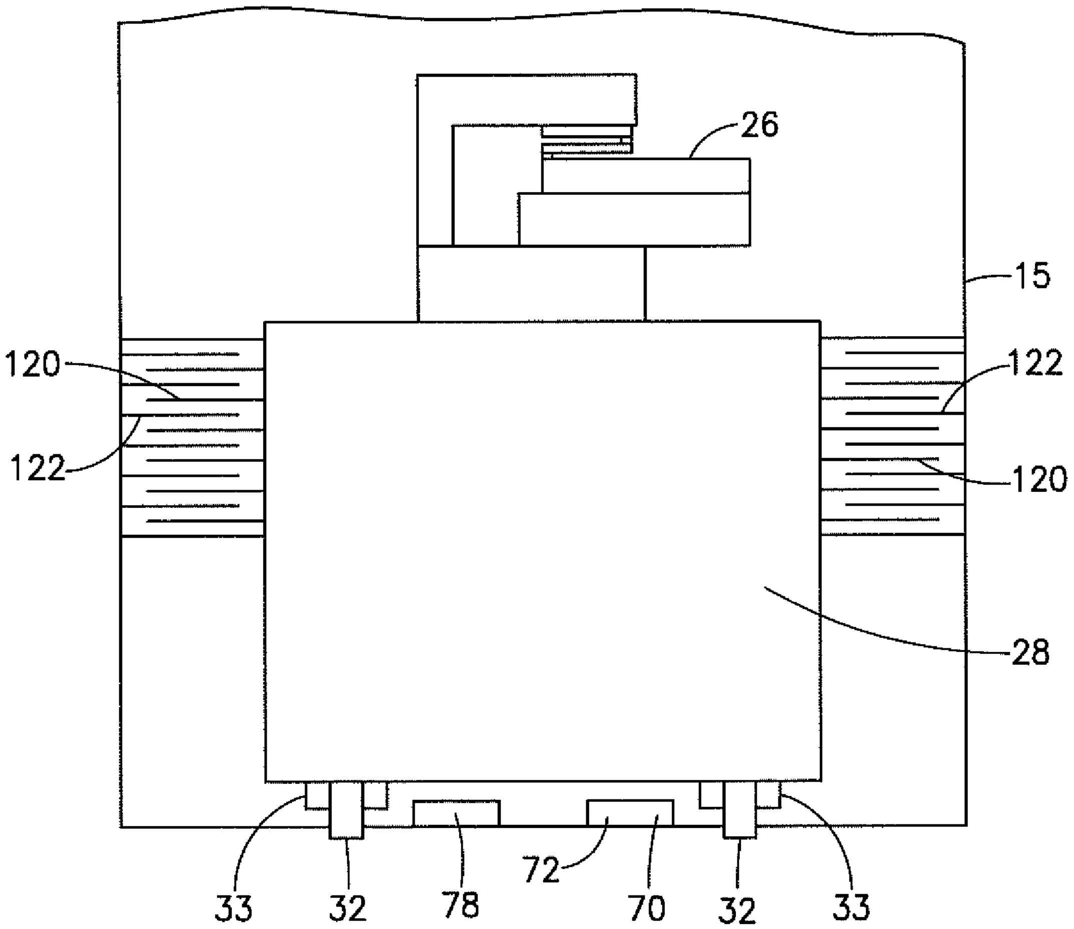
FIG. 4 is an end view of the a perspective view of a substrate transport apparatus shown in FIGS. 2-3 shown inside a transport chamber of the substrate processing apparatus.

Referring also to FIGS. 2-4, perspective views and an end view of the substrate transport apparatus 12 are shown. In this example the substrate transport apparatus 12 comprises a robot 26, a robot enclosure 28, and a linear drive system 30. FIGS. 2-3 show the substrate transport apparatus 12 on the bottom wall of the transport chamber 15 with the side and top walls of the transport chamber 15 not shown. FIG. 4 shows the substrate transport apparatus 12 on the bottom wall or floor of the transport chamber 15 with merely the top wall of the transport chamber 15 not shown. The robot 26 is connected to the robot enclosure 28, and the robot enclosure 28 is movably relative to the chamber 15 by means of the linear drive system 30. The linear drive system 30 comprises guides 32 on the floor of the transport chamber 15 and trucks 33 on the exterior bottom side of the enclosure. For a maglev type of linear drive system, the trucks may be separated from the guides 32 by a spacing maintained by magnetism/electro-magnetism. For a non-maglev type of linear drive, the guides may comprise rails where the tucks ride on the rails. In one example, the trucks 33 may have wheels attached to the bottom side of the enclosure which ride on the rails 32. The linear drive system 30 is configured to move the robot enclosure 28 and, thus, move the substrate transport apparatus 12, inside the transport chamber 15 along the rails 32 in a linear path as indicated by arrow B in FIG. 1. In alternate embodiments rather than an enclosure, the robot 26 may be attached to a non-enclosing slide or platform which has the trucks and rides on the rails/guides 32. In another alternate example, the guides and trucks could be provided at lateral side walls of the chamber 15 in addition to, or as an alternative, to the floor of the chamber 15.

Figure 5:
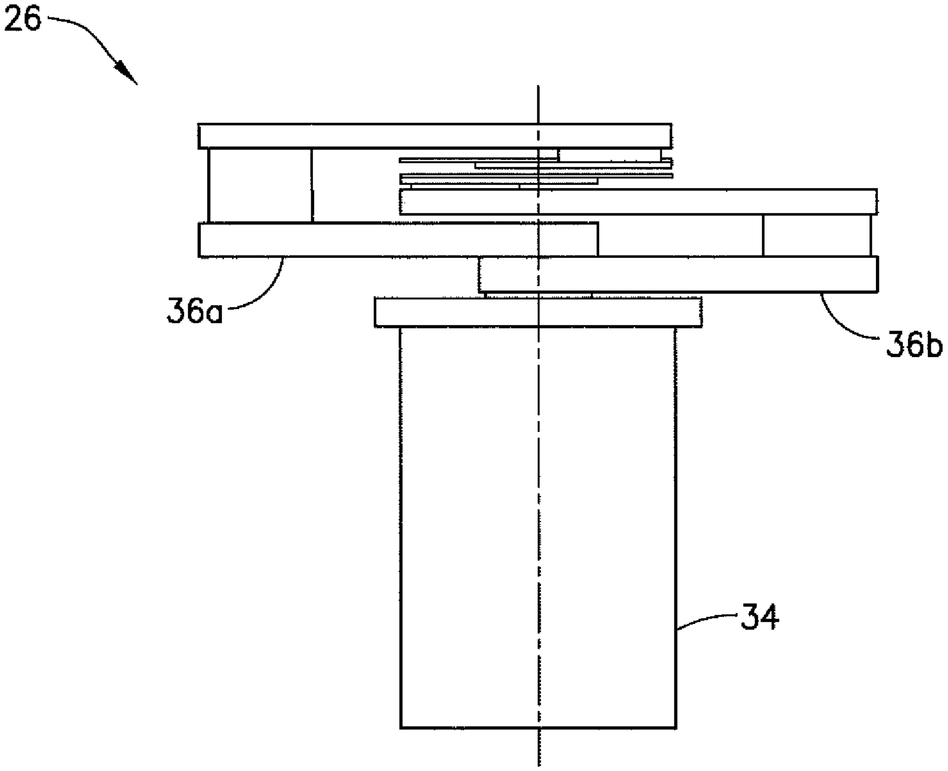
FIG. 5 is a side view of a robot of the substrate transport apparatus shown in FIGS. 1-4.
Figure 6:
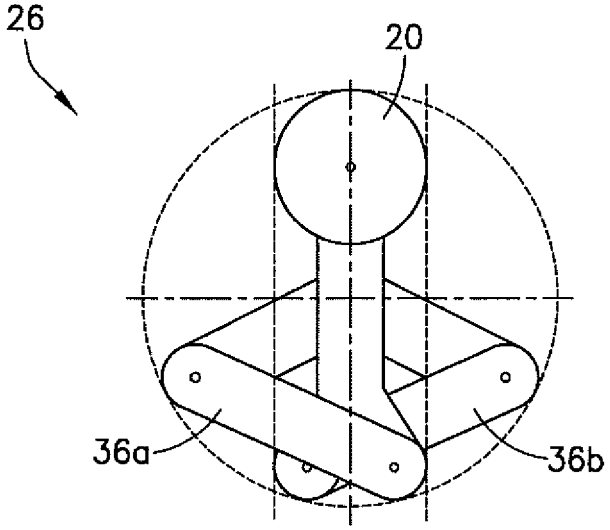
FIG. 6 is a top view of the robot shown in FIG. 5.
Figure 7:
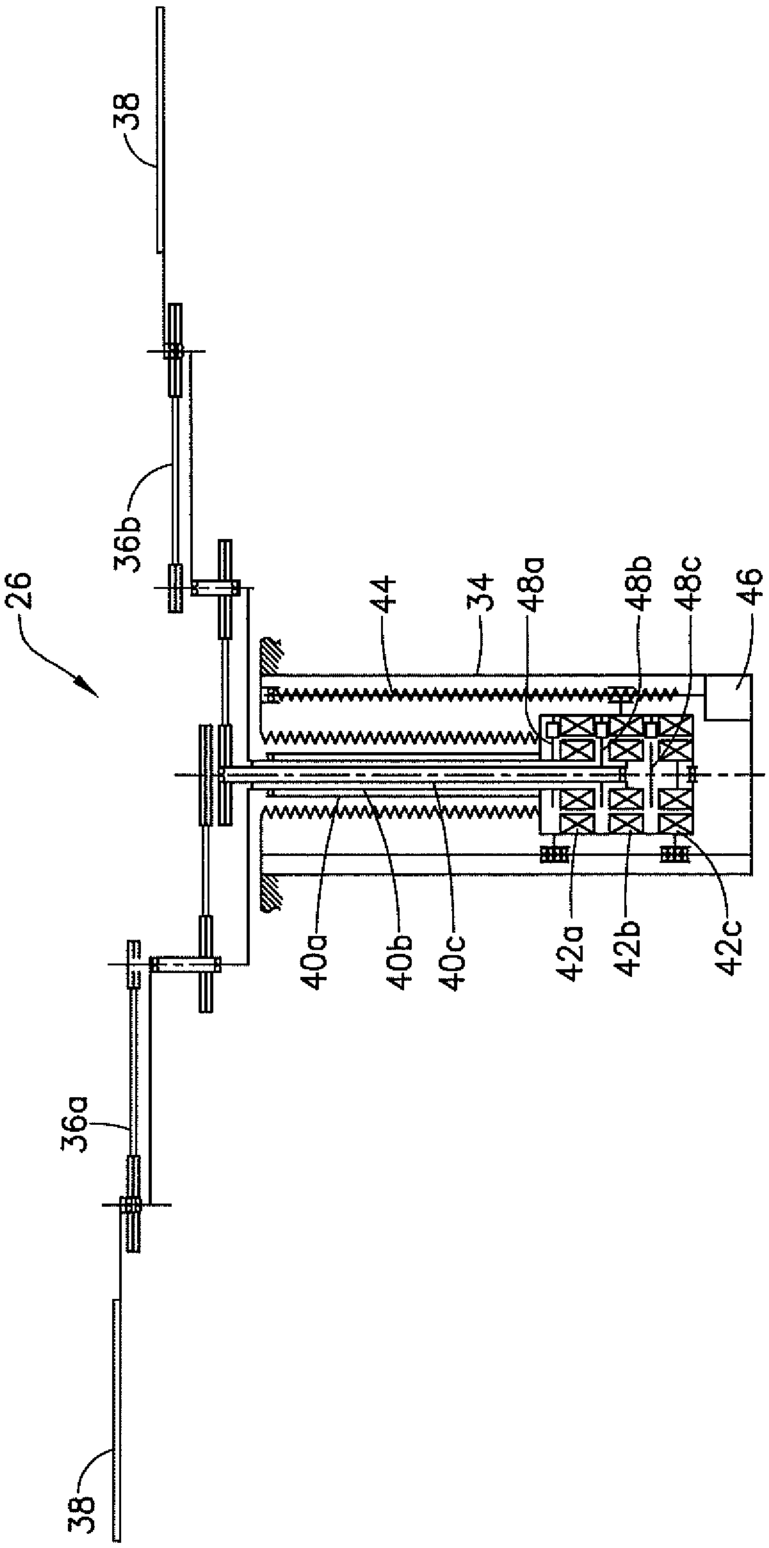
FIG. 7 is a schematic sectional view of the robot shown in FIGS. 5-6.

Referring also to FIGS. 5-7, the robot 26 generally comprises a robot drive 34 and a robot arm assembly 36 connected to the robot drive 34. The robot 26 shown in FIGS. 5-7 is merely one example of a robot having and effectors for moving substrates, and should not be considered as limiting. Any suitable type of robot, robot drive and robot arm could be provided. In this example the robot arm assembly 36 is a dual arm arrangement. Each of the arms 36*a*, 36*b* of the robot arm assembly 36 has arm links, pulleys, bands, and substrate support end effectors 38 which are driven by the coaxial drive shafts 40*a*, 40*b*, 40*c* of the robot drive 34. In an alternate example, the drive might include drive shafts which are not coaxially located relative to each other. The robot drive 34 has motors 42*a*, 42*b*, 42*c* for each drive shaft, a vertical drive system 44 including a motor 46, and various position encoders/sensors 48*a*, 48*b*, 48*c* for the motors 42 and/or drive shafts 40, and the vertical drive system 44.

The robot 26 is mounted to the robot enclosure 28 such that almost all of the robot 26 is located inside the robot enclosure 28 except for the robot arm assembly 36. This can be seen best in FIGS. 3-4 for example. In particular, the robot arm assembly 36 is located outside of the enclosure 28, proximate the top side of the robot enclosure 28, and the drive shafts 40*a*, 40*b*, 40*c* extend through an aperture 58 (see FIG. 3) in the top side of the robot enclosure 28 from the rest of the drive 34 located inside the enclosure 28. A seal 60 (see FIG. 3) is provided at the aperture 58 to seal the aperture 58, but still allow the drive shafts 40*a*, 40*b*, 40*c* to axially rotate and vertically move when moved by vertical drive system 44. With this type of embodiment, the area inside the enclosure 28 may have a different environment than the area inside the chamber 15. For example, the area inside the enclosure may merely be air at an atmospheric pressure, and the area inside the chamber 15 (outside of the enclosure 28) may be a vacuum environment or an inert gas environment.

Nested Environments

FIG. 8 illustrates schematically a "nested" type of arrangement which may be used in one example. The robot enclosure 28 may provide a hermetically sealed robot enclosure for the robot drive 34, except for the small portion of the drive shafts which extend through the aperture 58. More specifically, all of the motors 42, 44, all of the sensors 48, all of the electrical wiring, and most of the drive shafts 40 (see FIG. 7) are hermetically enclosed inside the robot enclosure 28. All of the active electrical hardware of the robot drive 34, including the sensors and motors, may be maintained inside the hermetically sealed robot enclosure 28 at area 29 shown in FIG. 8; separate from the environment outside the robot enclosure 28 in the area 17 of the transport chamber 15. The area 17 may be maintained as a separate environment inside the transport chamber 15 separate from the outside atmospheric environment 13. Thus, environment 29 is nested inside the environment 17, where the environment 17 separates the environment 29 from the outside atmospheric environment 13 (normal atmosphere 13 outside of the chamber 15). The environment 29 might be a vacuum environment, but does not need to be a vacuum environment even if the environment 17 is a vacuum environment. Because the environment 29 inside the robot enclosure 28 does not need to be a vacuum environment, this may help to prevent outgassing of vapors from components inside the robot enclosure 28. This nesting of environments (area 29 nested inside area 17) is particularly adapted to the robot enclosure 28 being movable inside the transport chamber 15 without breaching or being interrupted by the relative movement linearly along the length of the transport chamber 15.

Referring also to FIG. 9, in this example the apparatus 10 has the linear actuation system 30, a power coupling system 62, a data communications coupling system 64 and a heat transfer coupling system 66. The power coupling system 62 may be used to provide electrical power to components inside the enclosure 28. The data communications coupling system 64 may be used to send data signals to components inside the enclosure 28 (and/or through the enclosure to components in the arm) and/or to send data signals from the components inside the enclosure 28 to a data processor outside the chamber 15 (and/or through the enclosure from components in the arm). The heat transfer coupling system 66 may be used to transfer heat from components inside the enclosure 28 to outside the chamber 15. In an alternate example embodiment, the power coupling system 62 and the data communications coupling system 64 may be at least partially combined to reduce the number of components inside the area 17 of the chamber 15. In some embodiments, an apparatus may be provided which does not comprise all of the systems noted above.

In the example shown, all of these systems 30, 62, 64, 66 are configured to not breach or interfere with the nested environments shown in FIG. 8. In other words, the systems 30, 62, 64, 66 are suitable constructed such that the environment inside the enclosure 28 remains separated from the environment inside the chamber 15 while all four systems 30, 62, 64, 66 operate.

Linear Motor

Figure 10:
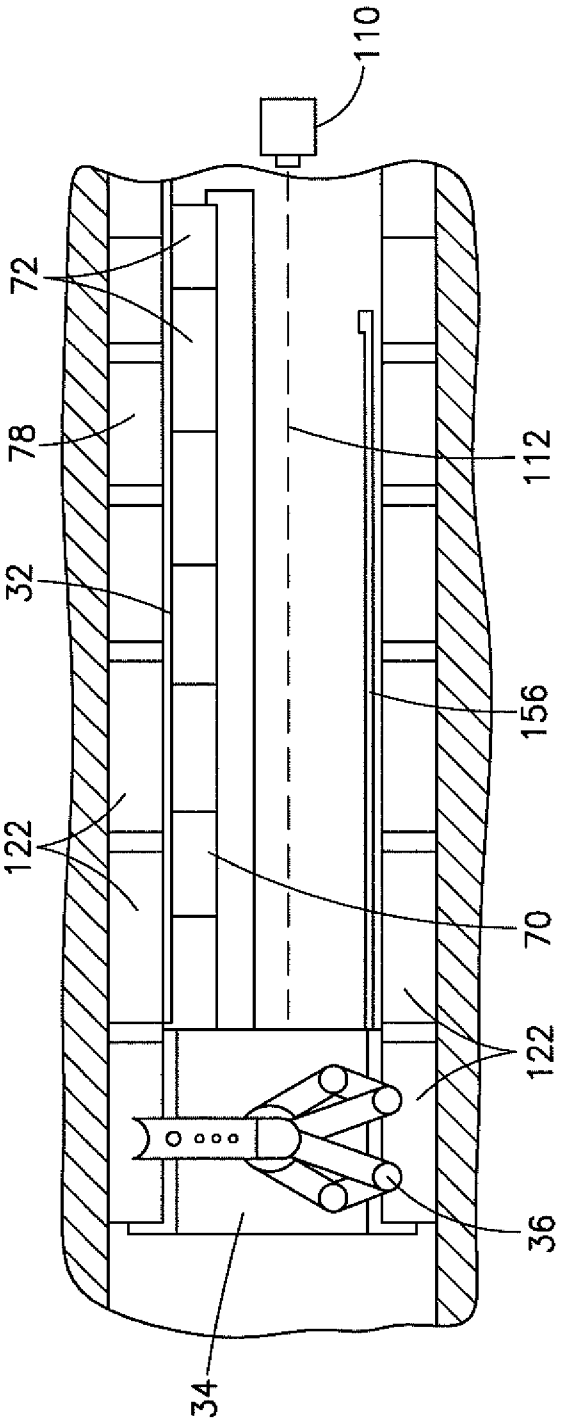
FIG. 10 is a schematic top view of the substrate transport apparatus inside the transport chamber of the substrate processing apparatus shown in FIG. 1.
Figure 11:
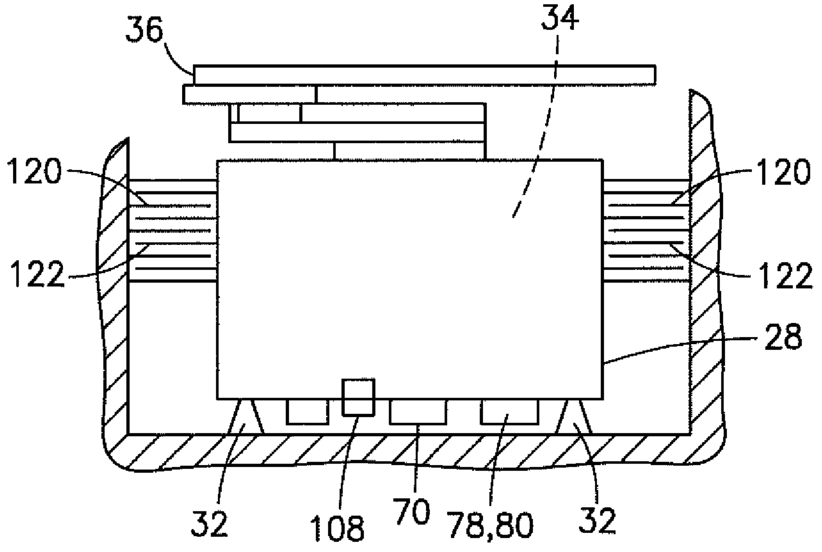
FIG. 11 is an end view of the substrate transport apparatus inside the transport chamber as shown in FIG. 10.

Referring also to FIGS. 10 and 11, the linear drive system 30 generally comprises a linear motor 70. A linear motor 70 is an electric motor that has had its stator and rotor essentially "unrolled" so that instead of producing a torque (rotation) it produces a linear force along its length. An example of this is disclosed in US patent publication No. US 2015/0214086 A1 which is hereby incorporated by reference in its entirety. The figures show the linear motor located under the enclosure 28. However, in alternate embodiments, one or more components of the linear drive might not be located under the enclosure 28. For example, components of the linear motor and/or the linear drive system 30 might be located at lateral sides of the enclosure 28 and chamber 15.

Figure 12:
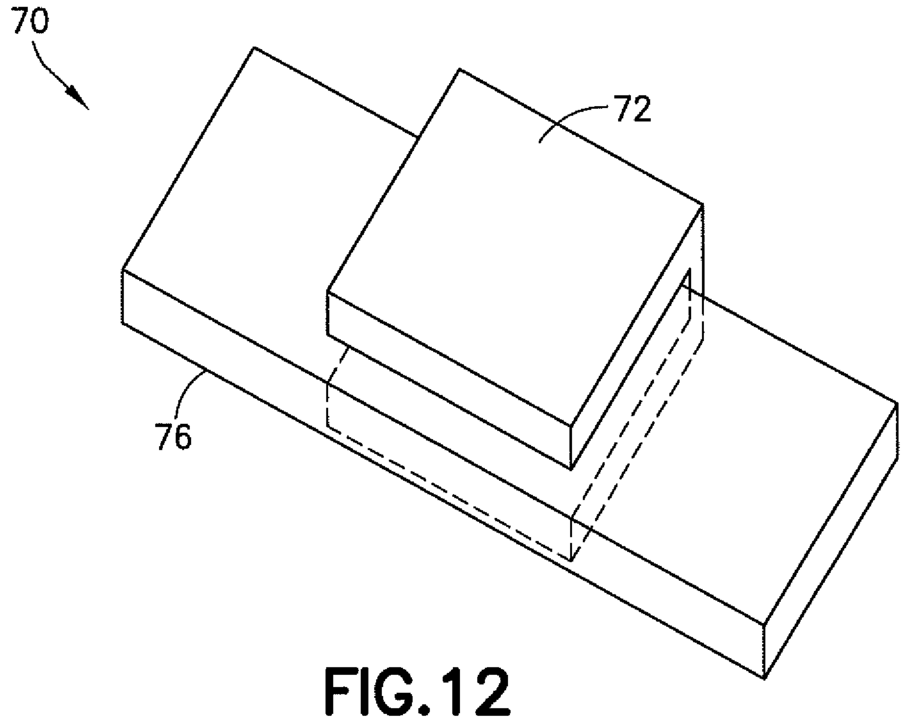
FIG. 12 is a perspective view showing one of the magnetic drivers and the driven member of the linear motor shown in FIGS. 10-11.
Figure 13:
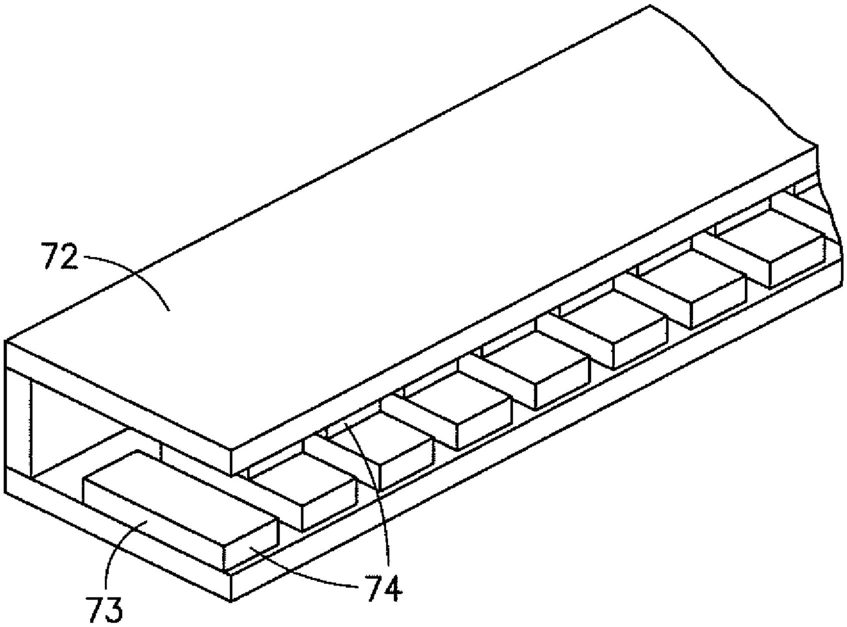
FIG. 13 is a perspective view of the magnetic driver shown in FIG. 12.

In one example embodiment the linear drive system 30 may comprise a maglev system utilizing a non-contact magnetically supported guidance subsystem. Referring also to FIGS. 12-13 the linear motor 70, in the example shown, utilizes a modular design comprising stationary magnetic drivers 72 and a driven member 76. The drivers 72 have a general "C" shape in this example. The general "C" shape forms a slot 73 with opposing electromagnets 74 on top and bottom sides of the slot 73. The drivers 72 are stationarily mounted to the bottom wall of chamber 15 in a row, as seen best in FIG. 10, and the driven member 76 is attached to the exterior of the bottom side of the robot enclosure 28. In an alternate example the drivers 72 might be attached to the robot enclosure 28 and the rail 76 might be stationarily attached to the transport chamber 15.

Figure 10A:
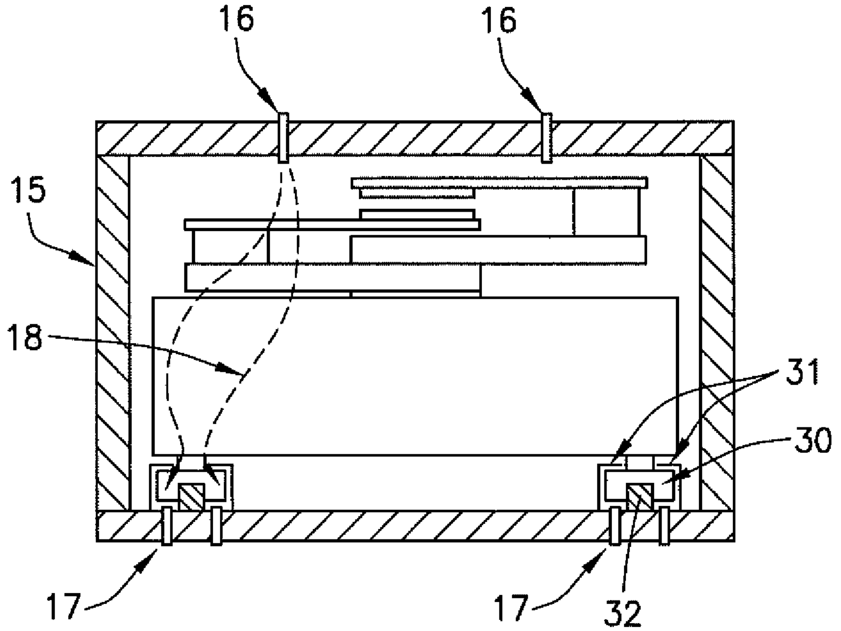
FIG. 10A is an end sectional view of the substrate transport apparatus inside the transport chamber of the substrate processing apparatus shown in FIG. 10.

Shielding may be provided around linear rails. Referring also to FIG. 10A, the transfer chamber 15 contains the robot with linear rails 32 and trucks 30, and the linear rails and trucks may be partially or completely enclosed in shields 31.

The shield purpose is to reduce or eliminate migration of undesirable particulate or contaminant material from rails or trucks upward into the transfer chamber, while allowing robot motion in the direction of the rail. Further, the shield, which may be a single part or an assembly of parts, prevents migration of material, particulates, broken wafer fragments from the transfer chamber into the operation area of the linear rails. This helps prevent contamination/clogging of the linear rail mechanism.

The transfer chamber may also include vent ports 16 and pump ports 17, such that the vent ports are located substantially towards the top of the chamber 15 and the pump ports in the lower section or within the shielded area of shields 31. Such an arrangement further prevents migration of contaminants from within the shielded area into the transfer chamber. When the vent port is active, the molecules from the vent will travel towards the pump port, carrying with them any trace of airborne contaminants. Even when the vent port is closed, active pumping will still pull any contaminants away from the chamber and into the shielded region.

As shown best in FIG. 12, the driven member 76 extends into the slot of the "C" shaped drivers 72. Thus, the drivers 72 may utilize the same rail 76, extending from the bottom side of the robot enclosure 28, in an autonomous fashion. In alternate aspects, other guide rail arrangements, more or less may be provided and mounted in alternate arrangements, for example, on side walls of the chamber 15. As described above, the modular linear drive system may utilize a non-contact magnetically driven forcer subsystem. The subsystem may comprise one or more linear motor modules and one or more position feedback modules. With the use of the example described above, the enclosure 28 may be linearly moved inside the chamber 15, as indicated by arrow B in FIG. 1, without the need to pass any wires through the enclosure 28. The linear motor 70 is entirely outside the enclosure 28 and, thus, provision of the linear motor 70 does not increase a risk of a breach between the two areas 17, 29. Also, because driven member 76 does not contact any of the drivers 72, and driving of the driven member is merely magnetically controlled, there is less risk of contaminates from the driven member 76 and drivers 72 in the area 17. Supply of electrical power to the drivers 72 may be controlled by the controller 50 shown in FIG. 1. The drivers 72, or portions of the drivers 72, may be energized to create a magnetic field to move (such as accelerate and decelerate for example) the driven member 76 in linear directions B, and also magnetically positionally lock the enclosure 28 at fixed locations in front chambers 14 and 22 as needed.

Each linear motor module may have a stationary passive magnetic stainless steel part. The stationary passive magnetic stainless steel part may have a toothed portion that interacts with a corresponding primary forcer. The passive part may or may not also have magnets. Multiple supports may utilize the same secondary in an autonomous fashion. Each linear motor module may have a primary forcer coupled to supports where the primary forcer may have three phase windings and permanent magnets. In alternate aspects, permanent magnets may be provided as part of driven member for the purpose of offsetting gravity and dynamic loads. In alternate aspects, permanent magnets may be provided as part of one or more of the magnetic bearings for the purpose of offsetting gravity and dynamic loads. An example of a potential primary forcer and secondary topology is provided with the Siemens 1FN6 Design. In alternate aspects, any suitable forcer may be provided. The permanent magnets of the forcers may be provided as a component that both facilitates efficient generation of thrust (coupled with windings) and also offsets the payload such that the magnetic bearings minimize the use of power during normal operation. Here, the attractive force between the forcer and the corresponding passive rail may be set at a nominal gap such that the force offsets gravity-induced forces resulting in minimum power consumption. Further, the set point for the gap may be varied such that as the payload changes, the gap is adjusted such that the force offsets gravity induced forces resulting in minimum power consumption as the payload changes. For example, the gap on a left forcer may be varied independently of that of a right forcer. Voltage may be selectively applied by the advanced control subsystem to the magnetic coils of the primary forcer to produce thrust to the support relative to the stationary passive magnetic stainless steel secondary. Each stationary passive magnetic stainless steel secondary may be mounted with teeth oriented vertically down such that the attractive force of the primary forcer's permanent magnets may offset the weight of the support and the payload to minimize the DC component that needs to be applied by the vertical coils of the non-contact magnetically supported guidance subsystem.

Power Coupling System

Figure 14:
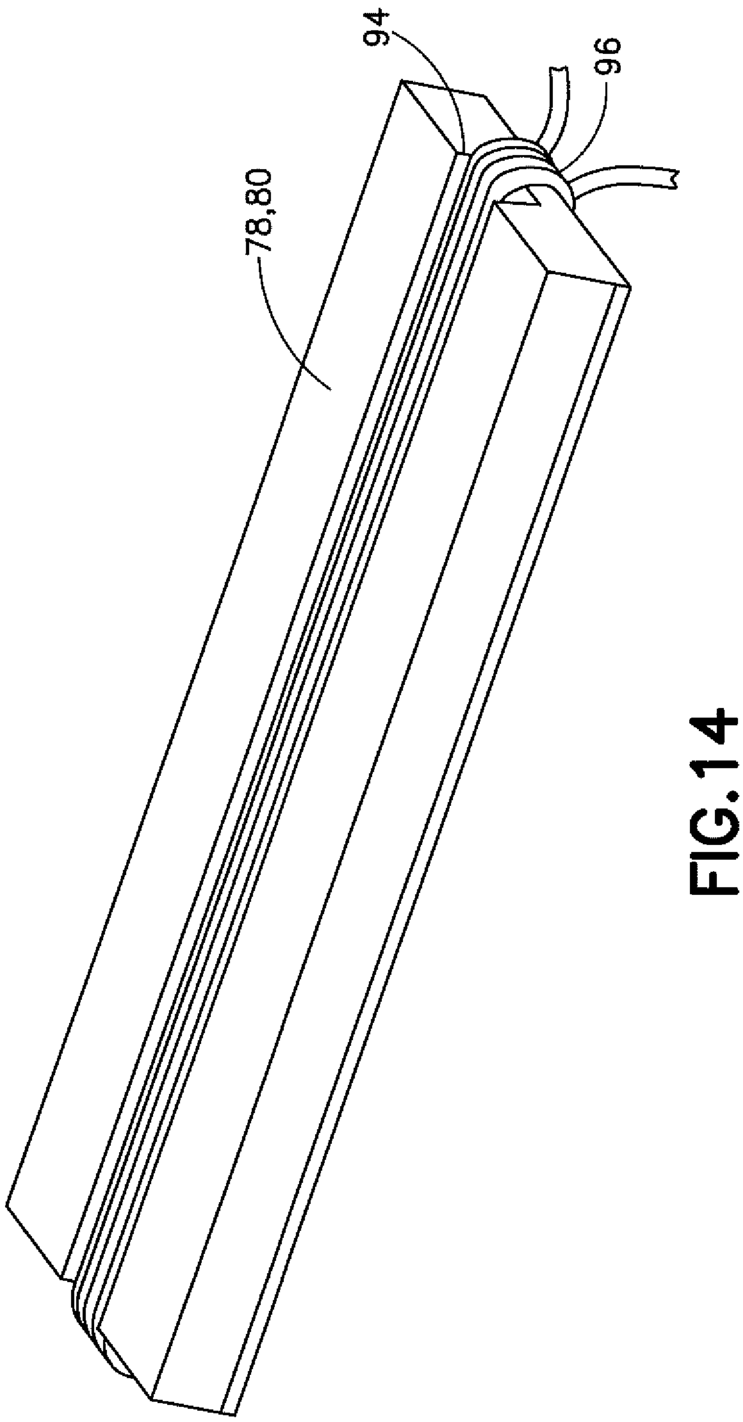
FIG. 14 is a perspective view of a power module used with the apparatus shown in FIGS. 10-11.
Figure 14A:
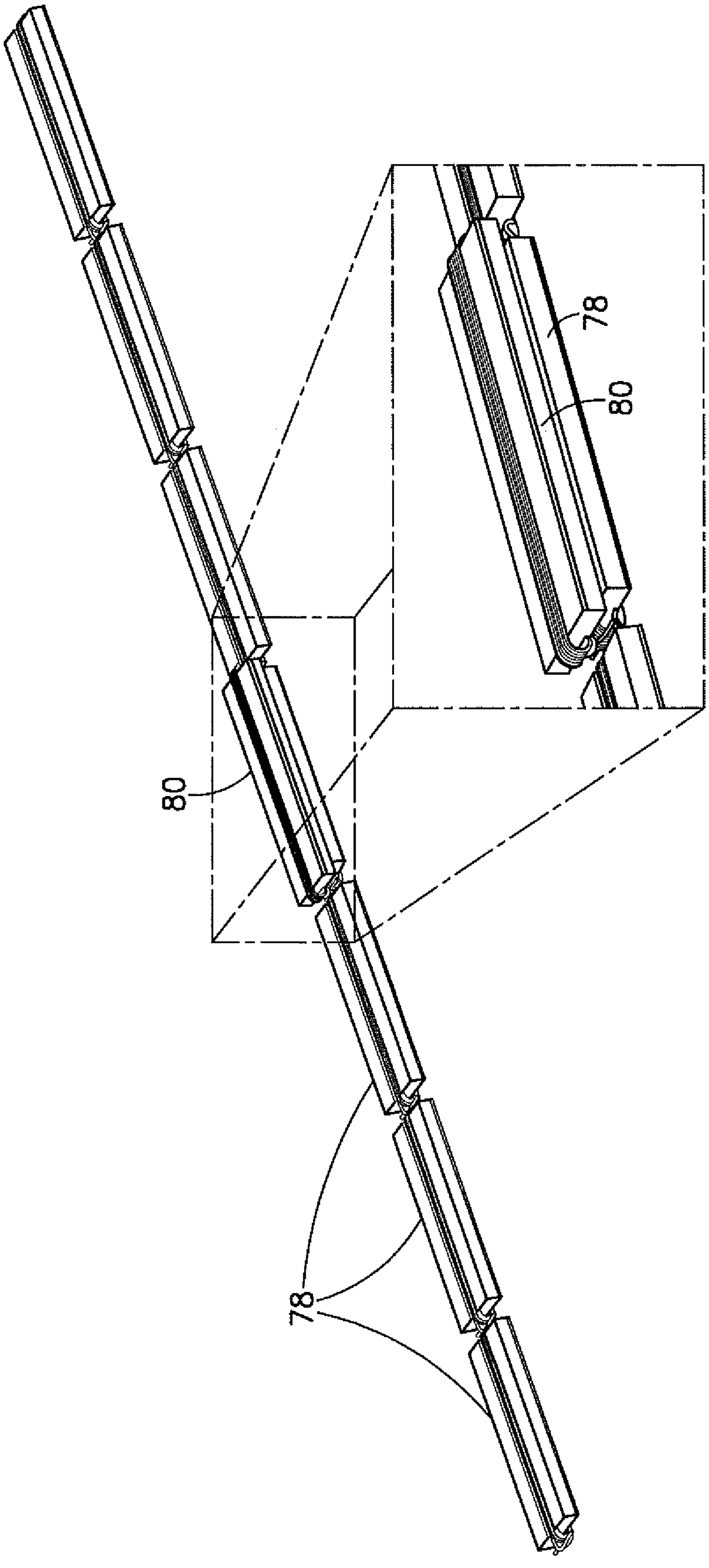
FIG. 14A is a perspective view illustrating the relative layout of a plurality of the power modules shown in FIG. 14.

Referring also to FIG. 14, the power coupling system 62, in this example embodiment, is configured to use magnetic inductional resonant effects to transfer electrical power to the substrate transport apparatus 12, such as for use with components inside the enclosure 28. The power coupling system 62 generally comprises a power coupling or module 78 on the interior bottom wall of the transport chamber 15 and a power coupling or module 80 on the exterior bottom side of the robot enclosure 28. As seen best in FIGS. 14A, 4, 10 and 11, a plurality of the primary modules 78 may be arranged aligned in a row on the bottom wall of the transport chamber 15, and the secondary module 80 may be located above the row of primary modules 78 attached to the exterior bottom side of the enclosure 28. An example of induction power transfer for a substrate transport apparatus is disclosed in US patent publication No. US 2016/0229296 A1 which is hereby incorporated by reference in its entirety. The power coupling may be combined with a communication device.

Figure 15:
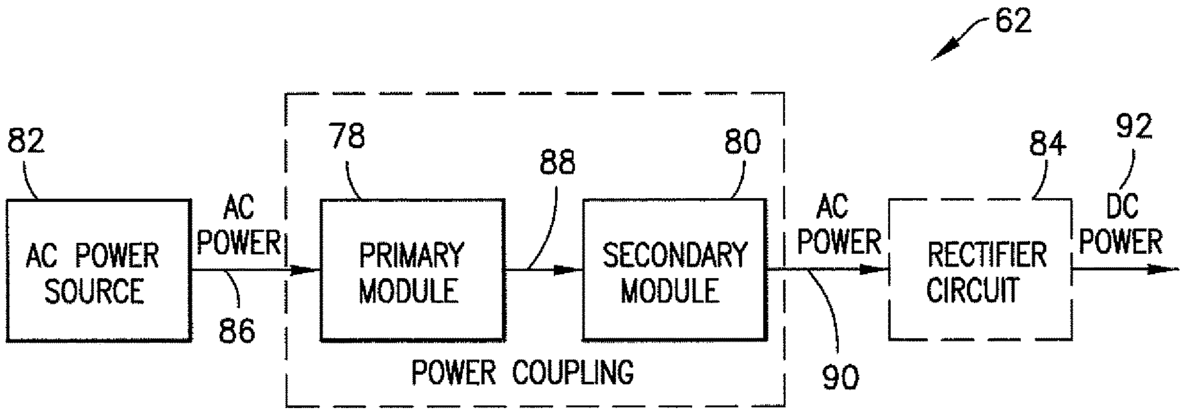
FIG. 15 is a diagram illustrating a power coupling using the power modules shown in FIGS. 14 and 14A.

Referring to FIG. 15, there is shown a block diagram representation of one example embodiment of the power coupling system 62. As depicted, the power coupling system 62 may include an AC power source 82, the power coupling with at least one primary module 78 and at least one secondary module 80, and an optional rectifier circuit 84. AC power 86 is supplied to the primary 78 where the primary 78 in turn provides power to the secondary 80 over gap 88 where the secondary 80 provides AC power 90 to the rectifier circuit 84. The secondary 80 moves with the robot enclosure 28 while the primary 78 remains stationary. However, in an alternate example, the primary and secondary modules may be configured so that they can move with respect to each other, including translation, rotation or a combination of the two. The primary and secondary may be primary or secondary cores or primary or secondary rails. In alternate aspects, any suitable combination or geometry may be provided. An electrical line(s) from the module 80 may extend through a sealed aperture in the enclosure 28 to supply electricity, such as to motors 42 of the robot and/or to a controller (such as a servo motor controller for example) and/or communication equipment and/or sensors inside the enclosure 28 or subsequently to devices in or on the robot arm assembly 36 for example. In an alternate embodiment, more than one module 80 might be provided, and might be on one or more lateral sides of the enclosure 28. Because modules 78, 80 do not contact one another, there is less risk of contamination inside the chamber 15 as the module 80 moves relative to the modules 78.

Figure 16:
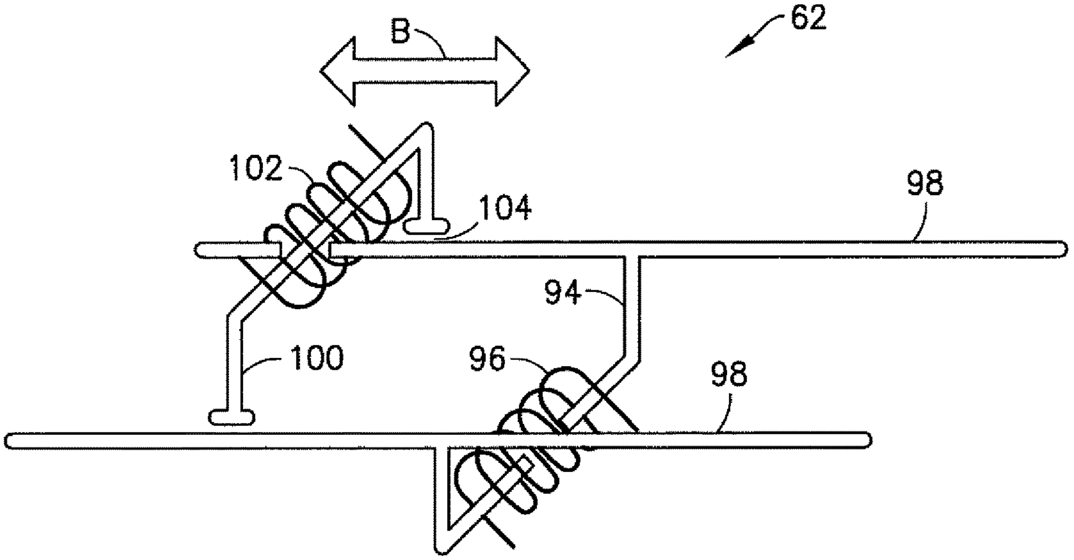
FIG. 16 is an isometric representation of one exemplary embodiment coupling shown in FIG. 15.

Referring now to FIG. 16, an isometric representation of one example alternate embodiment of the power coupling 62*a* is shown. As seen best in FIG. 14, the primary module(s) 78 may consist of a primary core or rail 94 and a primary winding or coil 96, which may be configured so that AC current, e.g., supplied by the AC power source 82, through the primary winding 96 produces alternating magnetic flux in the primary core or rail 94. The primary core or rail 94 may feature extensions 98 along the direction of relative motion B between the primary module 78 and secondary module 80. The secondary module 80 may consist of a secondary core or rail 100 and a secondary winding or coil 102 configured so that alternating magnetic flux in the secondary core or rail 100 induces voltage in the secondary winding 102. The secondary core or rail 100 may be arranged so that it may move as part of the secondary module along the extensions 98 of the primary core or rail 94 and so that magnetic flux may pass between the extensions of the primary core or rail and the secondary core or rail at shoe portions across an air gap 104 between the extensions 98 of the primary core or rail and the secondary core or rail 100. The output of the secondary winding 102 may be used as an AC power source directly, or, if DC power is required, the secondary winding may feed the rectifier circuit 84 (such as inside the enclosure 28 for example), which in turn may serve as a DC power source 92, as illustrated in FIG. 15. The primary winding 96 and secondary winding 102 may feature substantially the same number of turns in order for the amplitude of the output voltage of the secondary winding to be substantially equal to the amplitude of the voltage supplied by the AC power source 82. The number of turns of the secondary winding 102 may be higher than the number of turns of the primary winding 96 if higher output voltage is required. Conversely, the number of turns of the secondary winding 102 may be lower than that of the primary winding 96 if lower output voltage is required. The primary core 94 and secondary core 100 may be C-shaped, as depicted diagrammatically in FIG. 16, E-shaped, or they can feature any suitable shape that allows for inductive coupling between the primary module 78 and the secondary module 80. The extensions 98 of the primary core 94 may be straight to support straight-line motion between the primary module 78 and secondary module 80, or they may be curved to support curved or rotary motion. The primary core 94, extensions 98 and secondary core 100 may be produced from a soft magnetic material, for instance, silicon steel, soft magnetic composite, another material suitable to channel magnetic flux or a combination of such materials. Laminated construction may be utilized. Here, the primary and secondary may be considered as induction sections with the windings being coils. All the electrical wiring of the secondary module 80 may be located inside the robot enclosure 28 so that no wiring is located in the area 17. All the electrical wiring of the primary modules 78 may be located outside the transport chamber 15 so that no wiring is located in the area 17.

Data Communications Coupling System

Figure 17:
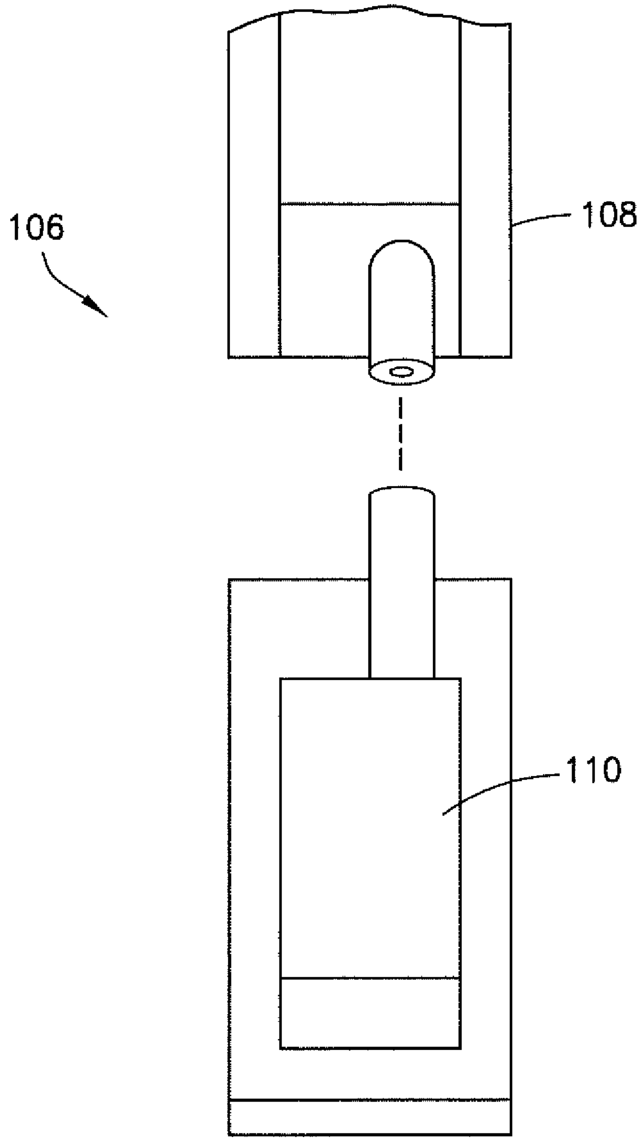
FIG. 17 is a schematic view illustrating some components of an optical communication system shown in FIGS. 10-11.

The data communications coupling system 64, in this example, comprises an optical communication system 106 which, as shown best in FIGS. 10-11 and 17, includes a first member 108 and a second member 110. The first member 108 is connected to the exterior bottom side of the robot enclosure 28. In an alternate example the first member 108 may be inside the enclosure with an optical window through the enclosure, or may be located on a side of the enclosure other than the bottom side. The second member 110 is connected to a side wall of the transport chamber 15. The second member 110 may be located outside of the area 17 and the transport chamber 15 may have a window for the two members 108, 110 to nonetheless optically communicate with each other. In an alternate example, the second member 110 may be inside the chamber 15.

The two members 108, 110 may use one or more laser beams or other optical signals 112 to transmit and receive data signal in the varying distances between the enclosure 28 and the chamber 15 as the enclosure moves inside the chamber 15. The data signals may be subsequently transmitted to and from the components inside the robot enclosure 28, such as to control the robot 26 and/or linear drive system 30, and for data from sensors of the substrate transport apparatus 12 to be sent to the controller 50. All the wiring (electrical and/or optical) from the first member 108 may be located inside the robot enclosure 28 so that no wiring is located in the area 17. All the wiring (electrical and/or optical) from the second member 110 may be located outside the transport chamber 15 so that no wiring is located in the area 17. This reduces the risk of contamination inside the area 17, such as from outgassing from those wires. The communication may be combined with power delivery.

Heat Transfer Coupling System

As noted above, the apparatus 10 may also comprise a heat transfer coupling system 66. The heat transfer coupling system 66 may be used to provide a thermal management in regard to components of the substrate transport apparatus 12 inside the robot enclosure 28; to transfer heat from inside the robot enclosure 28 to outside the transport chamber 15. This may be particularly important if the area 17 is a vacuum environment with poor heat transfer capability. The moving robot enclosure 28 serves to house all of the advanced control subsystem which move with the substrate transport apparatus 12. The moving robot enclosure 28 further serves to support the robotic transfer arm that cooperates with the moving support to transport one or more substrates between locations. As there are active components coupled to the moving robot enclosure 28, such as the motors 42 for example, the heat generated by the active components may be dissipated by a thermal management subsystem. For a moving support in vacuum, heat may be dissipated either by radiation or by transfer through a medium, for example through a gas or by coupling a bellows to the moving support and circulating gas or liquid coolant through a chiller. In the event of cooling by radiation alone (or combination radiation and convection), an allowable temperature difference between all or part of the moving portion and the chamber may be specified, for example, 50 degrees Celsius or otherwise. With the example embodiment shown in the figures, non-contacting interleaving fin-like structures 120, 122 (see FIGS. 2-4 and 10-11) may be employed to maximize opposing surface areas. High emissivity coatings may also be utilized to maximize surface area related heat transfer. An example of suitable coatings may be aluminum oxide, aluminum nitride or any suitable high emissivity coating. In alternate aspects, any suitable surface or coating may be provided. For a moving support in a gas or inert environment, heat may be dissipated either by radiation or convection or both. As there are active components coupled to the moving support 28, power and communication may be transferred to the moving support subsystem with the power coupling 62 and the communication coupling 64 as described with the above example. Power and communication may be transferred to the moving support subsystem wirelessly as described with the above example, by inductive coupling, via service loop or a combination of these approaches.

Active components coupled to the support may be potted with vacuum compatible potting or epoxy or alternately be hermetically sealed within the enclosure 28 or a combination of both. Examples of suitable moving support thermally sunk subsystems are disclosed in Hosek M., Hofmeister C., Low Variability Robot, U.S. patent application Ser. No. 13/618,117, Sep. 14, 2012, U.S. Patent Publication Number US 2013/0071218 A1, which is hereby incorporated by reference herein in its entirety. However, because of the use of the robot enclosure 28, use of potting or epoxy may be reduced or eliminated.

Example Alternatives

Figure 18:
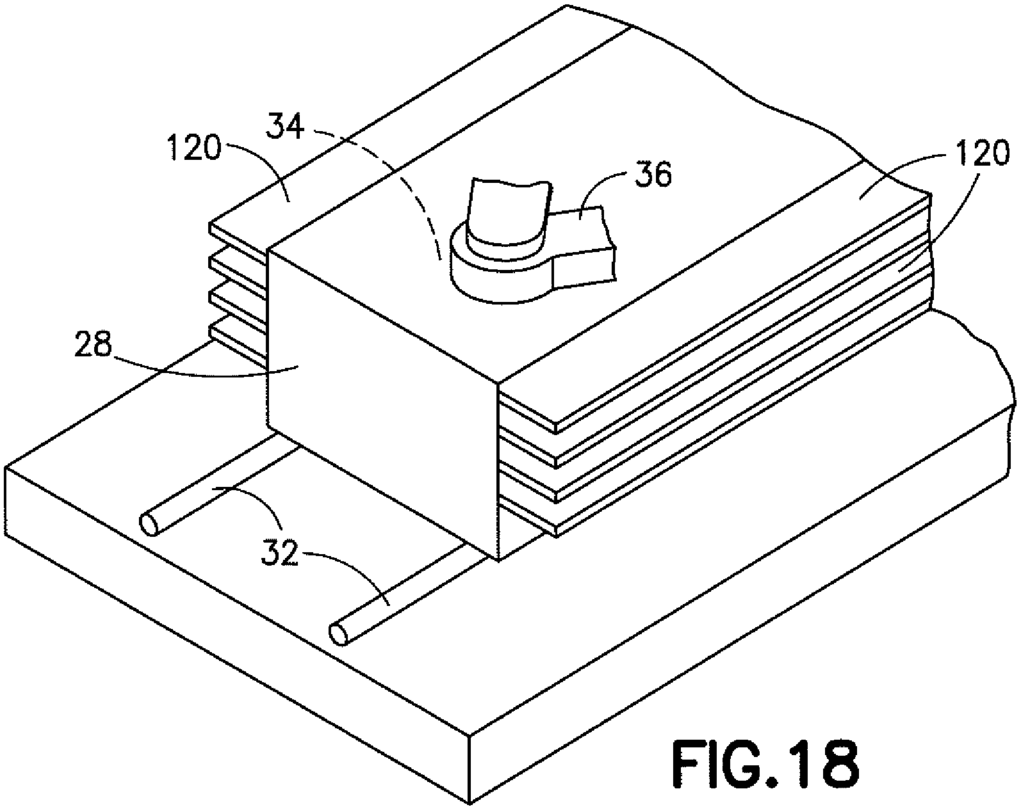
FIG. 18 is a perspective view of the substrate transport apparatus on the bottom wall of the transport chamber.
Figure 18A:
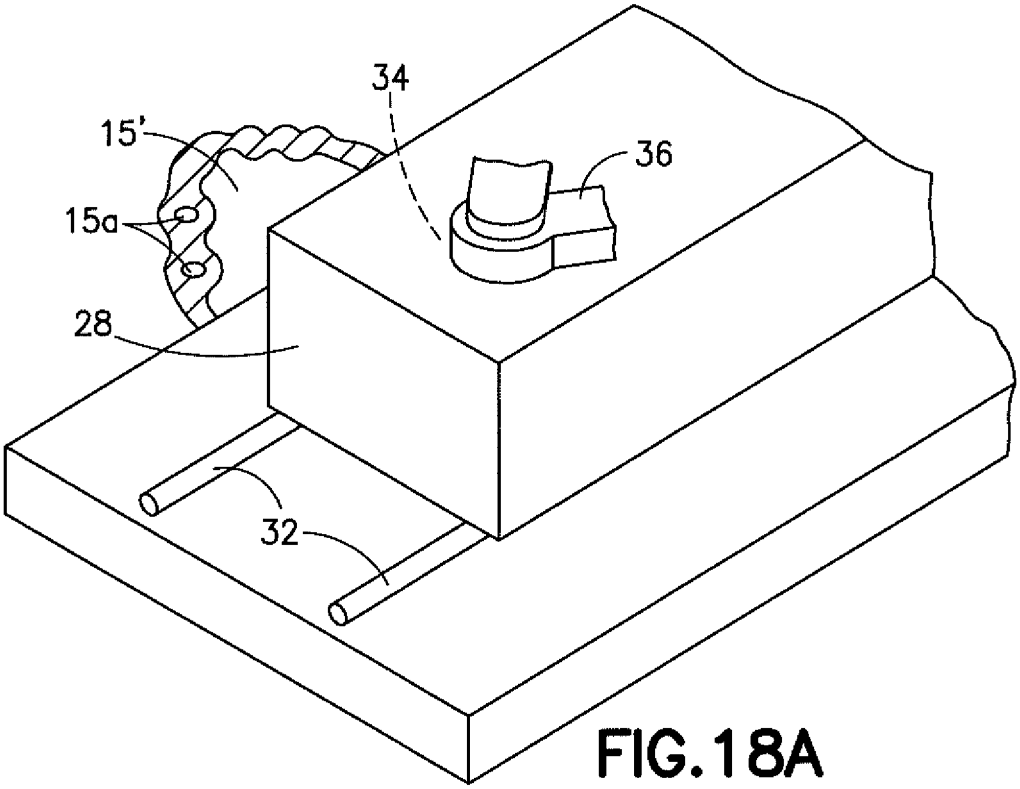
FIG. 18A is a perspective view of an alternate embodiment of the substrate transport apparatus on the bottom wall of the transport chamber.

Referring also to FIG. 18 an alternate example embodiment is shown. This embodiment is similar to that shown in FIGS. 2-4, but has a reduced form factor. The linear motor is enclosed, there are shield linear bearings, and a protected optical link. The heat transfer fins might not be needed under some scenarios. Referring also to FIG. 18A another alternate example embodiment is shown. This embodiment is similar to that shown in FIG. 18, but in this example the enclosure 28 does not comprise heat transfer fins. In this type of embodiment, the wall cooling may be provided in the wall of the enclosure 28 and/or the walls of the vacuum chamber, such as running coolant through the chamber walls when there are no fins for cooling. However, such a cooling system could be used in conjunction with fins. FIG. 18A shows an example of cooling conduits 15*a* in the wall of the chamber 15'.

In some embodiments the cooling of the robot may be enhanced by cooling of the vacuum chamber walls. Heat can be transferred from the robot drive to the vacuum chamber wall through radiation or convection, or some combination of the two. Regardless of the mechanism of heat transfer from the robot drive to the vacuum chamber, the quantity and rate at which heat is transferred may be enhanced by cooling of the chamber walls. Cooling of the chamber walls may be achieved by several different methods, or a combination thereof. In one example embodiment the cooling may be achieved by integration of cooling channels of vents, directly or indirectly on the vacuum chamber walls. A continuous, or intermittent flow of a working fluid, which can be a liquid, or a gas, or a combination of two, such that the working fluid has an initial inlet temperature lower than the vacuum chamber wall temperature, may be employed to achieve cooling of the vacuum wall temperature. This results in enhanced cooling of the robot drive. In an alternative embodiment, thermoelectric cooling tiles may be employed to cool the surfaces of the vacuum chamber, such that heat is rejected at a higher temperature on the hot side of the thermoelectric tiles, thus enabling more effective cooling.

Figure 19:
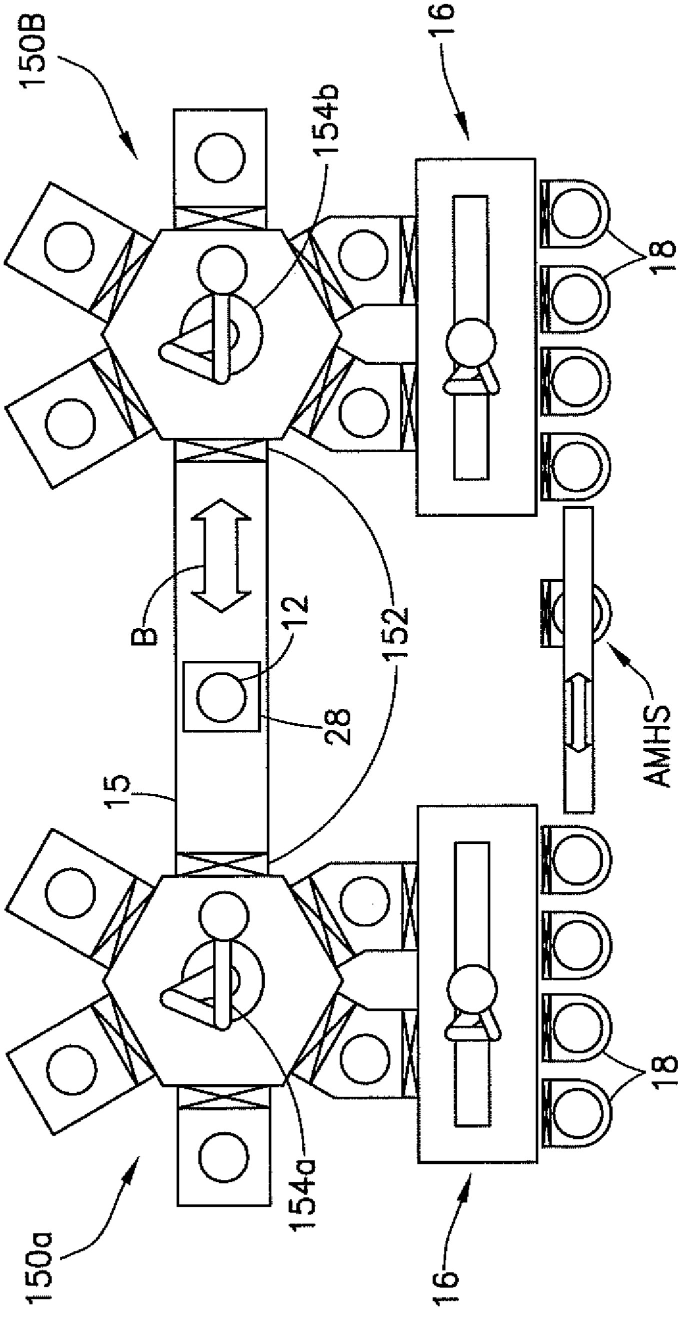
FIG. 19 is a schematic top view of a substrate processing apparatus comprising features as described herein.

Referring also to FIG. 19, an alternate example embodiment is shown. In this example the system is used between two cluster tools 150*a*, 150*b*. The chamber 15 has load locks 152 at opposite ends which are coupled to the tools 150*a*, 150*b*. The robot enclosure 28 and attached robot 26 can move as indicated by arrow B for transporting substrates between the tool robots 154*a*, 154*b*. The robot may also be used in a vacuum EFEM as in FIG. 1.

Features

One of the features as described herein is the ability of the robot enclosure 28 to function as a cart to linearly move inside the transport chamber 15 carrying all necessary components for the substrate transport apparatus 12 and the only physical contact with the transport chamber 15 being on the rails 32. However, even that contact with the rails 32 may be eliminated if a maglev system is used.

Another feature as described herein is that virtually all components of the substrate transport apparatus 12, except for the robot arm assembly 36 and top portions of the robot drive shafts, may be isolated inside the robot enclosure 28 within the area 29. The area 29 may have an atmosphere which is not a vacuum; even if the area 17 is in vacuum. This allows the robot 26 to not be a vacuum compatible robot (a non-vacuum compatible robot). With a non-vacuum compatible robot outgassing is not a significant factor in its design and manufacture. Thus, without having to provide a low or nil outgassing design, a non-vacuum compatible robot is less expensive than a vacuum compatible robot. The robot enclosure 28 may also have a window for the optical communications such that the member 108 may be located totally inside of the robot enclosure 28. The power coupling 80 may also be located totally inside of the robot enclosure 28 with a portion of the robot enclosure 28 having a magnetically transparent section for the two power couplings 78, 80 to function properly with induction. The transport chamber 15 may be provided with a linear encoder 156 as shown in FIG. 10 to sense the linear location of the robot enclosure 28 on the rails 32. All communications with the components in and/or on the robot enclosure 28 may be done optically or wirelessly, or through a power coupling, such that no communication electrical wires or optical wires need to traverse the area 17.

With features as described herein, a robot drive 34 may be sealed by a hermetically sealed robot enclosure 28. Thus, the transport chamber 15 might only need the rails 32 for the substrate transport apparatus 12 to move along, and no other direct physical contacts being made by the transport chamber 15 to the robot enclosure 28 or the substrate transport apparatus 12. Even with a non-maglev embodiment, a gap or spacing may always be provided between the transport chamber 15 and the substrate transport apparatus 12 at all other locations except at the rails 32. This reduces contamination of the area 17 by the substrate transport apparatus 12 because of such non-contact.

Magnetically Guided System

While wheels on the rails has been described above as one type of example embodiment, features as described herein may be used to provide a material-handling robot for vacuum-environment applications that can traverse along a track while eliminating undesirable contamination and outgassing effects associated with mechanical contact on rails and linear bearings utilized in conventional solutions. Thus, rather than using rails, linear guides may be used as part of a maglev system (magnetic levitation system). The guides, such as 32A' and 328' shown in FIG. 20 might be located on the bottom floor of the chamber 15 similar to the rails as in the embodiments described above, or at any suitable location on the chamber interior walls.

Figure 20:
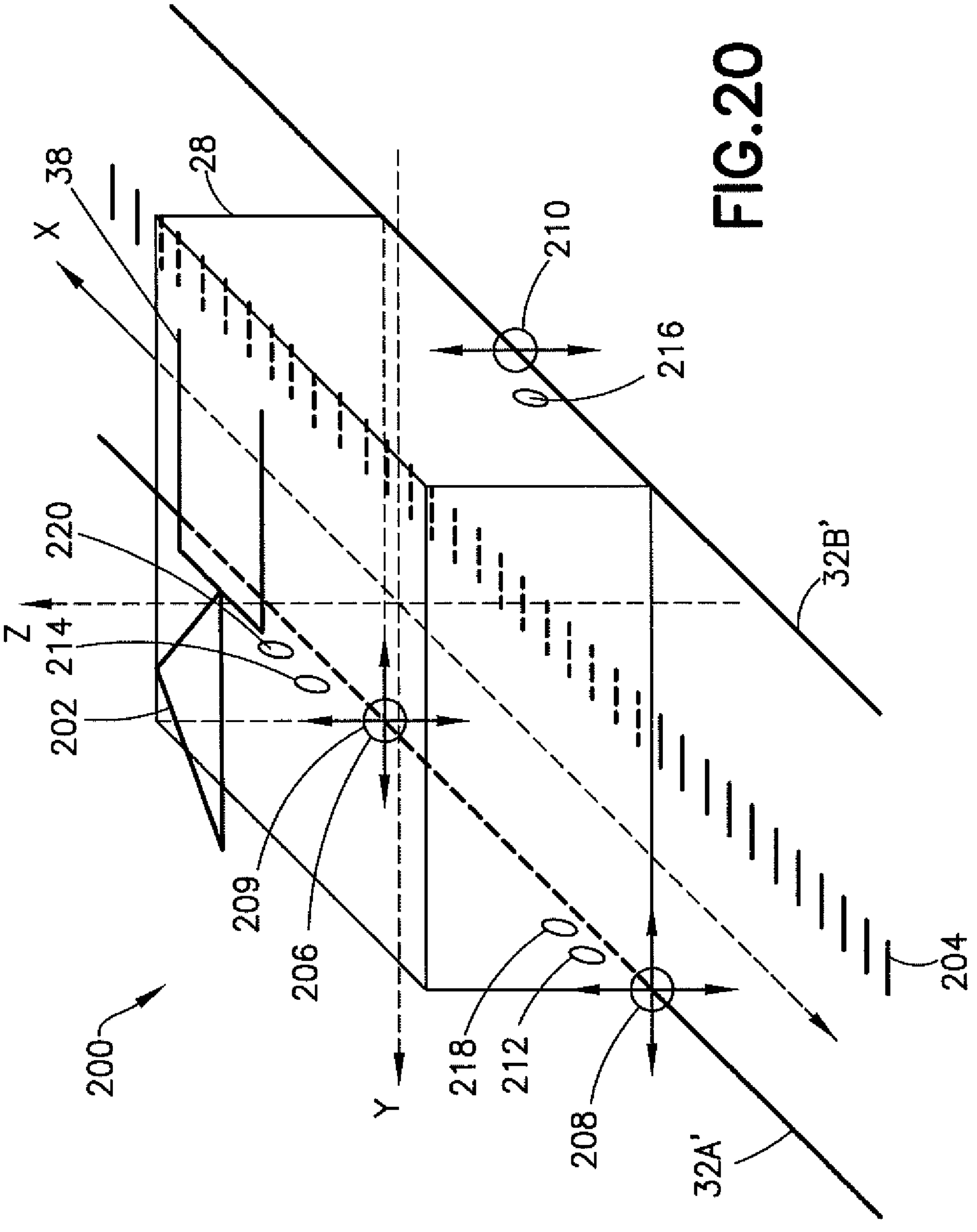
FIG. 20 is a schematic illustration of the enclosure of the robot drive unit at guides of a magnetic support system and control system.

An example embodiment is depicted diagrammatically in FIG. 20. As shown in FIG. 20, the robot 200 may consist of an enclosure 28, a robot drive located inside the enclosure 28, a robot arm 202 at the exterior of the top side of the enclosure and connected to the robot drive and having the end effector 38 configured to support a substrate thereon, a linear actuation system 204, and a magnetic support system and control system 206. The robot drive unit 200, the linear actuation system 204, and a magnetic support system and a control system 206 may be coupled to the controller 50 shown in FIG. 1.

The linear actuation system 204 may comprise at least one linear actuator, position sensors and a position control system (which may be conveniently incorporated into the robot control system). This may be similar to the system comprising the linear motor 70 described above for example.

The linear actuator of the linear actuation system may consist of a movable portion, which may be attached to the enclosure 28, and a stationary portion. For example, the linear actuator may be a linear motor, such as a permanent magnet linear motor as shown in FIGS. 12-13. In this example the movable portion may consist of a forcer with coils and the stationary portion may be formed by a magnet track 204. The linear actuator may be configured to produce a force between the movable portion of the linear actuator and the stationary portion of the linear actuator substantially along the direction of the desired traversing motion of the robot (directions along the x-axis in FIG. 20).

The position sensor(s) of the linear actuation system may be configured to measure the position of the robot drive unit 200 along the desired direction of traversing motion (directions along the x-axis in FIG. 20). As an example, the sensor(s) may comprise a position encoder, such as an optical, magnetic, inductive or capacitive position encoder, a laser interferometer or any other suitable device capable of measuring the position of the robot drive unit along the desired direction of traversing motion, such as relative to the chamber 15 for example. Utilizing the measurements from the position sensor(s), the force produced by the linear actuator may be used to control the position of the robot drive unit along the direction of the desired traversing motion of the robot (directions along the x-axis in FIG. 20).

The magnetic support system may be configured to support and guide the robot drive unit along the direction of the desired traversing motion of the robot (directions along the x-axis in FIG. 20). The magnetic support system may magnetically support the enclosure 28 at a vertically spaced location above the guides 32A', 32B'. The magnetic support system may consist of one or more stationary guides 32A', 32B' substantially parallel with the desired traversing motion of the robot and a plurality of electromagnetic actuators attached to the robot drive unit and configured to produce forces between the robot drive unit and the stationary guides. The guides may be a single part along the length of the chamber, or an assembly of two or more guides connected end-to-end. The magnetic support system may further include sensors that may determine the position of the robot drive unit with respect to the stationary guides and a control system that may control the position of the robot drive unit with respect to the stationary guides (the control system of the magnetic support system may be conveniently incorporated into the robot control system).

Figure 20A:
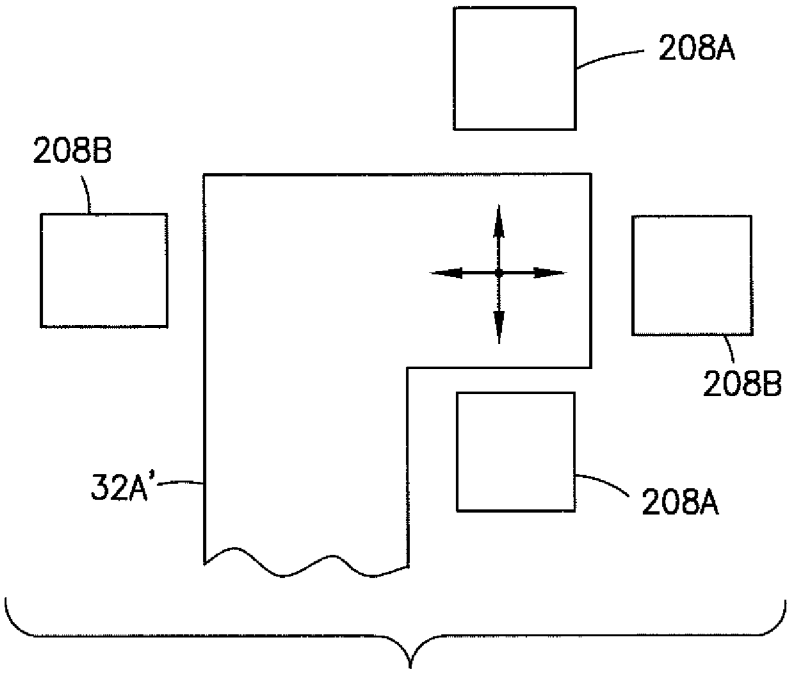
FIGS. 20A-20C are schematic illustrations of the electromagnetic actuators at the maglev guides.

In the example embodiment of FIG. 20, two substantially parallel stationary guides 32A', 32B' may be utilized. Referring also to FIG. 20A, a first pair of electromagnetic actuators 208A may be attached to the robot drive unit, close to the front left corner of the robot drive unit, so that they can produce opposing vertical forces between the robot drive unit and the left stationary guide in the direction normal to the surface of the guide (in FIG. 20, electromagnetic actuators 208 are represented by circles; each circle represents one or more actuators; the forces produce by the actuators are indicated by arrows). This first pair of actuators 208A will be referred to as front left vertical actuators. Another pair of electromagnetic actuators 208B may be attached to the robot drive unit also close to the rear front corner of the robot drive unit so that they can produce opposing horizontal forces between the robot drive unit and the left stationary guide in the direction normal to the surface of the guide. This second pair of actuators will be referred to as front left horizontal actuators. The two spaced pairs of actuators 208A, 208B (i.e., the vertical pair and the horizontal pair for a total of four actuators at the front left corner) may function as a two-degree-of-freedom linear magnetic bearing.

Figure 20B:
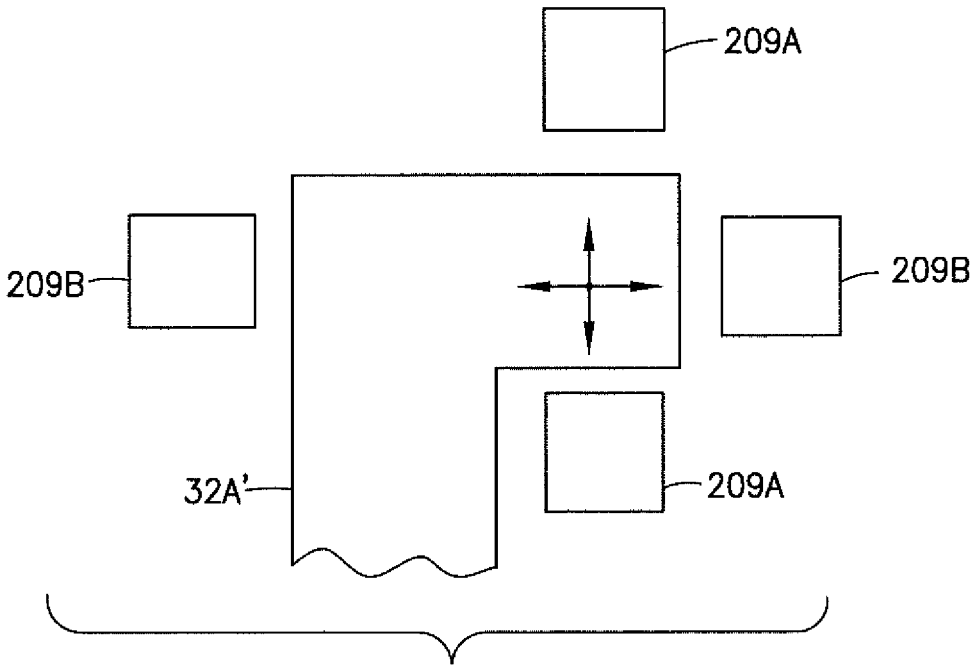

Similarly, and referring to FIG. 20B, a third pair of electromagnetic actuators 209A may be attached to the robot drive unit close to the rear left corner of the robot drive unit so that they can produce opposing vertical forces between the robot drive unit and the left stationary guide in the direction normal to the surface of the guide. This pair of actuators will be referred to as rear left vertical actuators. A fourth pair 209B of electromagnetic actuators may be attached to the robot drive unit also close to the rear left corner of the drive unit so that they can produce opposing horizontal forces between the robot drive unit and the left stationary guide in the direction normal to the surface of the guide. This pair of actuators will be referred to as rear left horizontal actuators. The, two pairs of actuators 209A, 209B (i.e., the vertical pair and the horizontal pair at the rear left corner) may function as a another two-degree-of-freedom linear magnetic bearing.

Figure 20C:
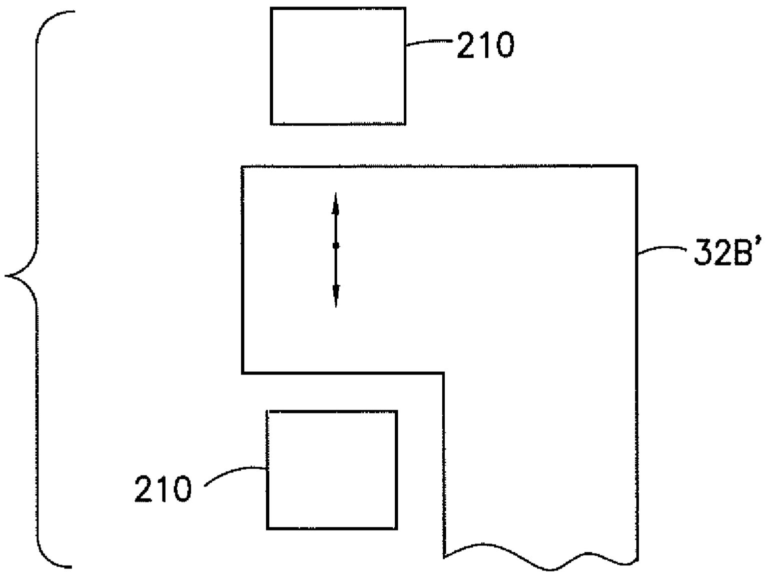

Referring also to FIG. 20C, a fifth pair of electromagnetic actuators 210 may be attached to the robot drive unit on the right-hand side of the robot drive unit so that they can produce opposing vertical forces between the robot drive unit and the right stationary guide in the direction normal to the surface of the guide. This pair of actuators 210 will be referred as right-hand-side vertical actuators. The actuators may function as a single-degree-of-freedom linear magnetic bearing. As can be seen in FIG. 20, the fifth pair of electromagnetic actuators 210 at not located at the front or rear corners of the right side. Instead, the fifth pair of electromagnetic actuators 210 is spaced spaced from those corners, about half-way between the front and rear right side corners.

Figure 20D:
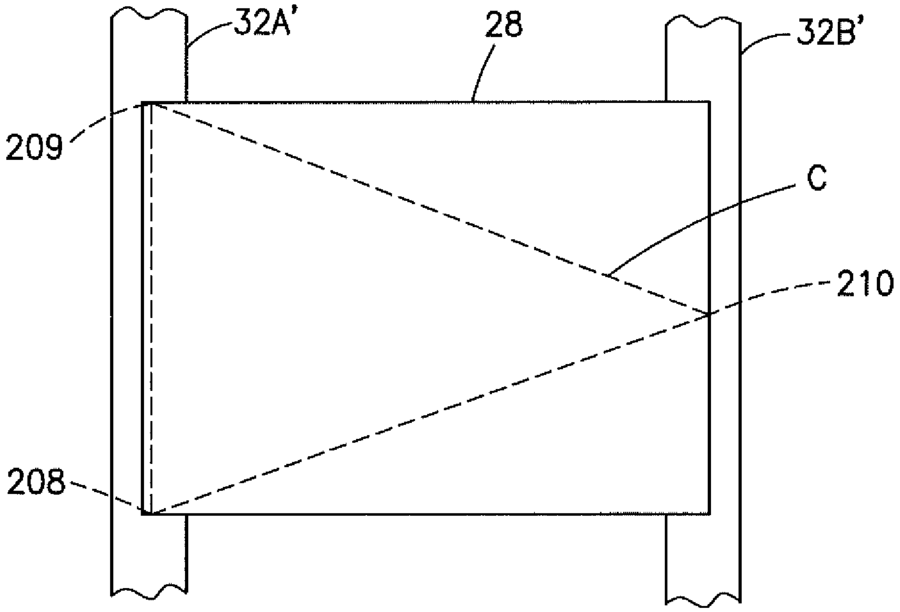
FIG. 20D is a schematic view illustrating a triangular layout of the electromagnetic actuators relative to the enclosure.
Figure 20E:
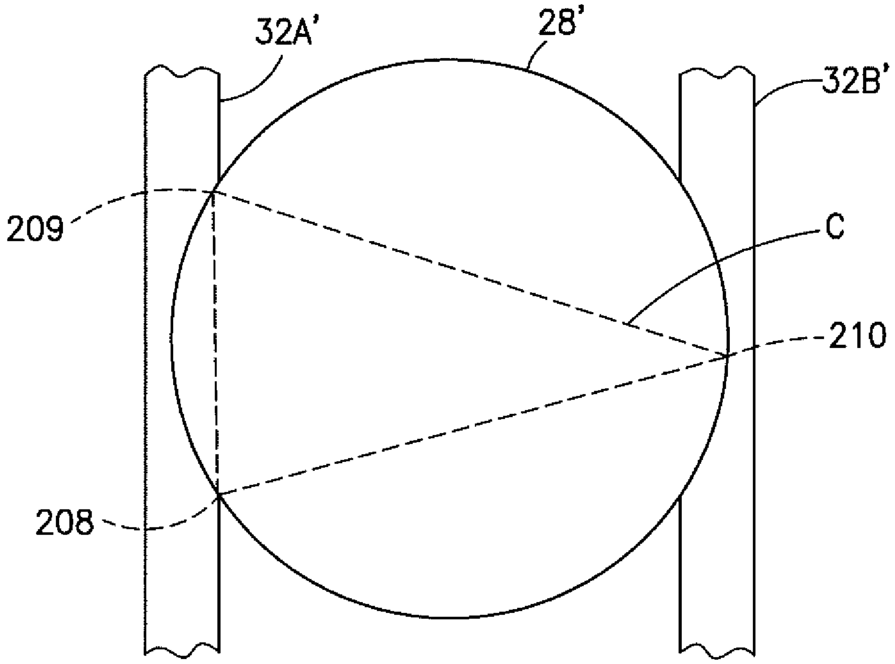
FIGS. 20E-20F are schematic views illustrating the triangular layout of the electromagnetic actuators relative to other shapes of the enclosure.
Figure 20F:
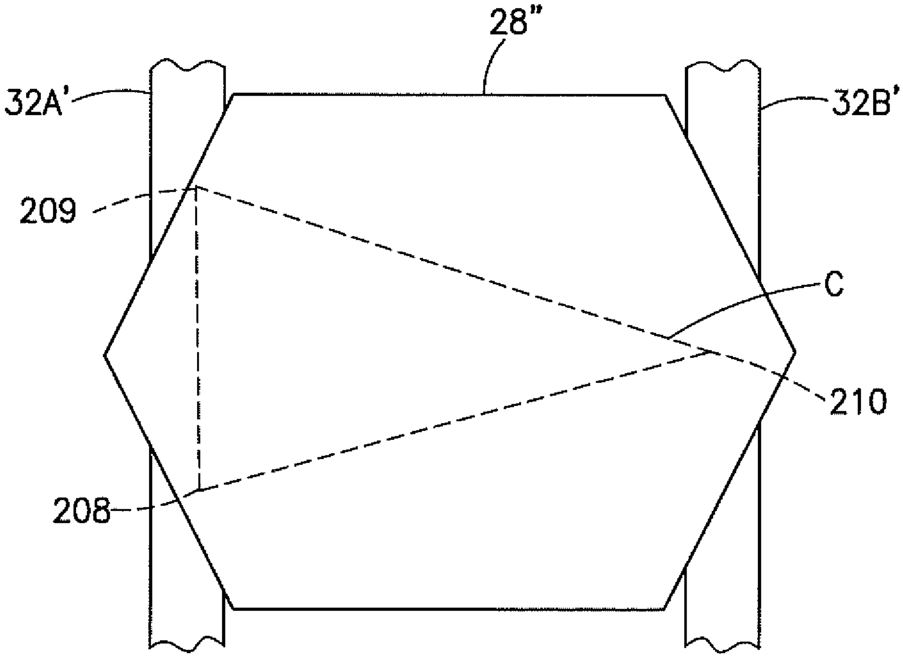

Referring also to FIG. 20D, with the layout of the actuators 208, 209, 210, in a generally triangular pattern as illustrated by virtual shape "C" overlaid over the top side of the enclosure 28 (two groups 208, 209 proximate the bottom corners on one lateral side and one group 210 between opposite corners on the opposite lateral side), only three sets of actuators need be provided. This reduces the number of actuators versus a system where actuators are provided at all four bottom corners of a transport slide. This reduces the costs to manufacture the transport, and also reduces the number of components inside the chamber 15 to reduce possible contamination occurring inside the chamber 15. FIGS. 20E and 20F are schematic top views similar to FIG. 20D, but showing other shapes of enclosures 28', 28" which still use the triangular shaped pattern/layout of the electromagnetic actuators. The enclosure need not be merely a box or rectangular shape.

A sensor 212 that can measure the position of the robot drive unit with respect to the left stationary guide, or with respect to other equivalent geometric references, in a substantially vertical direction may be located at or near the location of the front left vertical actuators. Similarly, a sensor 214 that that can measure the position of the robot drive unit with respect to the left stationary guide, or with respect to other equivalent geometric references, in a substantially vertical direction may be located at or near the location of the rear left vertical actuators, and a sensor 216 that that can measure the position of the robot drive unit with respect to the right stationary guide, or with respect to other equivalent geometric references, in a substantially vertical direction may be located at or near the location of the right-hand-side vertical actuators.

A sensor 218 that can measure the position of the robot drive unit with respect to the left stationary guide, or with respect to other equivalent geometric references, in a substantially horizontal direction may be located at or near the location of the front left horizontal actuators. Similarly, a sensor that can measure the position of the drive unit with respect to the left stationary guide 220, or with respect to other equivalent geometric references, in a substantially horizontal direction may be located at or near the location of the rear horizontal actuators. While it is mathematically convenient to locate sensor at or near actuator positions, the same functional goals may be achieved by the same or different number of sensor located elsewhere on the robot drive.

As an example, the above sensors, which can measure the position of the robot drive unit with respect to the guides in the vertical and horizontal directions, may be gap sensors, such as optical, magnetic, inductive or capacitive gap sensors. In alternate examples, more or less sensors could be provided, and may be located at any suitable location. Data and information from other types of sensors, such as an accelerometer or gyroscope for example, may be used in combination or in exclusion of gap sensors and mathematical models to achieve similar objectives, or when in use in combination to achieve tracking and performance. In the case of embodiments with respect to gap sensors, the gap sensors may use ferromagnetic or non-ferrous materials as a target surface in either case a thin layer of said material applied as a coating or metal tape may be sufficient to serve as a servo target.

The robot drive unit 202 may be viewed as a single rigid body in space which, as such, possesses six degrees of freedom. Considering the example embodiment of FIG. 20, the six degrees of freedom may be represented, for instance, by three Cartesian coordinates of a reference point on the robot drive unit (e.g., x, y and z coordinates) and three angular coordinates (e.g., representing rotations around the x, y and z axes). Conveniently, the angle representing rotation around the x-axis may be referred to as the roll angle, the angle representing rotation around the y-axis may be referred to as the pitch angle, and the angle representing rotation around the z-axis may be referred to as the yaw angle of the robot drive unit.

Based on the measurements from the sensors, the three pairs of vertical actuators, i.e., the front left vertical actuators, the rear left vertical actuators and the right-hand-side vertical actuators, can be utilized to control three degrees of freedom of the robot drive unit, namely the vertical position represented by the z-axis coordinate, the pitch angle and the roll angle of the robot drive unit. The two pairs of horizontal actuators, i.e., the front left horizontal actuators and the rear left horizontal actuators, can be used to control additional two degrees of freedom of the drive unit, namely the lateral position represented by the y-axis coordinate and the yaw angle of the robot drive unit. And, finally, the linear actuator may be employed to control the remaining degree of freedom, namely the position of the robot drive unit along the desired direction of traversing motion represented by the x-axis coordinate.

Figure 20G:
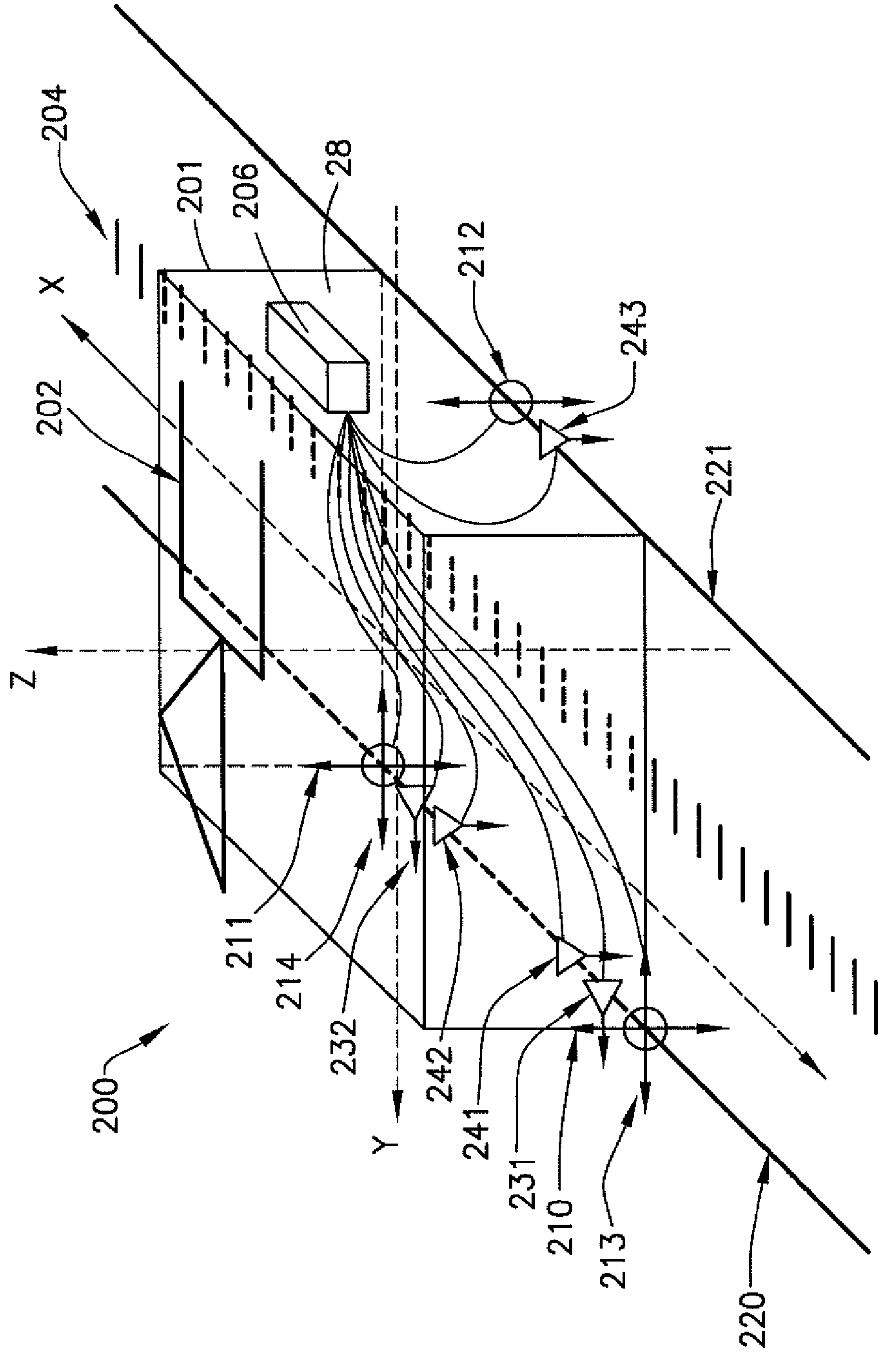
FIG. 20G is a schematic illustration of an alternate embodiment similar to FIG. 20 with the enclosure of the robot drive unit at guides of a magnetic support system and control system.

Another example embodiment is depicted diagrammatically in FIG. 20G. As shown in FIG. 20G, the robot 200 may consist of an enclosure 28, a robot drive located inside the enclosure 28, a robot arm 202 at the exterior of the top side of the enclosure and connected to the robot drive unit 201 and having the end effector 38 configured to support a substrate thereon, a linear actuation system, and a magnetic levitation support system and a control system 206. The robot drive unit 201, the linear actuation system 204, and a magnetic support system and a control system 206 may be coupled to the controller 50 shown in FIG. 1.

The linear actuation system may comprise at least one linear actuator, position sensors and a position control system (which may be conveniently incorporated into the robot control system). This may be similar to the system comprising the linear motor 70 described above for example.

The linear actuator of the linear actuation system may consist of a movable portion, which may be attached to the enclosure 28, and a stationary portion. For example, the linear actuator may be a linear motor, such as a permanent magnet linear motor as shown in FIGS. 12-13. In this example the movable portion may consist of a forcer with coils and the stationary portion may be formed by a magnet track 204. The linear actuator may be configured to produce a force between the movable portion of the linear actuator and the stationary portion of the linear actuator substantially along the direction of the desired traversing motion of the robot (directions along the x-axis in FIG. 20G).

The position sensor(s) of the linear actuation system may be configured to measure the position of the robot drive unit 201 along the desired direction of traversing motion (directions along the x-axis in FIG. 20G). As an example, the sensor(s) may comprise a position encoder, such as an optical, magnetic, inductive or capacitive position encoder, a laser interferometer or any other suitable device capable of measuring the position of the robot drive unit along the desired direction of traversing motion, such as relative to the chamber 15 for example. Utilizing the measurements from the position sensor(s), the force produced by the linear actuator may be used to control the position of the robot drive unit along the direction of the desired traversing motion of the robot (directions along the x-axis in FIG. 20G).

The magnetic support system may be configured to support and guide the robot drive unit along the direction of the desired traversing motion of the robot (directions along the x-axis in FIG. 20G). The magnetic support system may magnetically support the enclosure 28 at a vertically spaced location above the guides 220, 221. The magnetic support system may consist of one or more stationary guides 220, 221 substantially parallel with the desired traversing motion of the robot and a plurality of electromagnetic actuators attached to the robot drive unit and configured to produce forces between the robot drive unit and the stationary guides. The guides may be a single part along the length of the chamber, or an assembly of two or more guides connected end-to-end. The magnetic support system may further include sensors that may determine the position of the robot drive unit with respect to the stationary guides and a control system that may control the position of the robot drive unit with respect to the stationary guides (the control system of the magnetic support system may be conveniently incorporated into the robot control system).

In the example embodiment of FIG. 20G, two substantially parallel stationary maglev guides 220, 221 may be utilized. A pair of electromagnetic actuators 210 may be attached to the robot drive unit, close to the front left corner of the robot drive unit 201, so that they can produce opposing vertical forces between the robot drive unit and the left stationary guide 220 in the direction normal to the surface of the guide (in FIG. 20G, electromagnetic actuators 210, 211, 212, 213, 214 are represented by circles; each circle represents one or more actuators; the forces produce by the actuators are indicated by arrows). This pair of actuators 210 will be referred to as front left vertical actuators. Another pair of electromagnetic actuators 213 may be attached to the robot drive unit also close to the front left corner of the drive unit so that they can produce opposing horizontal forces between the robot drive unit 201 and the left stationary guide 220 in the direction normal to the surface of the guide. This pair of actuators 213 will be referred to as front left horizontal actuators. The two pairs of actuators, i.e., the vertical pair 210 and the horizontal pair 213, may function as a two-degree-of-freedom linear magnetic bearing.

Similarly, a pair of electromagnetic actuators 211 may be attached to the robot drive unit close to the rear left corner of the robot drive unit so that they can produce opposing vertical forces between the robot drive unit 201 and the left stationary guide 220 in the direction normal to the surface of the guide. This pair of actuators 211 will be referred to as rear left vertical actuators. Another pair of electromagnetic actuators 214 may be attached to the robot drive unit also close to the rear left corner of the drive unit so that they can produce opposing horizontal forces between the robot drive unit 201 and the left stationary guide 220 in the direction normal to the surface of the guide. This pair of actuators 214 will be referred to as rear left horizontal actuators. The, two pairs of actuators, i.e., the vertical pair 211 and the horizontal pair 214, may function as another two-degree-of-freedom linear magnetic bearing.

Finally, a pair of electromagnetic actuators 212 may be attached to the robot drive unit 201 on the right-hand side so that they can produce opposing vertical forces between the robot drive unit and the right stationary guide 221 in the direction normal to the surface of the guide. This pair of actuators 212 will be referred as right-hand-side vertical actuators. The actuators may function as a single-degree-of-freedom linear magnetic bearing.

A sensor 241 that can measure the position of the robot drive unit with respect to the left stationary guide 220 in a substantially vertical direction may be located at or near the location of the front left vertical actuators 210. Similarly, a sensor 242 that that can measure the position of the robot drive unit with respect to the left stationary guide 220 in a substantially vertical direction may be located at or near the location of the rear left vertical actuators 211, and a sensor 243 that that can measure the position of the robot drive unit with respect to the right stationary guide 221 in a substantially vertical direction may be located at or near the location of the right-hand-side vertical actuators 212. In FIG. 20G, substantially vertical sensors 241, 242, 243 are represented as downward pointing triangles.

A sensor 231 that can measure the position of the robot drive unit with respect to the left stationary guide 220 in a substantially horizontal direction may be located at or near the location of the front left horizontal actuators 213. Similarly, a sensor 232 that can measure the position of the drive unit 201 with respect to the left stationary guide 220 in a substantially horizontal direction may be located at or near the location of the rear horizontal actuators 214. In FIG. 20G, the substantially horizontal sensors 231, 232 are represented as sideways pointing arrows.

As an example and as noted above, the above sensors, which can measure the position of the robot drive unit with respect to the guides in the vertical and horizontal directions, may be gap sensors, such as optical, magnetic, inductive or capacitive gap sensors. In alternate examples, more or less sensors could be provided, and may be located at any suitable location. Data and information from other types of sensors, such as an accelerometer or gyroscope for example, may be used in combination or in exclusion of gap sensors and mathematical models to achieve similar objectives, or when in use in combination to achieve tracking and performance. In the case of embodiments with respect to gap sensors, the gap sensors may use ferromagnetic or non-ferrous materials as a target surface in either case a thin layer of said material applied as a coating or metal tape may be sufficient to serve as a servo target.

The robot drive unit 201 may be viewed as a single rigid body in space which, as such, possesses six degrees of freedom. Considering the example embodiment of FIG. 20G, the six degrees of freedom may be represented, for instance, by three Cartesian coordinates of a reference point on the robot drive unit (e.g., x, y and z coordinates) and three angular coordinates (e.g., representing rotations around the x, y and z axes). Conveniently, the angle representing rotation around the x-axis may be referred to as the roll angle, the angle representing rotation around the y-axis may be referred to as the pitch angle, and the angle representing rotation around the z-axis may be referred to as the yaw angle of the robot drive unit.

Based on the measurements from the sensors, the three pairs of vertical actuators, i.e., the front left vertical actuators 210, the rear left vertical actuators 211 and the right-hand-side vertical actuators 212, can be utilized to control three degrees of freedom of the robot drive unit 201, namely the vertical position represented by the z-axis coordinate, the pitch angle and the roll angle of the robot drive unit. The two pairs of horizontal actuators, i.e., the front left horizontal actuators 213 and the rear left horizontal actuators 214, can be used to control additional two degrees of freedom of the drive unit, namely the lateral position represented by the y-axis coordinate and the yaw angle of the robot drive unit. And, finally, the linear actuator may be employed to control the remaining degree of freedom, namely the position of the robot drive unit along the desired direction of traversing motion represented by the x-axis coordinate.

Figure 21:
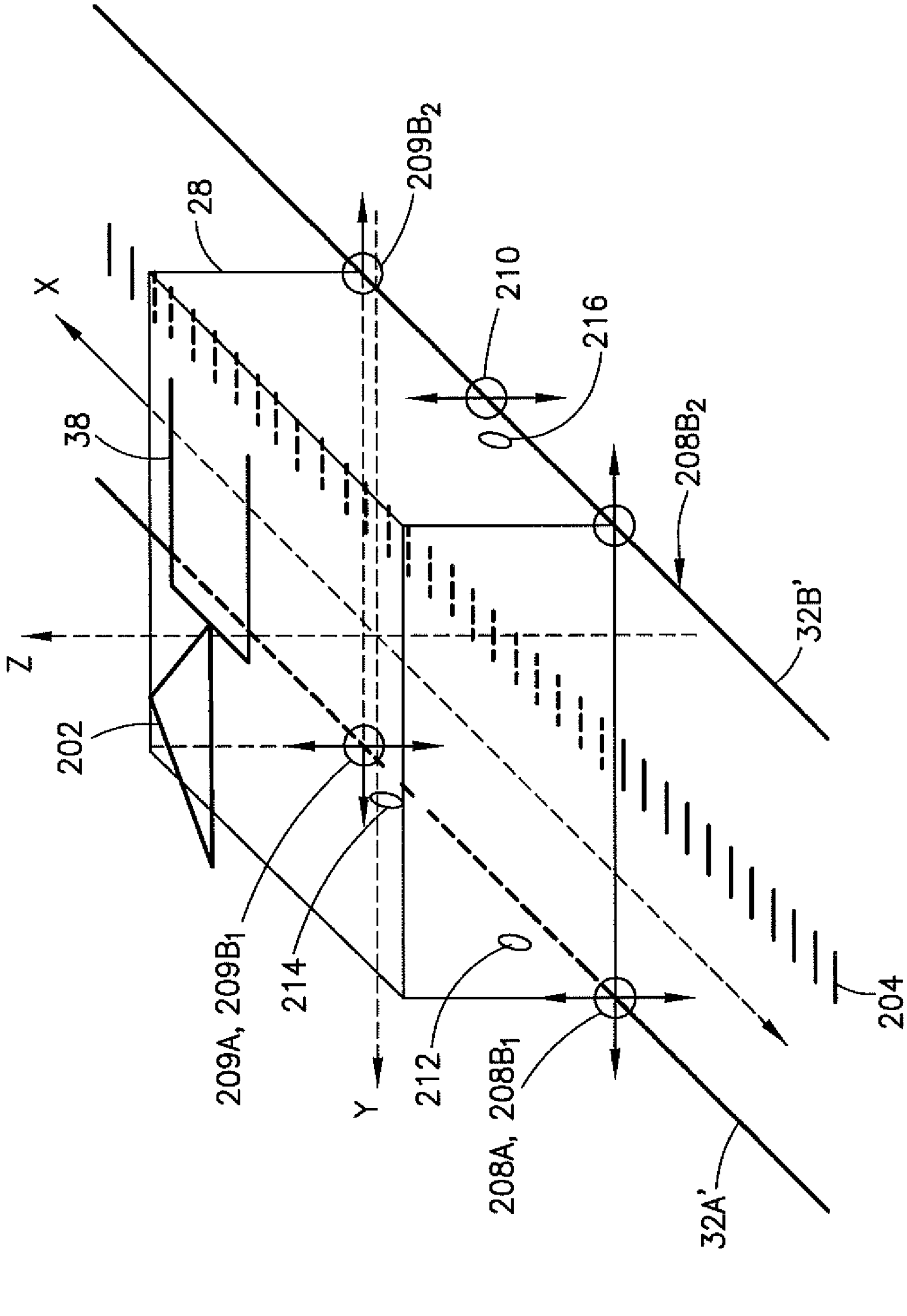
FIG. 21 is a schematic illustration of an alternate embodiment similar to FIG. 20 with the enclosure of the robot drive unit at guides of a magnetic support system and control system.

Another example embodiment of the robot according to the present invention is depicted diagrammatically in FIG. 21. In this example embodiment, two substantially parallel stationary guides 32A', 32B', a pair of front left vertical actuators 208A, a pair of rear left vertical actuators 209A, a pair of right-hand-side vertical actuators 210 and vertical position sensors 212, 214, 216 may be utilized in the configuration substantially equivalent to the previous example embodiment.

An electromagnetic actuator 208$B_1$ may be attached to the robot drive unit close to the front left corner of the drive unit so that it can produce a horizontal force between the robot drive unit and the left stationary guide 32A' in the direction normal to the surface of the guide. The electromagnetic actuator may be configured to produce a force that may point either outward or inward (i.e., away or toward the right guide; due to the nature of the electromagnetic actuator, the force may be produce in one of the two directions only). This actuator 208$B_1$ will be referred to as the front left horizontal actuator.

Another electromagnetic actuator 208$B_2$ may be attached to the robot drive unit close to the front right corner of the drive unit so that it can produce a horizontal force between the robot drive unit and the right stationary guide 32B' in the direction normal to the surface of the guide. The electromagnetic actuator may be configured to produce a force that may point in substantially opposite direction to the direction of the force produced by the front left horizontal actuator.

This actuator $208B_2$ will be referred to as the front right horizontal actuator. In the example embodiment of FIG. 21, the front left and front right horizontal actuators $208B_1$, $208B_2$ may assume the role of the pair of the front left horizontal actuators 208B utilized in the example embodiment of FIG. 20.

Another electromagnetic actuator $209B_1$ may be attached to the robot drive unit close to the rear left corner of the drive unit so that it can produce a horizontal force between the robot drive unit and the left stationary guide 32A' in the direction normal to the surface of the guide. The electromagnetic actuator may be configured to produce a force that may point either outward or inward (i.e., away or toward the right guide; due to the nature of the electromagnetic actuator, the force may be produce in one of the two directions only). This actuator $209B_1$ will be referred to as the rear left horizontal actuator.

Another electromagnetic actuator $209B_2$ may be attached to the robot drive unit close to the rear right corner of the drive unit so that it can produce a horizontal force between the robot drive unit and the right stationary guide 32B' in the direction normal to the surface of the guide. The electromagnetic actuator may be configured to produce a force that may point in substantially opposite direction to the direction of the force produced by the rear left horizontal actuator. This actuator $209B_2$ will be referred to as the rear right horizontal actuator. In the example embodiment of FIG. 21, the rear left and rear right horizontal actuators $209B_1$, 209B2 may assume the role of the pair of the rear left horizontal actuators 209B utilized in the example embodiment of FIG. 20.

Figure 22:
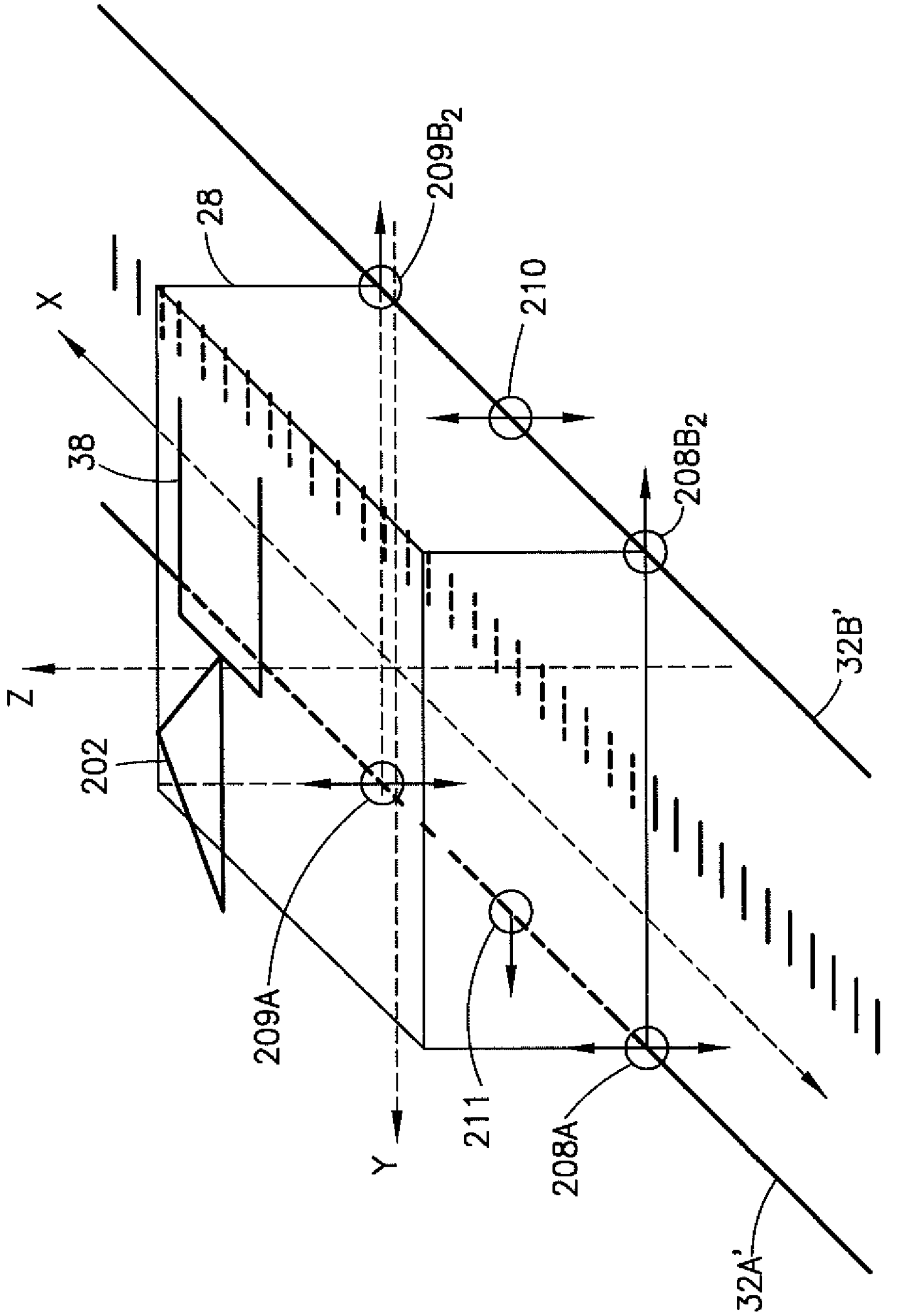
FIG. 22 is a schematic illustration of an alternate embodiment similar to FIG. 20 with the enclosure of the robot drive unit at guides of a magnetic support system and control system.

Another example embodiment of the robot according to the present invention is depicted diagrammatically in FIG. 22. In this example embodiment, two substantially parallel stationary guides 32A', 32B', a pair of front left vertical actuators 208A, a pair of rear left vertical actuators 209A, a pair of right-hand-side vertical actuators 210 and vertical position sensors (see 212, 214, 216 in FIG. 20 for example) may be utilized in the configuration substantially equivalent to the two previous example embodiments.

As shown in FIG. 22, an electromagnetic actuator 211 may be attached to the robot drive unit on the left-hand side of the robot drive unit so that it can produce a horizontal force between the robot drive unit and the left stationary guide 32A' in the direction normal to the surface of the guide. The electromagnetic actuator may be configured to produce a force that may point either outward or inward (i.e., away or toward the left guide; due to the nature of the electromagnetic actuator, the force may be produce in one of the two directions only). This actuator will be referred to as the left-hand-side horizontal actuator.

Another electromagnetic actuator $208B_2$ may be attached to the robot drive unit close to the front right corner of the drive unit so that it can produce a horizontal force between the robot drive unit and the right stationary guide 328' in the direction normal to the surface of the guide. The electromagnetic actuator $208B_2$ may be configured to produce a force that may point in substantially opposite direction (i.e., inward or outward) to the direction of the force produced by the left-hand-side horizontal actuator. This actuator $208B_2$ will be referred to as the front right horizontal actuator.

An electromagnetic actuator $209B_2$ may be attached to the robot drive unit close to the rear right corner of the drive unit so that it can produce a horizontal force between the robot drive unit and the right stationary guide 32B' in the direction normal to the surface of the guide. This electromagnetic actuator may also be configured to produce a force that may point in substantially opposite direction (i.e., inward or outward) to the direction of the force produced by the left-hand-side horizontal actuator. This actuator $209B_2$ will be referred to as the rear right horizontal actuator.

Figure 22A:
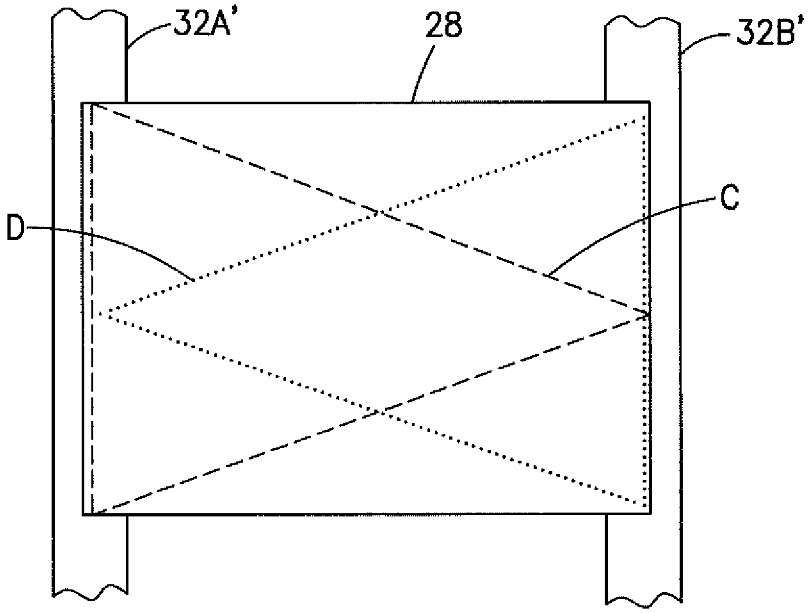
FIG. 22A is a schematic top view of an alternate embodiment.

In the example embodiment of FIG. 22, the left-hand-side, front right and rear right horizontal actuators may assume the role of the front left and rear left horizontal actuators utilized in the example embodiment of FIG. 20 or the role of the front left, front right, rear left and rear right horizontal actuators of the example embodiment of FIG. 21. As shown with reference also to FIG. 22A, this may be used to provide two triangular layout patterns C and D of the electromagnetic actuators relative to the robot drive unit or enclosure; "C" for the vertical actuators and "D" for the horizontal actuators.

Figure 23:
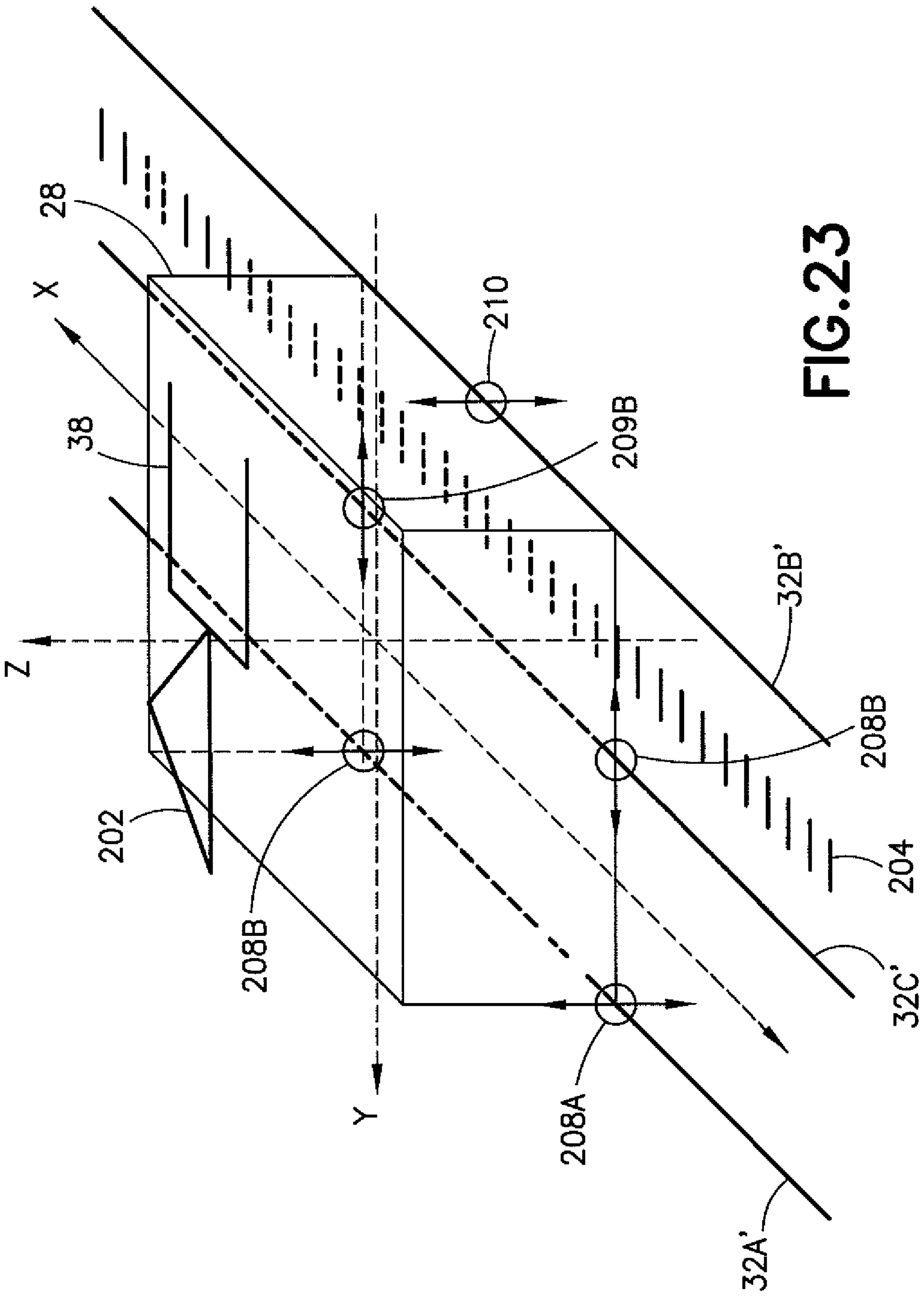
FIG. 23 is a schematic illustration of an alternate embodiment similar to FIG. 20 with the enclosure of the robot drive unit at guides of a magnetic support system and control system.

Another example embodiment of the robot according to the present invention is depicted diagrammatically in FIG. 23. In this example embodiment, two substantially parallel stationary guides 32A', 32B', front left vertical actuators 208A, rear left vertical actuators 209A, right-hand-side vertical actuators 210 and vertical position sensors (see 212, 214, 216 in FIG. 20 for example) may be utilized in the configuration substantially equivalent to the previous example embodiments.

In addition, as shown in FIG. 23, the magnetic support system may include another guide 32C', referred to as the third stationary guide, which may also be substantially parallel with the desired direction of traversing motion of the robot. Although the third guide 32C' is depicted in the central location between the left and right stationary guides 32A', 32B', it may be located in any other convenient location.

A pair of electromagnetic actuators 208B may be attached to the robot drive unit close to the front end of the drive unit so that they can produce opposing horizontal forces between the robot drive unit and the third stationary guide 32C' in the direction normal to the surface of the guide. This pair of actuators 208B will be referred to as front horizontal actuators.

Similarly, a pair of electromagnetic actuators 209B may be attached to the robot drive unit close to the rear end of the robot drive unit so that they can produce opposing horizontal forces between the robot drive unit and the third stationary guide 32C' in the direction normal to the surface of the guide. This pair 209B of actuators will be referred to as rear horizontal actuators.

In the example embodiment of FIG. 23, the front horizontal actuators may assume the role of the front left horizontal actuators utilized in the example embodiment of FIG. 20, and the rear horizontal actuators may assume the role of the rear left horizontal actuators utilized in the example embodiment of FIG. 20.

Figure 24A:
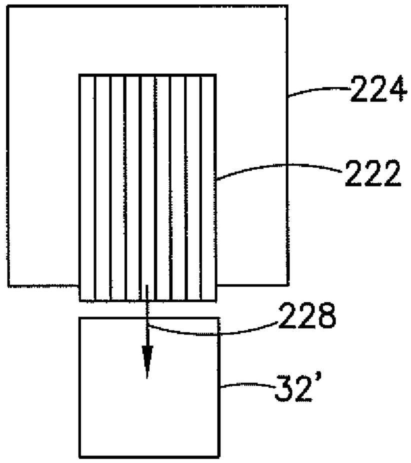
FIGS. 24A and 24B are schematic illustrations of an example of an electromagnetic actuator utilized in the magnetic support system shown in FIGS. 20-23.
Figure 24B:
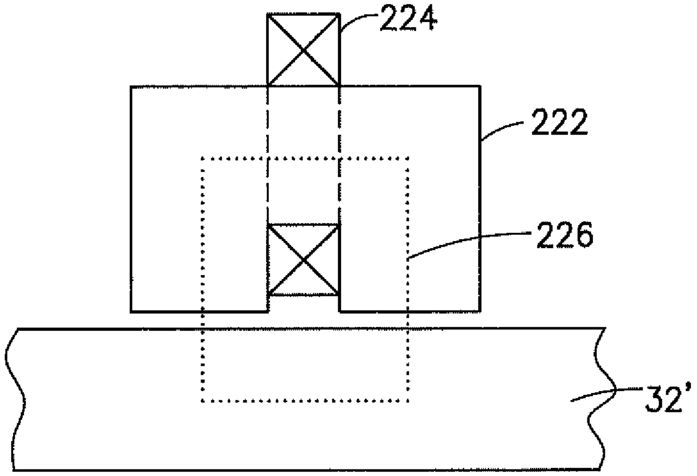

An example of an electromagnetic actuator utilized in the magnetic support system of the robot according to the present invention is diagrammatically depicted in FIGS. 24A-24B. The electromagnetic actuator may consist of a C-shaped ferromagnetic core 222 made of laminated steal, soft magnetic composite, or other suitable ferromagnetic material, and a winding 224 or a combination of windings installed on the iron core and configured to produce magnetic flux 226 through the iron core, which in turn may produce attractive force between the iron core and the guide 32 of the magnetic support system of the robot. In the figure, the path of the magnetic flux 226 is illustrated by dotted lines; the arrow 228 indicates the force produced by and acting on the actuator.

Figure 25A:
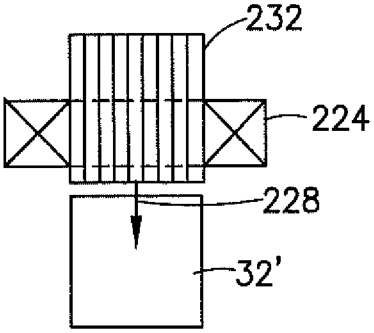
FIGS. 25A and 25B are schematic illustrations of an example of an electromagnetic actuator utilized in the magnetic support system shown in FIGS. 20-23.
Figure 25B:
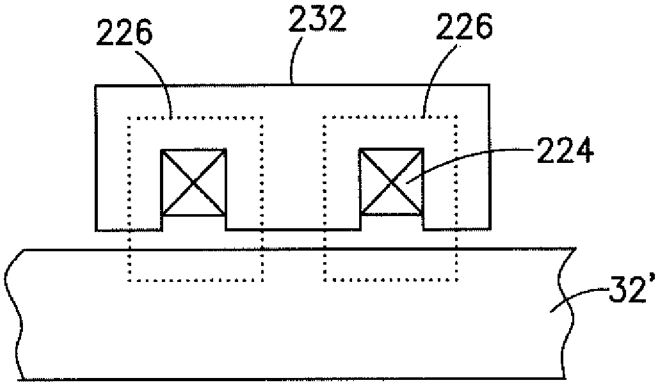

Another example of an electromagnetic actuator for the magnetic support system of the robot according to the present invention is diagrammatically depicted in FIGS. 25A-25B. In this embodiment, the actuator may utilize an S-shaped iron core 232. The cores may be orientated in any manner with respect to the guides. For example, in FIGS. 24-25 the core may travel left to right with respect to the guide, or alternatively may travel in and out of the plane of the figure. In such an embodiment the guides would extend in/out of the plane of the figure instead of left to right.

Figure 26A:
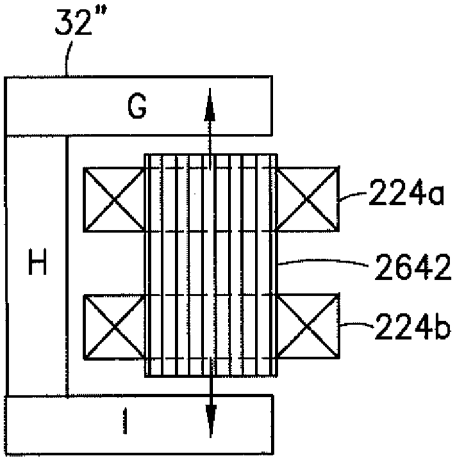
Figure 26B:
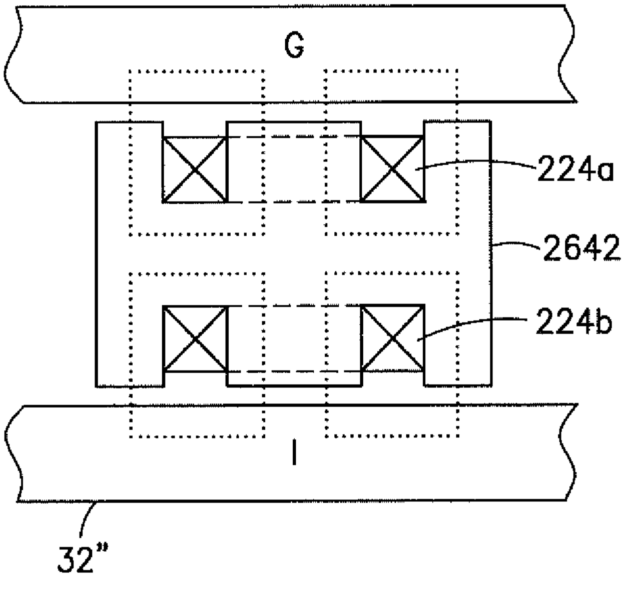

Yet another example of an electromagnetic actuator arrangement that may be utilized in the magnetic support system of the robot according to the present invention is diagrammatically depicted in FIGS. 26A-26B. In this embodiment, two actuators may be combined into a single mechanical assembly with two windings 224*a*, 224*b* and a shared iron core 242 configured to interact with a C-shaped guide 32". Since the central section of the iron core is shared by the two windings, this arrangement may provide a desirably smaller and lighter actuator package (the central section of the iron core may be shared because the two windings are never energized at the same time). The C-shaped guide 32" may consist of two horizontal soft magnetic sections G, I connected by a non-magnetic vertical section H. While more complex, the guide arrangement provides structural and integration advantages when the robot is installed in a vacuum chamber.

Figure 27:
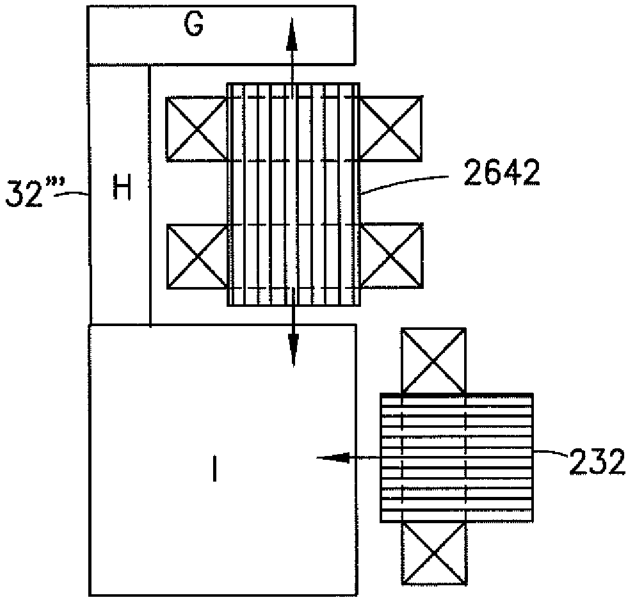
FIG. 27 is a schematic illustration of an example of an electromagnetic actuator utilized in the magnetic support system shown in FIGS. 20-23.

An example arrangement that combines the example embodiment of FIGS. 26A-26B in the role of vertical actuators and the example embodiment of FIGS. 25A-25B in the role of a horizontal actuator is depicted diagrammatically in FIG. 27.

Figure 28A:
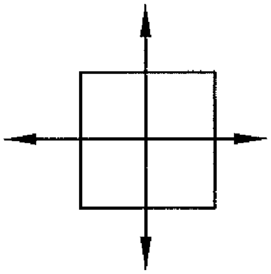
FIGS. 28A and 28B are schematic illustrations of example produced vertical and horizontal forces.
Figure 28B:
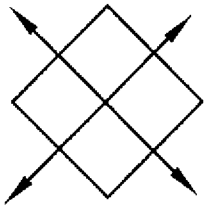
Figure 28C:
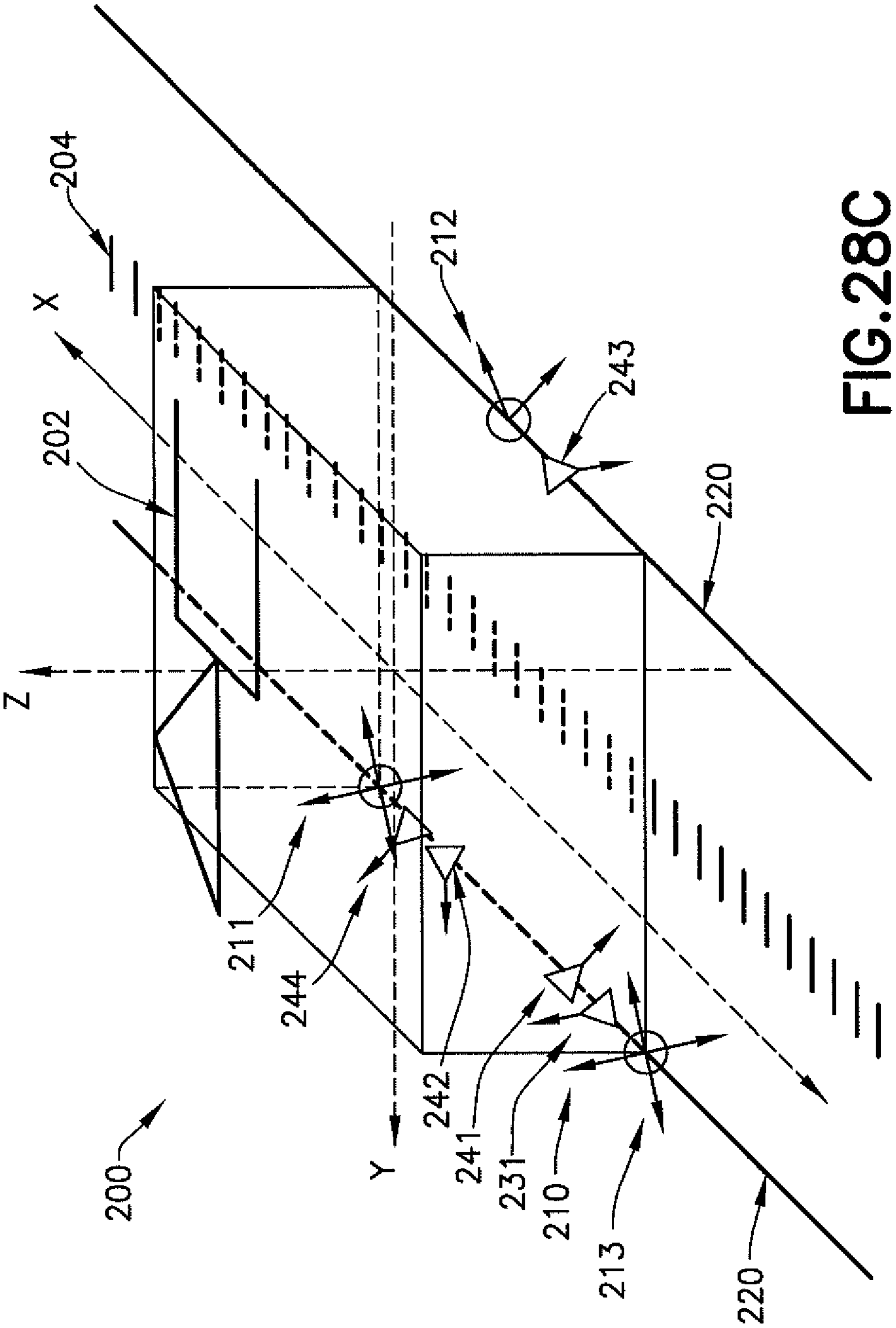
FIG. 28C is a schematic illustration of an alternate embodiment similar to FIG. 20 with the enclosure of the robot drive unit at guides of a magnetic support system and control system.

Although the descriptions of the various embodiments of the present invention assume that the electromagnetic actuators are arranged so that they produce forces independently in vertical and horizontal directions, the actuators may be oriented in any suitable manner. For example, the two-degree-of-freedom linear magnetic bearings of the example of embodiment of FIG. 20 may utilize electromagnetic actuators that produce vertical and horizontal forces, as depicted diagrammatically in FIG. 28A, or they may utilize electromagnetic actuators that produce forces in other, preferably but not limited to orthogonal, directions, as illustrated diagrammatically in FIG. 28B. It should also be noted that while actuators and sensors are discussed as separate entities, it is possible and beneficial to combine the two into a single bi-functional unit that both senses and actuates. See for example US patent publication No. US 2018/0090253 A1 which is hereby incorporated by reference in its entirety. In the example embodiment of FIG. 28B, the electromagnetic actuators may be controlled so that the vector sum of the forces produced by the electromagnetic actuators decomposes to the desired vertical and horizontal components. In general, both sensors and actuators may be located and orientated in a wide variety of positions. An example is shown in FIG. 28C which comprises maglev rails or guides 220, a robot 200, a robot arm 202, a linear actuation system 204, actuators 210, 211, 212, 213, sensors 231, 241, 242, 243, 244.

Figure 29:
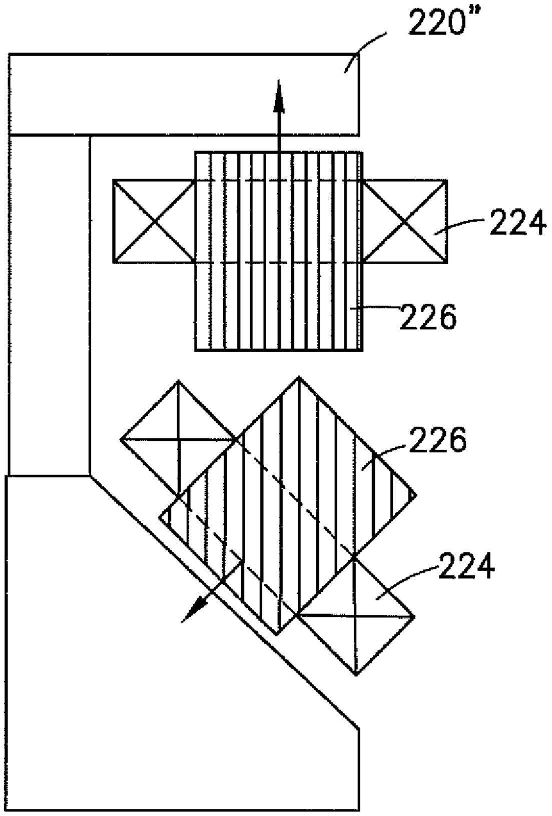
FIG. 29 is a schematic illustration of example produced vertical and horizontal forces.

Although example locations of sensors are provided in the descriptions of the various embodiments of the present invention, any suitable sensor locations and any number of sensors may be used as long as the measurements obtained from the sensors can be used to determine uniquely the position of the robot drive unit with respect to the stationary guides. An example of a non-orthogonal actuator layout is illustrated in FIG. 29 which shows a guide 220", two pairs of actuators 224, 226.

It should be noted that the actuators described in connection with the various embodiments of the present invention may be individual actuators, may be formed by combining multiple actuators and/or may be integrated to form integrated magnetic bearings.

It should also be noted that the control system of the linear actuation system and the control system of the magnetic support system may be combined and/or their functionality may be incorporated into the robot control system. Features as described herein may also comprise features as described in U.S. Pat. No. 10,269,604 which is hereby incorporated by reference in its entirety.

Figure 30:
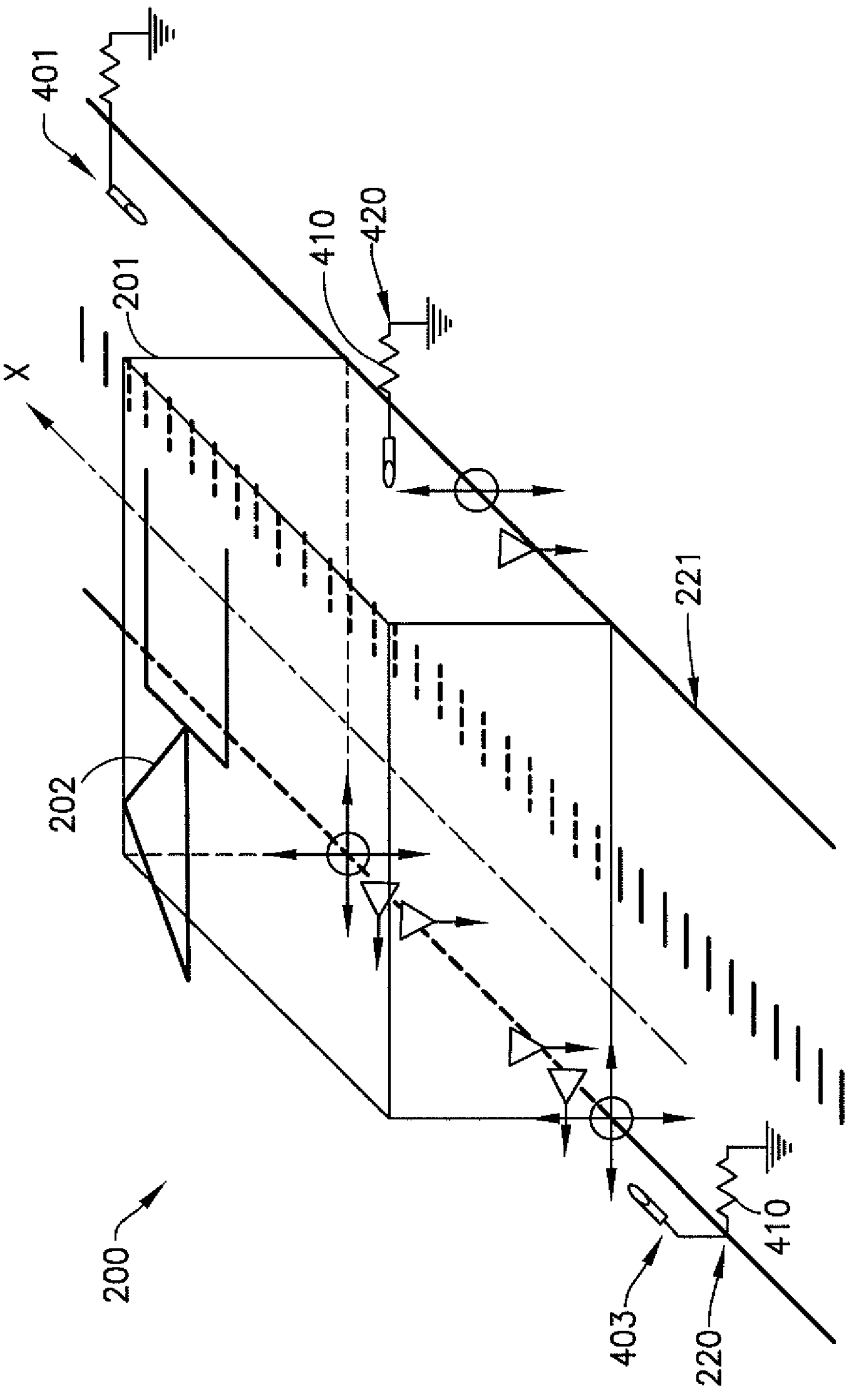
FIG. 30 is a schematic illustration of an alternate embodiment similar to FIG. 20 with the enclosure of the robot drive unit at guides of a magnetic support system and control system.

It is noted that a robot drive riding on a maglev support system is completely isolated and not in physical contact with any other body. In such a situation electrostatic charge buildup may occur on the robot drive. Excessive electrostatic charge buildup may lead to interference with normal operation of the robot. Two interests electrostatic George gilder, and mitigate contaminant issues, a system for intermittent discharge of electrostatic charge from the robot body is disclosed here. An example of the system is illustrated in FIG. 30. The discharge mechanism consists of an arrangement of one or more electrical grounded contact points 401, 402, 403 which make contact with the robot drive or robot arm or any other component of the moving robot. In the example embodiment shown, the grounded contact points 401, 402, 403 are shown on the maglev guides 220, 221. The contact points may be located so that the robot makes contact as in the reaches the end of travel in the X axis. Alternatively, the contact may be made in the middle of the X motion range. Alternatively, the contact point may be integrated into guides. When contact is made, the electrostatic charge buildup on the robot is discharged from ground through the ground path provided to the contact point. To avoid arcing, the discharge current may be routed through an electrical resistor or other active or passive electrical component(s) as illustrated by 410.

Figure 31:
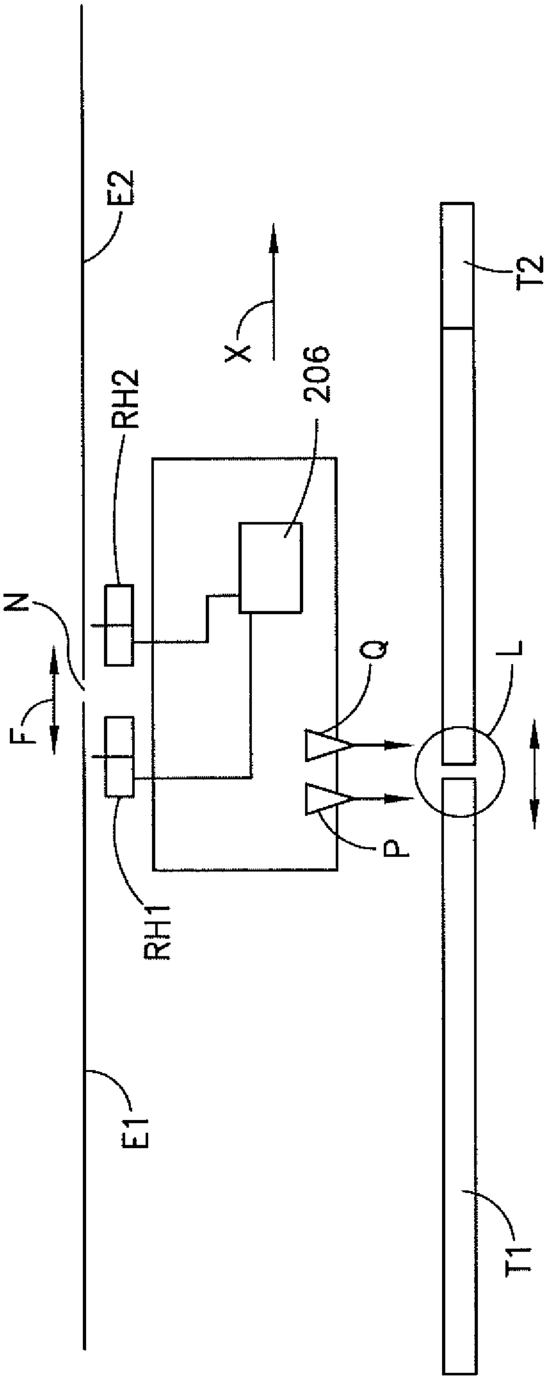
FIG. 31 is a diagram illustrating use of multiple sensors to account for transitions between linear maglev tracks/guides and maglev gap sensor targets.

It is noted that as the X axis motion range for the linear vacuum robot becomes very large, it becomes challenging to build a position track for the position sensor which is a part of the linear actuator system described earlier. To overcome this limitation, a segmented position track approach with dual position sensors is disclosed here. With reference to FIG. 31, as the robot drive traverses in the X direction, both positions sensors RH1, RH2 generate valid position data offset by spacing length F at all instances except when one or the other of the sensors RH1, RH2 is targeting the transition between the ends of the two position tracks E1, E2. Note the gap or transition N. The disclosed solution overcomes the period at which one sensor data is invalid by switching over to the other sensor. Since the sensors RH1, RH2 are physically offset relative to the length of the guides/tracks E1, E2, at least one of the sensors RH1, RH2 always reports valid position. Since the location of the transition N between tracks E1, E2 is a design quantity, it is known ahead of time and the controller 206 makes a decision based on the known location of the transition N to switch between the sensors RH1, RH2. In other embodiments, algorithms may be implemented to use, merge or combine the data from the sensors RH1, RH2 to achieve a gradual or smooth transition of data as the active sensor is switched. During periods of time where data from both sensors is valid, the data from both may be combined or merged in various manners to achieve higher accuracy, resolution, reliability, or noise rejection.

It is noted that as the X axis motion range for the maglev supported robot becomes very large, it becomes challenging to build smooth and continuous surfaces for the gap sensors to target. With reference to FIG. 31, there are two vertical sensors P, Q targeted at target T1, T2. There is a break/transition in the targets T1, T2 at location L. The gap measurement from either sensor is valid as long as they are not traveling through the location L. The controller 206 makes a decision based on X motion location from sensor RH1, RH2 on time instants when the gap sensor is transitioning through L. The informed algorithm is implemented on the controller 206 to use the gap data from P or Q.

An example embodiment may be provided with an apparatus comprising: a first device configured to support a substrate thereon; a first transport having the first device connected thereto, where the first transport is configured to support the first device for movement along a horizontal path, where the first transport comprises: at least two guides or guides; a magnetic system configured to vertically space the first device over the at least two guides with a gap between the first device and the at least two guides, where the magnetic system comprises a first electromagnetic actuator at a first corner of a first side of the first device, a second electromagnetic actuator at a second corner of the first side of the first device, and a third electromagnetic actuator at a second opposite side of the first device, where the third electromagnetic actuator is not located proximate a corner of three sides of the first device; and a linear actuator configured to move the first device in the path along the at least two guides.

The first, second and third electromagnetic actuators may be the sole actuators spacing the first device vertically above the at least two guides. The first and second electromagnetic actuators may each be configured to produce opposing horizontal forces between the first device and the first guide. The third electromagnetic actuator may be configured to not produce horizontal forces between the first device and the second guide. The first and second electromagnetic actuators may each be configured to produce horizontal forces between the first device and the first guide in a first direction, and the apparatus further comprises a fourth electromagnetic actuator and a fifth electromagnetic actuator proximate respective third and fourth corners of three sides of the first device, where the fourth and fifth electromagnetic actuators are each configured to produce horizontal forces between the first device and the second guide in an opposite second direction. The apparatus may further comprise a fourth electromagnetic actuator located proximate the first side of the first device configured to produce a horizontal force between the first device and the first guide in a first direction, and a fourth electromagnetic actuator and a fifth electromagnetic actuator proximate respective third and fourth corners of three sides of the first device, where the fourth and fifth electromagnetic actuators are each configured to produce horizontal forces between the first device and the second guide in an opposite second direction. The at least two guides may comprise a third guide between the first and second guides, where the apparatus further comprises a fourth electromagnetic actuator and a fifth electromagnetic actuator at the third guide, where the fourth and fifth electromagnetic actuators are each configured to produce opposite horizontal forces between the first device and the third guide. The first device may comprise a robot enclosure having a robot motor therein, and a robot arm connected to the robot motor, where the robot arm is located outside of the robot enclosure, where the robot arm comprises an end effector configured to support the substrate thereon, where the first side is a first lateral side of the robot enclosure and the second side is a second opposite lateral side of the robot enclosure. The apparatus may further comprise first sensors at the first electromagnetic actuator, second sensors at the second electromagnetic actuator, and third sensors at the electromagnetic actuator, where the sensors are configured to measure a position of the first device with respect to the first and second guides.

In accordance with another example, a method may be provided comprising: connecting a first electromagnetic actuator proximate a first corner of a first side of a first device, where the first corner is at three sides of the first device, where the first device is configured to support a substrate thereon, where the first electromagnetic actuator is part of a magnetic system of a first transport having the first device connected thereto, where the first transport is configured to support the first device for movement along a horizontal path; connecting a second electromagnetic actuator proximate a second corner of the first side of a first device, where the second electromagnetic actuator is part of the magnetic system, where the second corner is at three sides of the first device; connecting a third electromagnetic actuator proximate a second opposite side of the first device, where the third electromagnetic actuator is part of the magnetic system, where the third electromagnetic actuator is not located proximate a corner of three sides of the first device; and locating the first device over at least two rails or guides, where the first and second electromagnetic actuators are located at a first one of the rails and the third electromagnetic actuator is located at a different second one of the rails.

The first, second and third electromagnetic actuators may be the sole actuators spacing the first device vertically above the at least two rails. The first and second electromagnetic actuators may each be configured to produce opposing horizontal forces between the first device and the first rail. The third electromagnetic actuator may be configured to not produce horizontal forces between the first device and the second rail. The first and second electromagnetic actuators may each be configured to produce horizontal forces between the first device and the first rail in a first direction, and the apparatus further comprises a fourth electromagnetic actuator and a fifth electromagnetic actuator proximate respective third and fourth corners of three sides of the first device, where the fourth and fifth electromagnetic actuators are each configured to produce horizontal forces between the first device and the second rail in an opposite second direction. The method may further comprise connecting a fourth electromagnetic actuator proximate the first side of the first device configured to produce a horizontal force between the first device and the first rail in a first direction, and connecting a fourth electromagnetic actuator and a fifth electromagnetic actuator proximate respective third and fourth corners of three sides of the first device, where the fourth and fifth electromagnetic actuators are each configured to produce horizontal forces between the first device and the second rail in an opposite second direction. The method may further comprise connecting a fourth electromagnetic actuator and a fifth electromagnetic actuator to the first device, where the fourth and fifth electromagnetic actuators are each configured to produce opposite horizontal forces between the first device and a third rail, with the third rail being located between the first and second rails. The first device may comprise a robot enclosure having a robot motor therein, and a robot arm connected to the robot motor, where the robot arm is located outside of the robot enclosure, where the robot arm comprises an end effector configured to support the substate thereon, where the first side is a first lateral side of the robot enclosure and the second side is a second opposite lateral side of the robot enclosure. The method may further comprise providing first sensors at the first electromagnetic actuator, providing second sensors at the second electromagnetic actuator, and providing third sensors at the electromagnetic actuator, where the sensors are configured to measure a position of the first device with respect to the first and second rails.

An example may be provided with a method comprising: controlling a first electromagnetic actuator to vertically space a first corner of a first device over a first rail or guide, where the first electromagnetic actuator is part a first transport configured to vertically magnetically space the first device over the first rail and a second rail or guide with a gap between the first device and the rails, where the first transport is configured to support the first device for movement along a horizontal path, where the first corner is at three sides of the first device, where the first device is configured to support a substrate thereon; controlling a second electromagnetic actuator of the magnetic system to vertically space a different second corner of the first device over the first rail, where the second corner is at three sides of the first device, where the first and second corners are at a first side of the first device; and controlling a third electromagnetic actuator of the magnetic system to vertically space the first device over the second rail, where the third electromagnetic actuator is located at an opposite second side of the first device, and where the third electromagnetic actuator is not located proximate a corner of three sides of the first device.

In accordance with an example embodiment, an apparatus is provided comprising: at least one processor; and at least one non-transitory memory including computer program code, the at least one memory and the computer program code configured to, with the at least one processor, cause the apparatus to: control a first electromagnetic actuator to vertically space a first corner of a first device over a first rail or guide, where the first electromagnetic actuator is part of a magnetic system of a first transport configured to vertically magnetically space the first device over the first rail and a second rail or guide with a gap between the first device and the rails, where the first transport is configured to support the first device for movement along a horizontal path, where the first corner is proximate three sides of the first device, where the first device is configured to support a substrate thereon; control a second electromagnetic actuator of the magnetic system to vertically space a different second corner of the first device over the first rail, where the second corner is at three sides of the first device, where the first and second corners are at a first side of the first device; and control a third electromagnetic actuator of the magnetic system to vertically space the first device over the second rail, where the third electromagnetic actuator is located at an opposite second side of the first device, and where the third electromagnetic actuator is not located at a corner of three sides of the first device.

In accordance with an example embodiment, an apparatus is provided comprising: means for controlling a first electromagnetic actuator to vertically space a first corner of a first device over a first rail or guide, where the first electromagnetic actuator is part of a magnetic system of a first transport configured to vertically magnetically space the first device over the first rail and a second rail or guide with a gap between the first device and the rails, where the first transport is configured to support the first device for movement along a horizontal path, where the first corner is proximate three sides of the first device, where the first device is configured to support a substrate thereon; means for controlling a second electromagnetic actuator of the magnetic system to vertically space a different second corner of the first device over the first rail, where the second corner is at three sides of the first device, where the first and second corners are at a first side of the first device; and means for controlling a third electromagnetic actuator of the magnetic system to vertically space the first device over the second rail, where the third electromagnetic actuator is located at an opposite second side of the first device, and where the third electromagnetic actuator is not located at a corner of three sides of the first device.

In accordance with an example embodiment, a non-transitory program storage device readable by a machine may be provided, tangibly embodying a program of instructions executable by the machine for performing operations, the operations comprising: controlling a first electromagnetic actuator to vertically space a first corner of a first device over a first rail or guide, where the first electromagnetic actuator is part of a magnetic system of a first transport configured to vertically magnetically space the first device over the first rail and a second rail or guide with a gap between the first device and the rails, where the first transport is configured to support the first device for movement along a horizontal path, where the first corner is proximate three sides of the first device, where the first device is configured to support a substrate thereon; controlling a second electromagnetic actuator of the magnetic system to vertically space a different second corner of the first device over the first rail, where the second corner is at three sides of the first device, where the first and second corners are at a first side of the first device; and controlling a third electromagnetic actuator of the magnetic system to vertically space the first device over the second rail, where the third electromagnetic actuator is located at an opposite second side of the first device, and where the third electromagnetic actuator is not located at a corner of three sides of the first device.

Linear Vacuum Robot Control System Architecture

Figures 32, 32A:
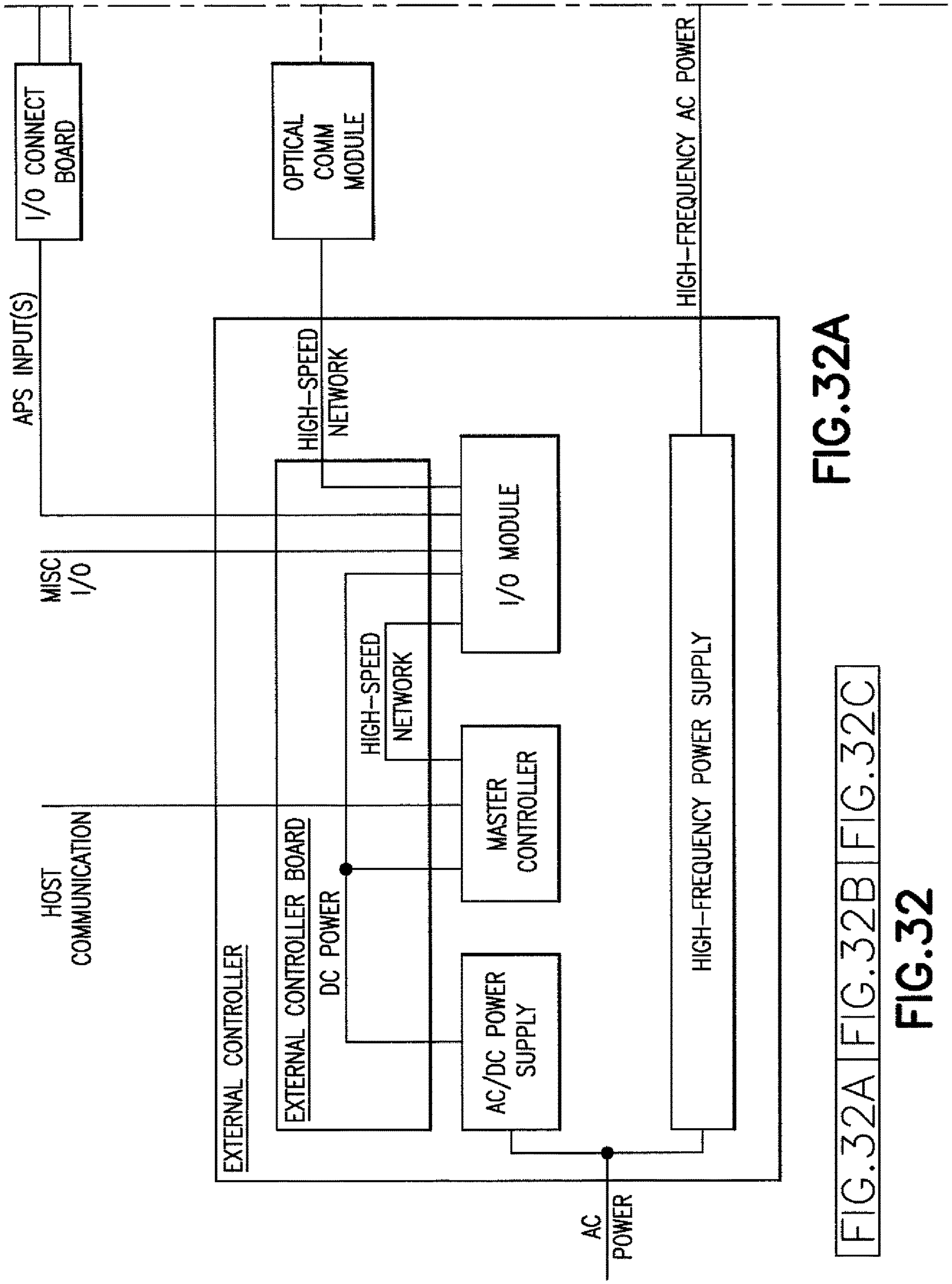
FIGS. 32-41 are diagrams illustrating examples of linear robot control systems.
Figure 32B:
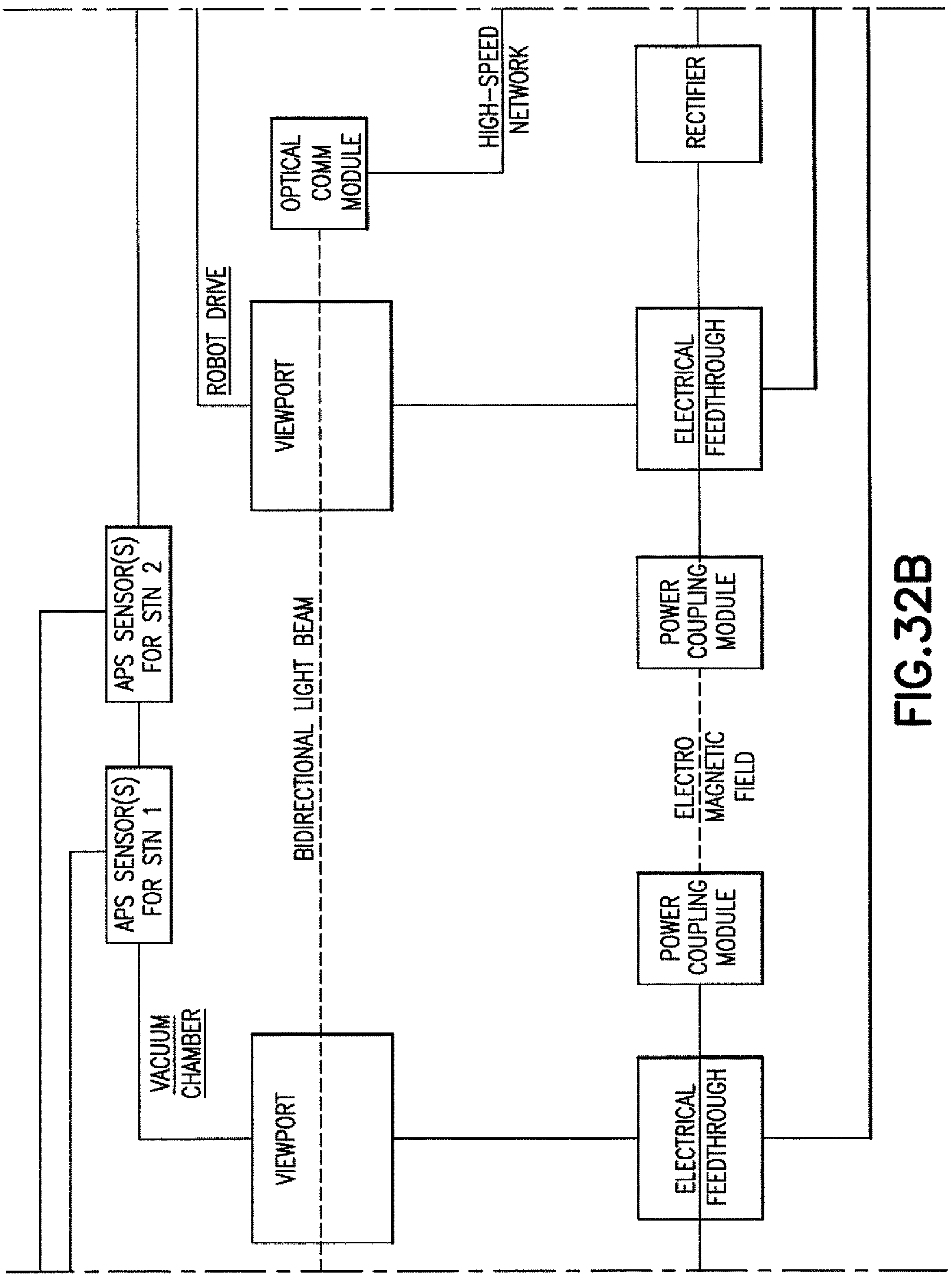
Figure 32C:
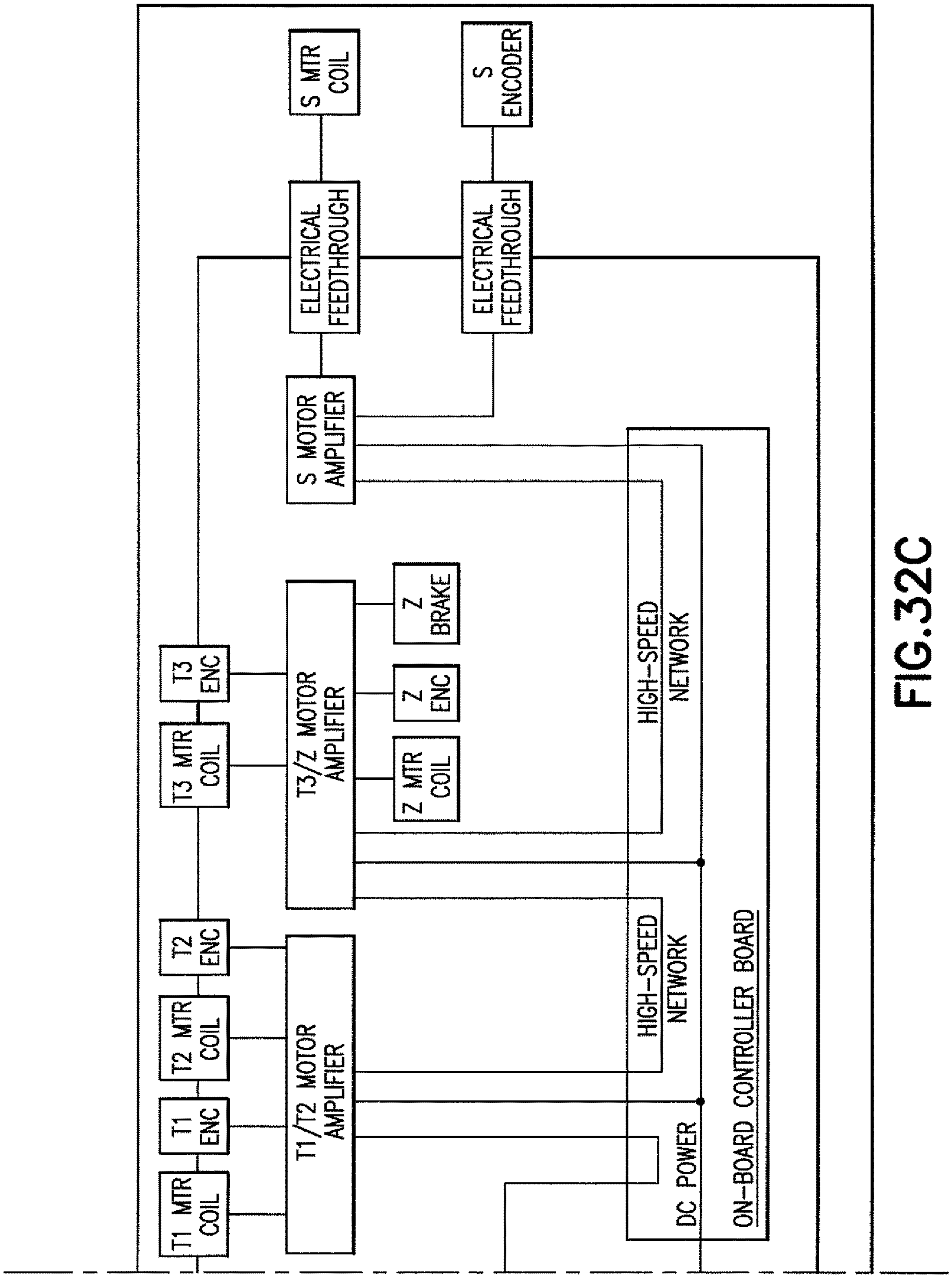

A block diagram of an example embodiment of the linear robot control system is provided in FIG. 32.

The master controller may perform the following functions: the user interface, communication with host controller (e.g., utilizing serial communication or Ethernet communication), configuration data management, high-level motion planning (i.e., sequencing of moves of the robot), trajectory generation (calculation of motion profiles for each move for each axis of motion), position control for all axes of motion and APS (adaptive placement system). One example of an adaptive placement system is described in U.S. Pat. No. 10,058,996 which is hereby incorporated by reference in its entirety.

The master controller may receive from the host controller various commands, including configuration, request and action commands, e.g., commands to perform a pick or place operation, and it may report back to the host controller completion of the commands and other information.

Figure 36A:
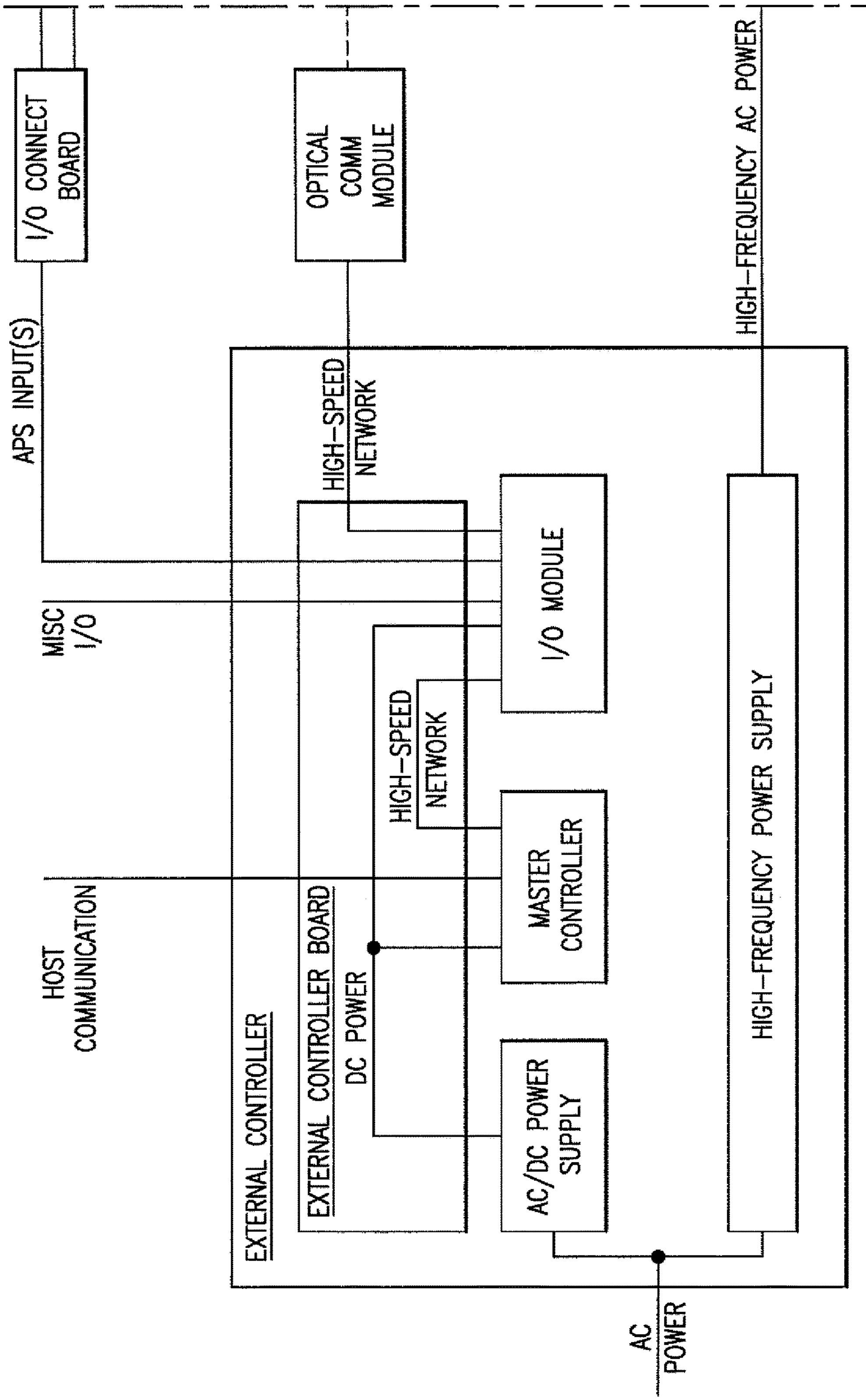
Figure 36:
Figure 36B:
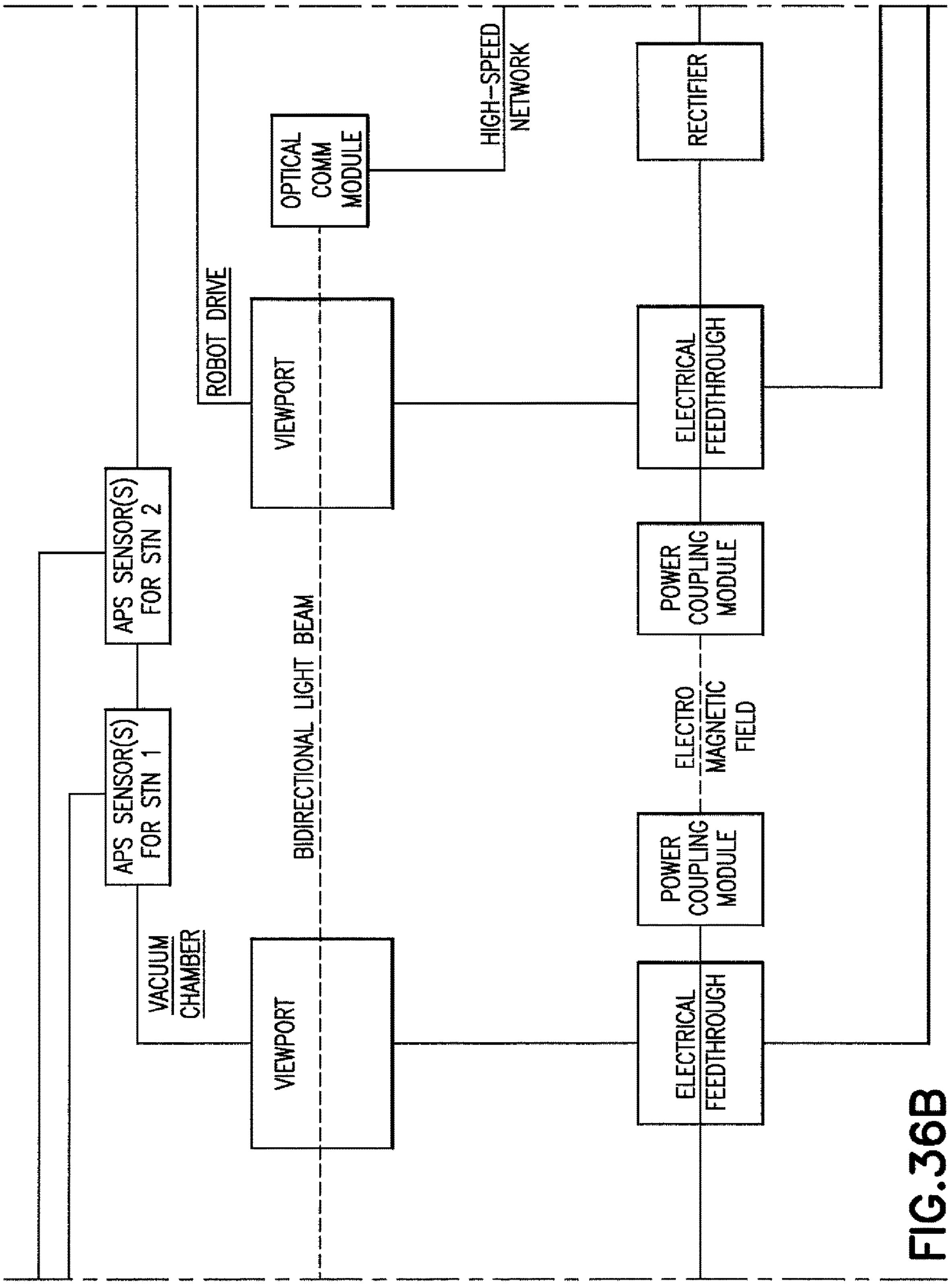
Figure 36C:
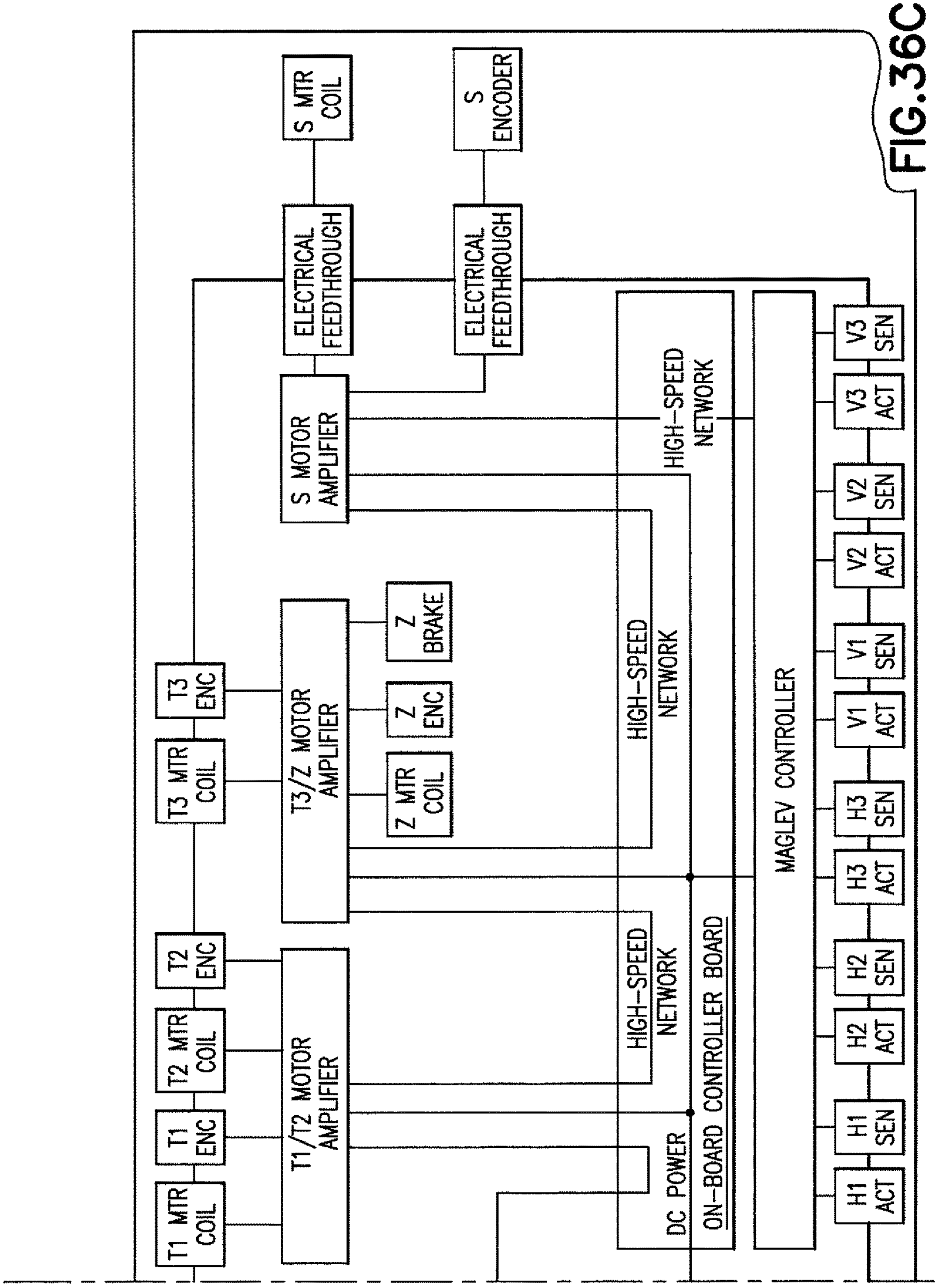

The master controller may receive over the high-speed network positions of all axes of motion (periodically from the motor amplifiers), status of digital and analog inputs (from the I/O module and, if applicable, from the motor amplifiers) and timing of digital input changes (from the I/O module and, if applicable, from the motor amplifiers). The master controller may send over the high-speed network commanded currents for each axis of motion (periodically to the motor amplifiers) and information to set digital and analog outputs (to the I/O module and, if applicable, to the motor amplifiers). Whether a rail based linear system or a maglev linear systems, the control system may comprise use of an optical communications link or other wireless communications link. For example, as shown in FIGS. 32 and 36 the system may comprise two optical communications modules with respective viewports in the vacuum chamber wall and the robot drive wall. Thus, an optical communication link may be provided between the external controller and the robot drive, which may include a closed loop control as noted above.

The I/O module may read digital and analog inputs (which may include inputs from APS sensors) and set digital and analog outputs. The I/O module may receive over the high-speed network information to set digital and analog outputs (from the master controller), and it may send over the high-speed network status of digital and analog inputs (to the master controller) and timing of digital input changes (also to the master controller).

Each of the motor amplifiers may perform the following functions: execution of motor commutation algorithm(s), execution of current control loops, reading digital and analog inputs, and setting digital and analog outputs. Each of the motor amplifiers may read periodically measured position(s) from the position encoder(s) and set output voltages for control of the motor(s). Each motor amplifier may receive from the master controller over the high-speed network commanded current(s) for the axis or axes of motion supported (periodically) and information to set digital and analog outputs. It may send to the master controller over the high-speed network the measured positions of the axis or axes of motion supported (periodically), status of digital and analog inputs and, if applicable, timing of digital input changes.

The high-speed network (e.g., EtherCAT) may facilitate communication between the master controller and the I/O module as well as the motor amplifiers. The outbound traffic (i.e., from the master controller to the I/O module and motor amplifiers) may include commanded currents for each axis of motion (sent periodically from the master controller to the motor amplifiers) and information to set digital and analog outputs (sent from the master controller to the I/O module and, if applicable, to the motor amplifiers). The inbound traffic (i.e., from the I/O module and motor amplifiers to the master controller) may include measured positions (from the motor amplifiers), status of digital and analog inputs (from the I/O module and, if applicable, from the motor amplifiers) and timing of digital input changes (from the I/O module and, if applicable, from the motor amplifiers).

If APS (adaptive placement system) functionality is required, APS sensor(s) may be routed directly or through an I/O connection board to one or more inputs of the I/O module. The purpose of the optional I/O connection board is to reduce the number of inputs routed to the I/O module.

Figure 33A:
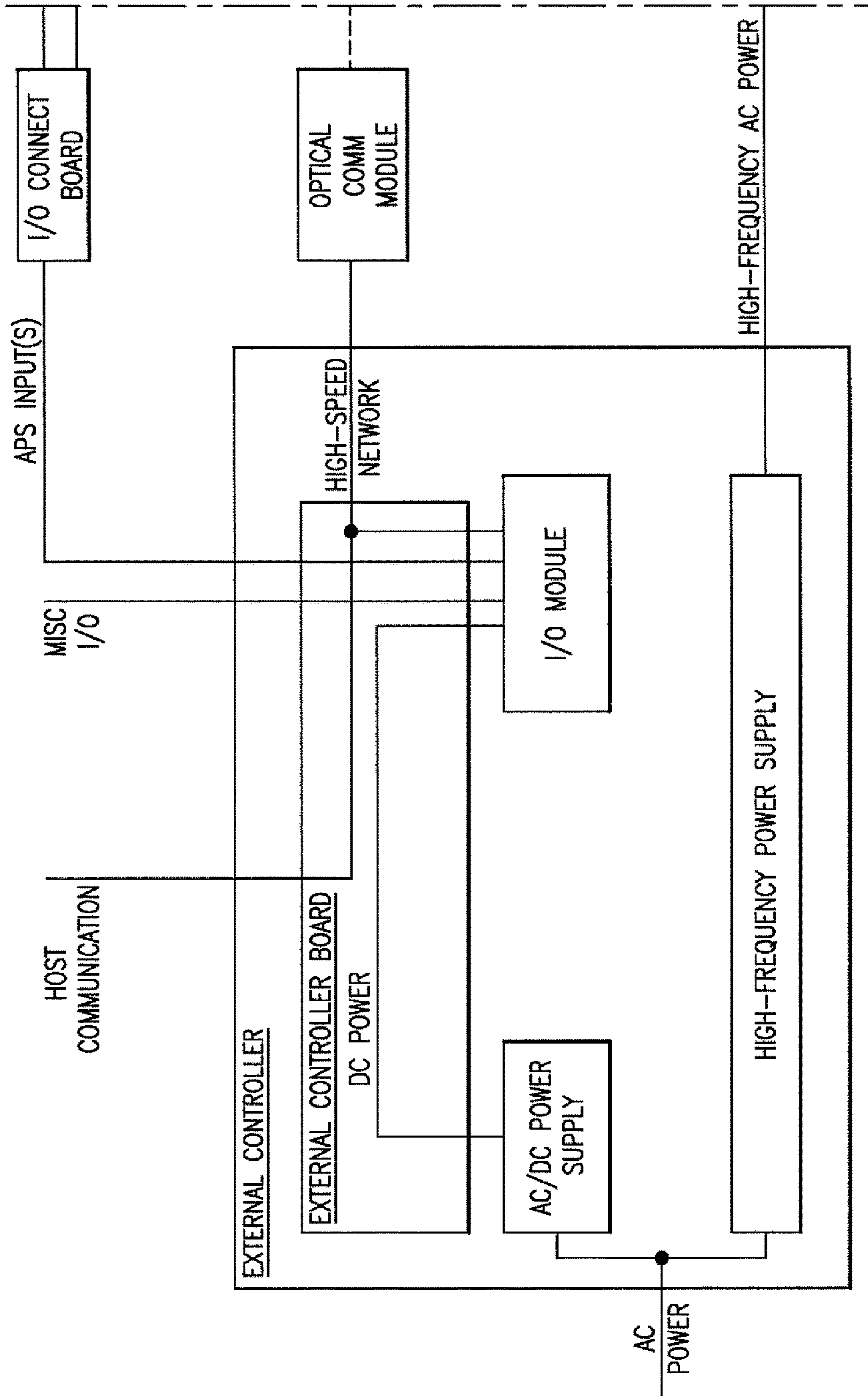
Figure 33:
Figure 33B:
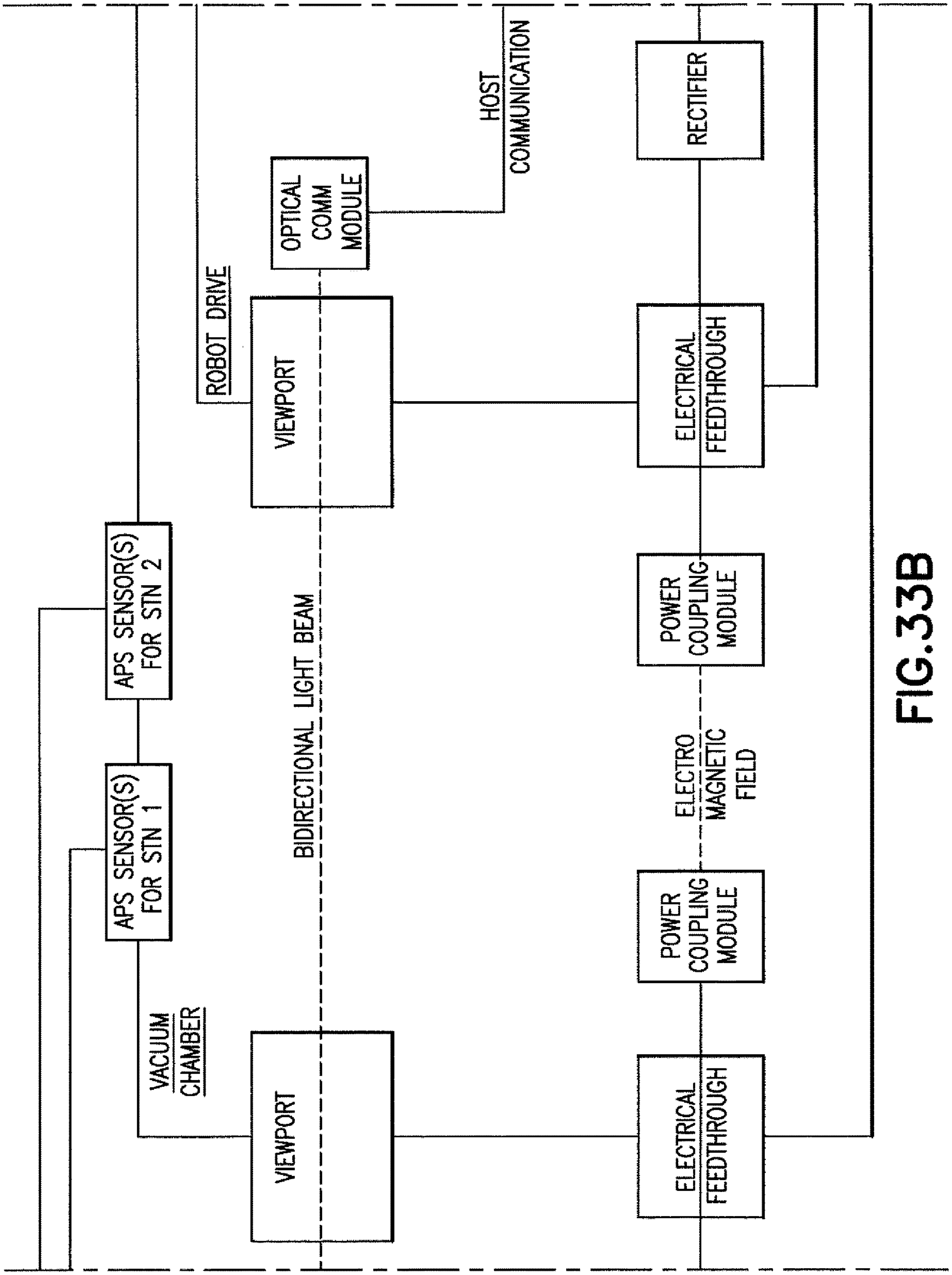
Figure 33C:
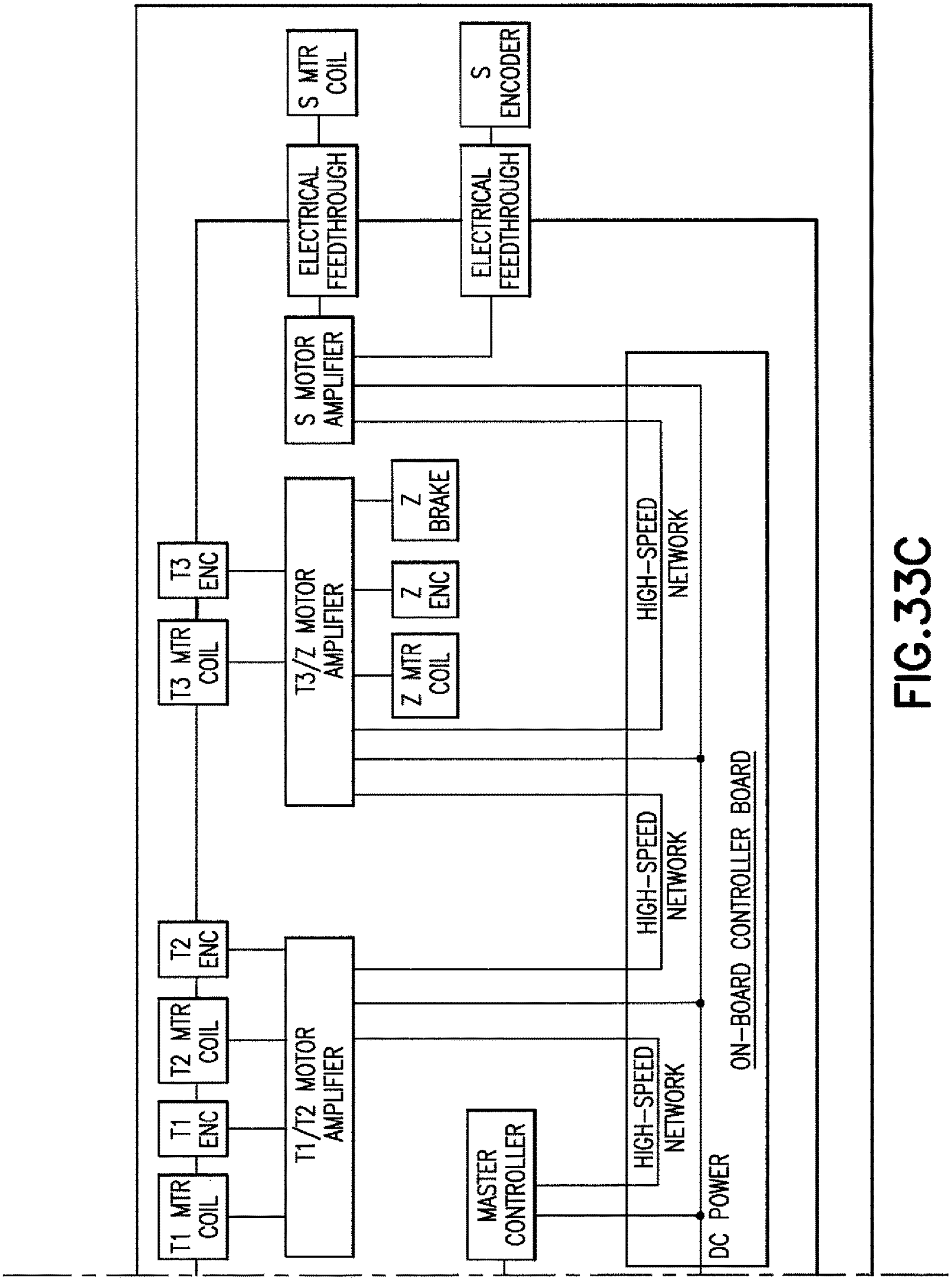

A block diagram of another example embodiment of the linear robot control system is provided in FIG. 33. In this example embodiment, the master controller may be located in the robot drive as opposed to being part of the external controller.

In the example embodiment of FIG. 33, the master controller may communicate with the motor amplifiers over the high-speed network substantially the same way as in the previous embodiment. However, another means of communication may be used for communication between the master controller and the I/O module. As an example, a separate communication network (e.g., Ethernet) may be used. The same communication network may also be utilized for communication with the host controller, as depicted diagrammatically in FIG. 33, in which case a network router may be conveniently incorporated into the external controller board. Alternatively, a separate means of communication may be used for communication between the host controller and the master controller and for communication between the master controller and the I/O module. These two communication channels may take place over the same physical medium (e.g., serial communication over Ethernet) or use different physical media.

The communication between the master controller and the I/O module may allow for synchronization of the clocks running on the two devices or feature another mechanism to properly determine timing of digital input changes on the I/O module for APS calculation purposes (for instance, an offset between the two clocks may be identified periodically and applied when a digital input change occurs).

Figure 34A:
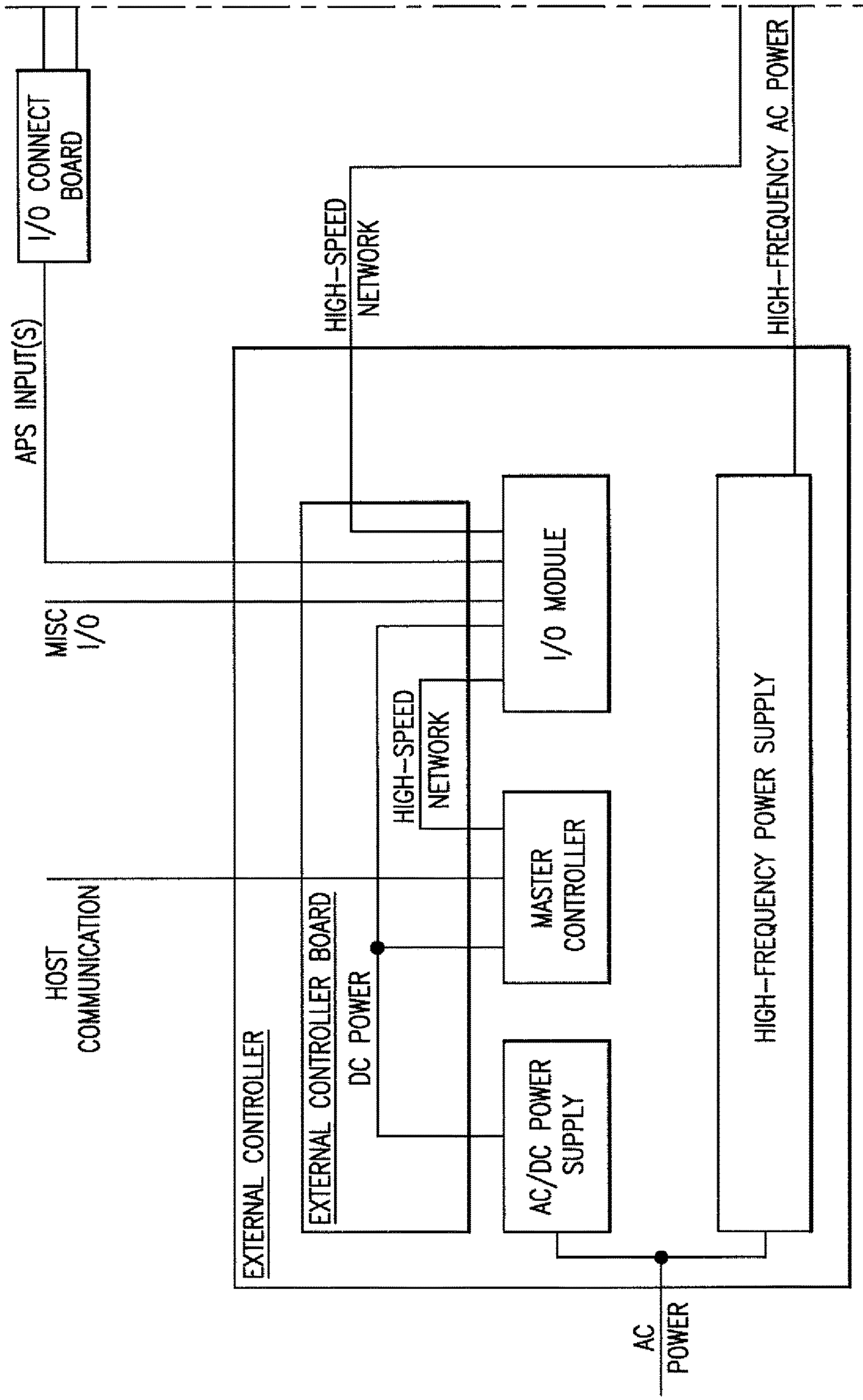
Figure 34:
Figure 34B:
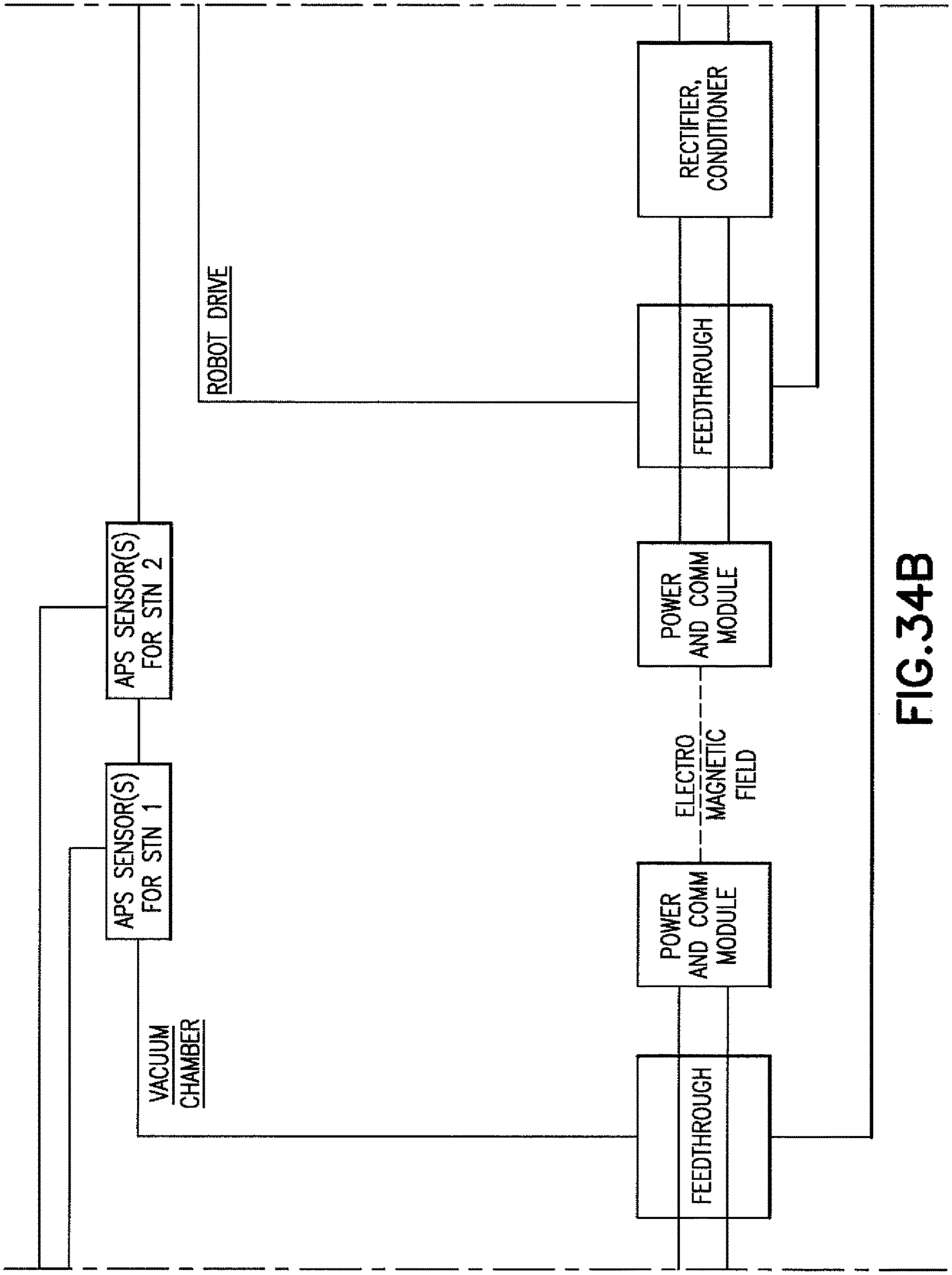
Figure 34C:
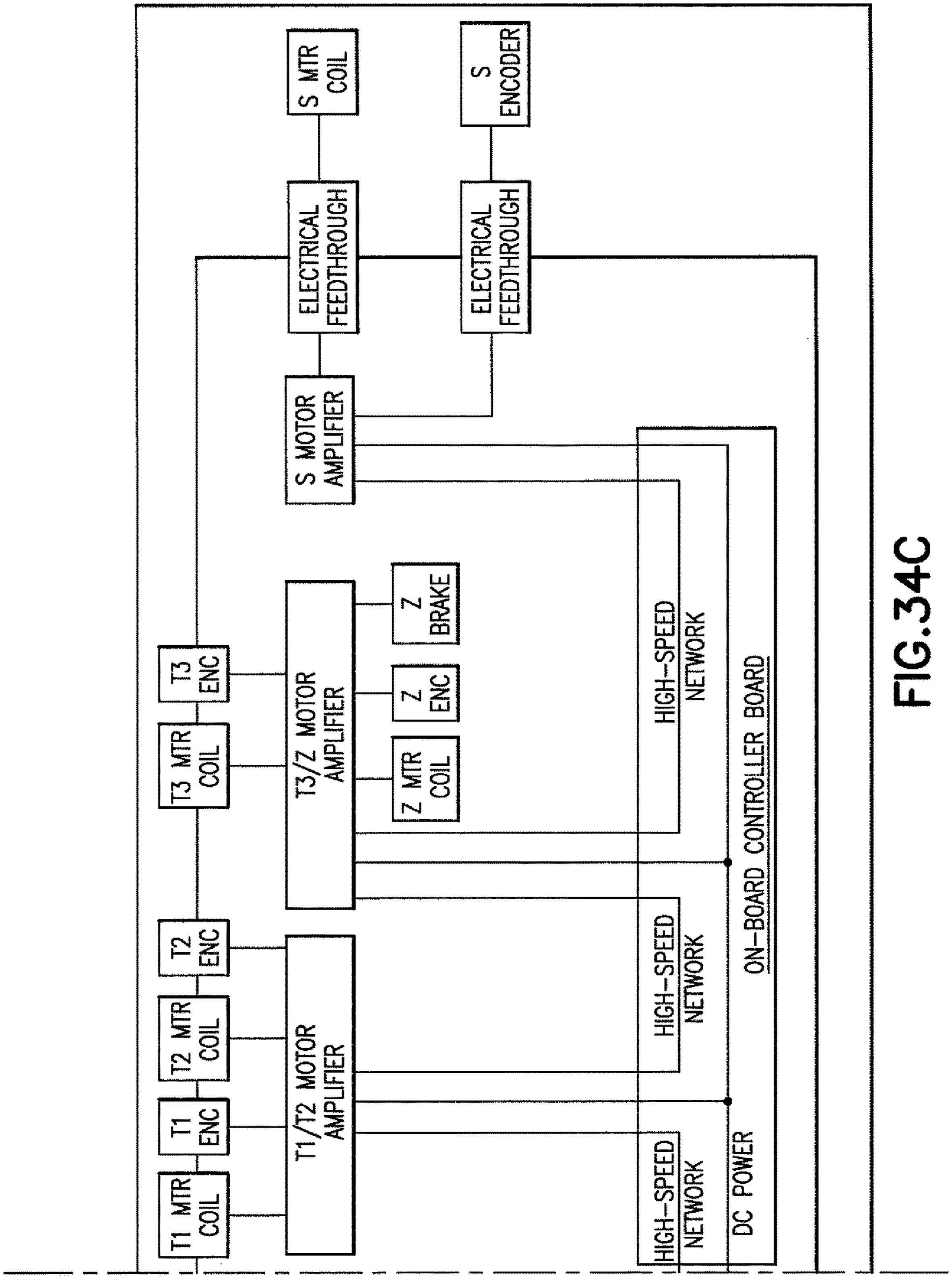
Figures 35, 35A:
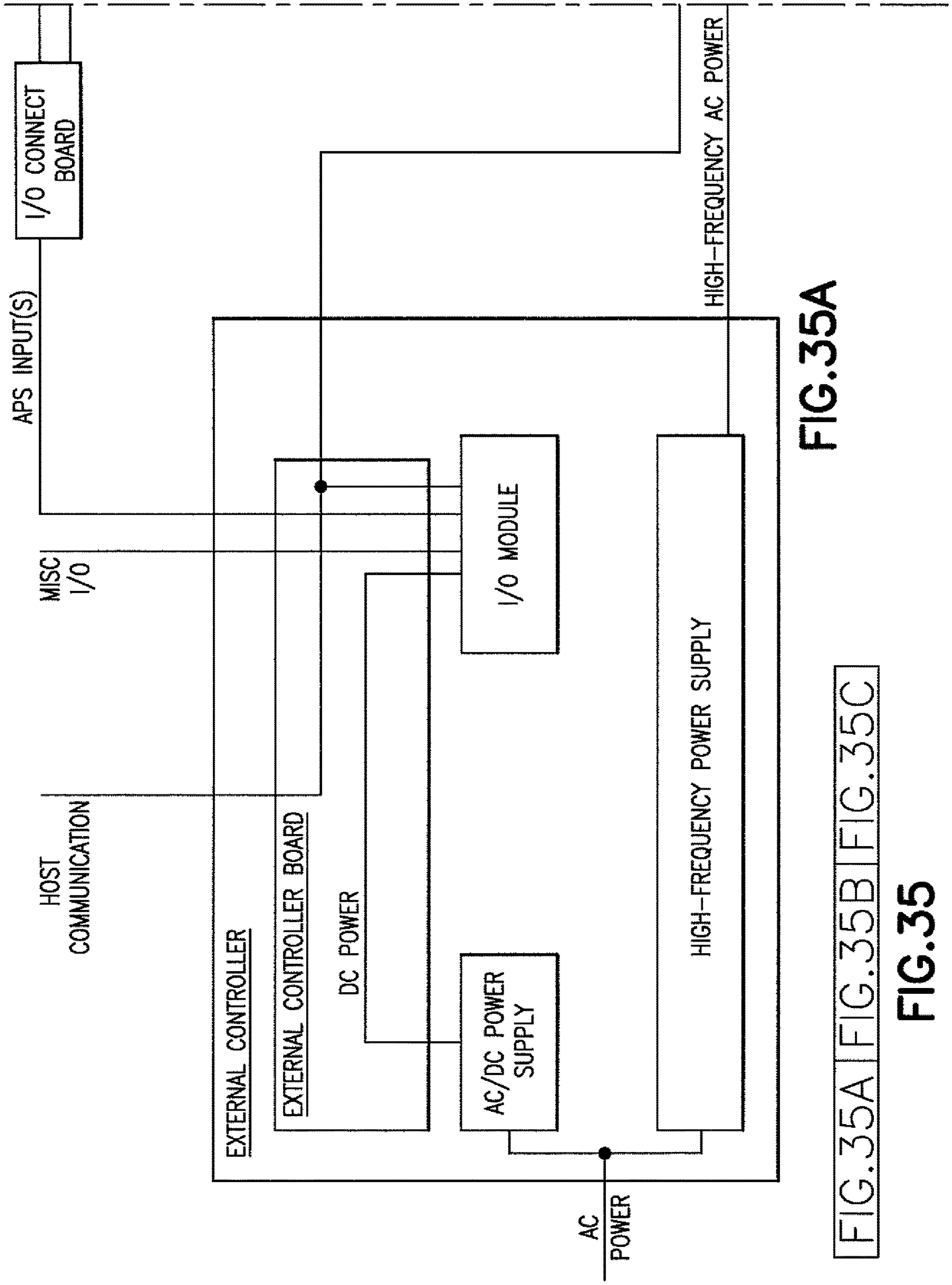
Figure 35B:
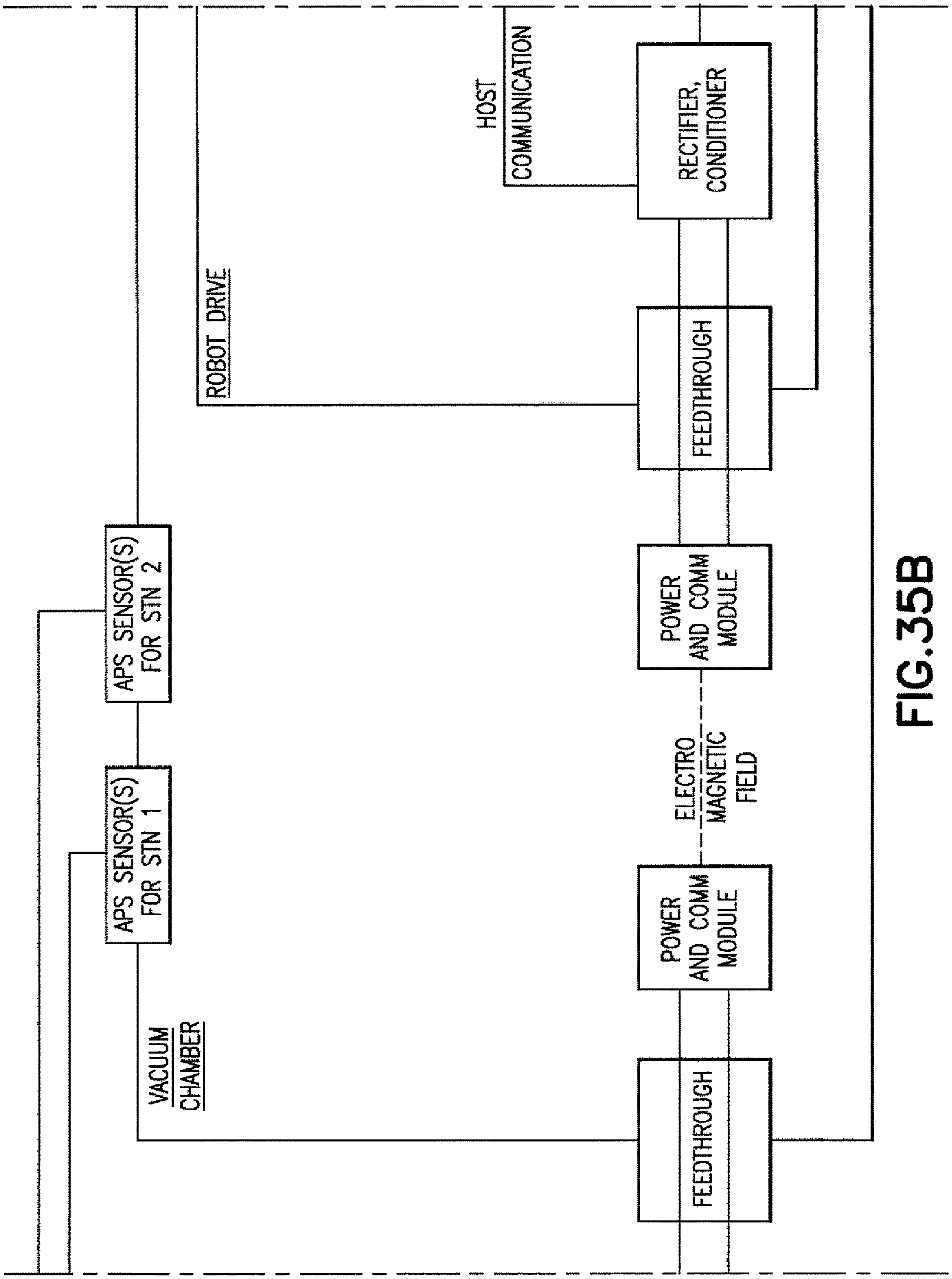
Figure 35C:
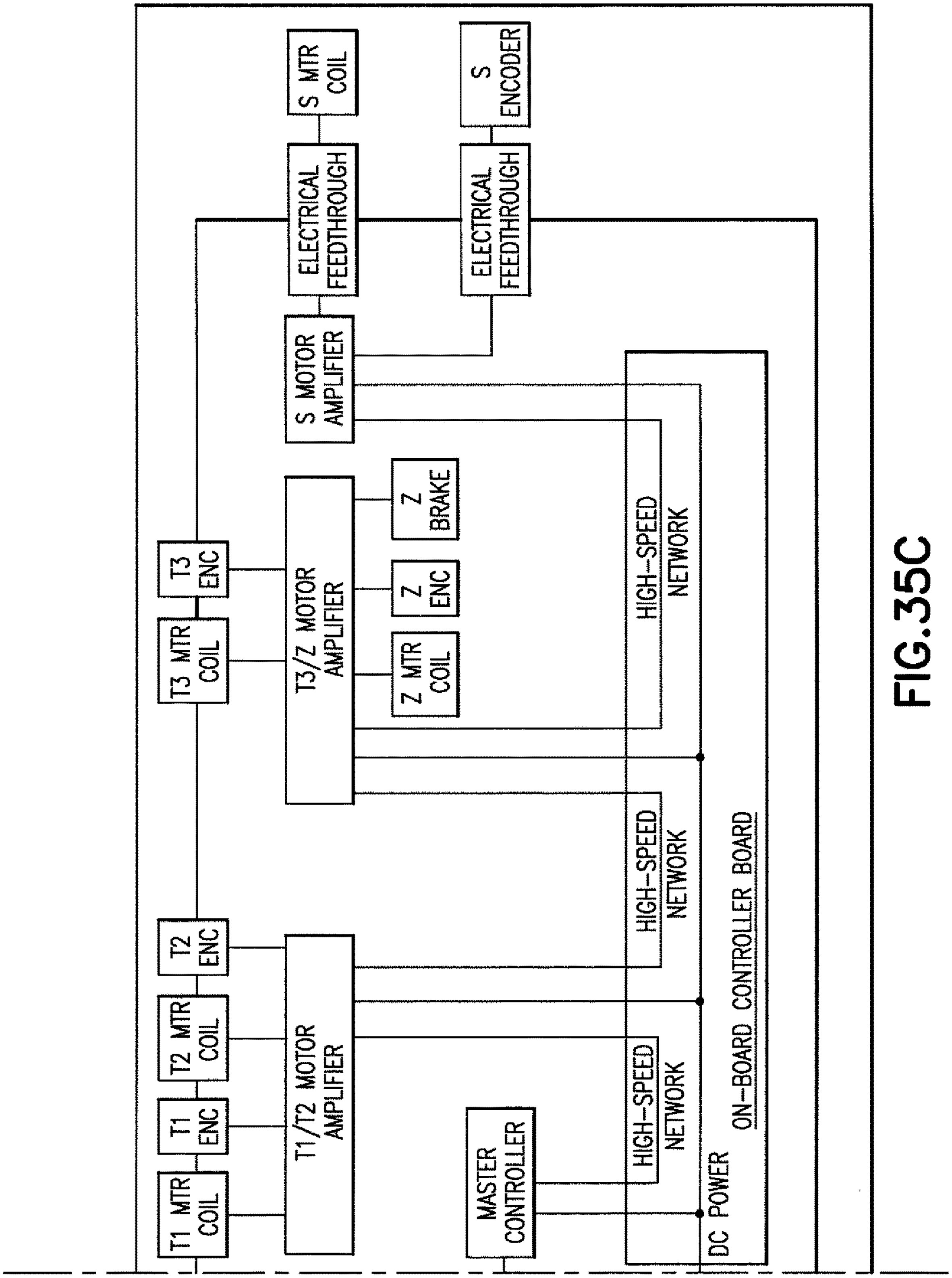

In yet another example embodiment, the high-speed communication via bidirectional light beam may be routed through the power coupling. The power coupling may employ the same set of coils as for power transmission or and additional set of coils to transmit data. An example embodiment equivalent to FIG. 32 is depicted diagrammatically in FIG. 34, and an example embodiment equivalent to FIG. 33 is shown diagrammatically in FIG. 35.

Block diagrams of additional example embodiments of the linear robot control system that include control of a magnetic support system (maglev) are shown in FIGS. 36-39.

The maglev controller may perform position control of the robot drive (e.g., control the five degrees of freedom associated with the lateral position, vertical position, pitch angle, roll angle and yaw angle of the robot drive) and run current control loops for each of the actuators of the magnetic support system. In the process, the maglev controller may periodically read measured positions from the position sensors of the magnetic support system (e.g., two horizontal sensors and three vertical sensors) and set output voltages for the force actuators of the magnetic support system (e.g., two horizontal actuator pairs and three vertical actuator pairs). The maglev controller may receive from the master controller over the high-speed network various commands, including commands to lift off, to maintain a given position (which may be conveniently expressed in the form of gaps between the robot drive and the guides of the magnetic support system) and to land the robot drive. Alternatively, the maglev controller may receive from the master controller a stream of commanded positions (e.g., in the form of data frames sent periodically).

As another alternative, the master control may execute position control of the robot drive via the magnetic support system. In the process, the master controller may receive periodically from the maglev controller over the high-speed network measured positions from the sensors of the magnetic support system and send periodically to the maglev controller over the high-speed network commanded currents for each force actuator of the magnetic support system. In this arrangement, the maglev controller may still run current control loops for each of the actuators of the magnetic support system.

Figures 37, 37A:
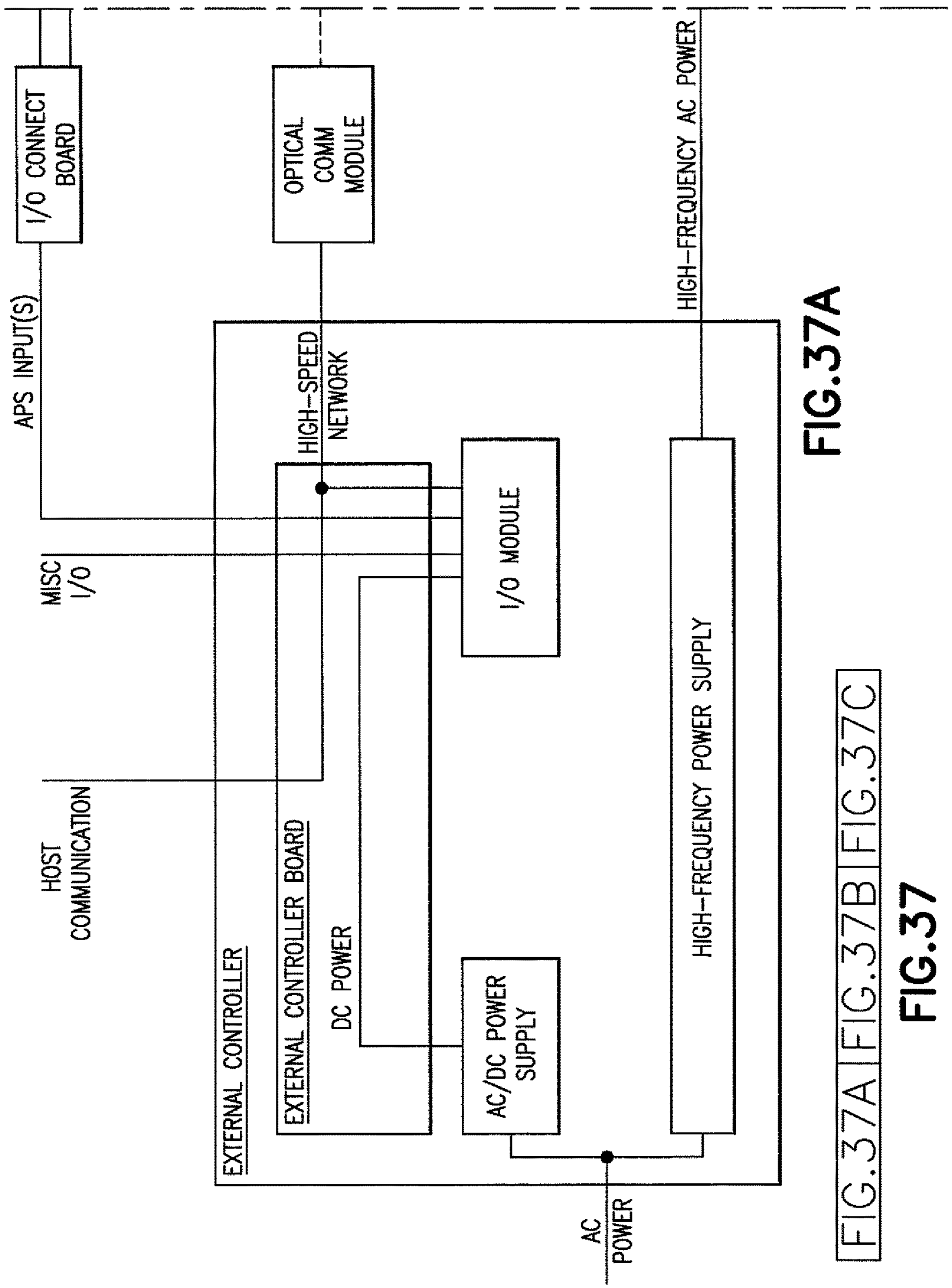
Figure 37B:
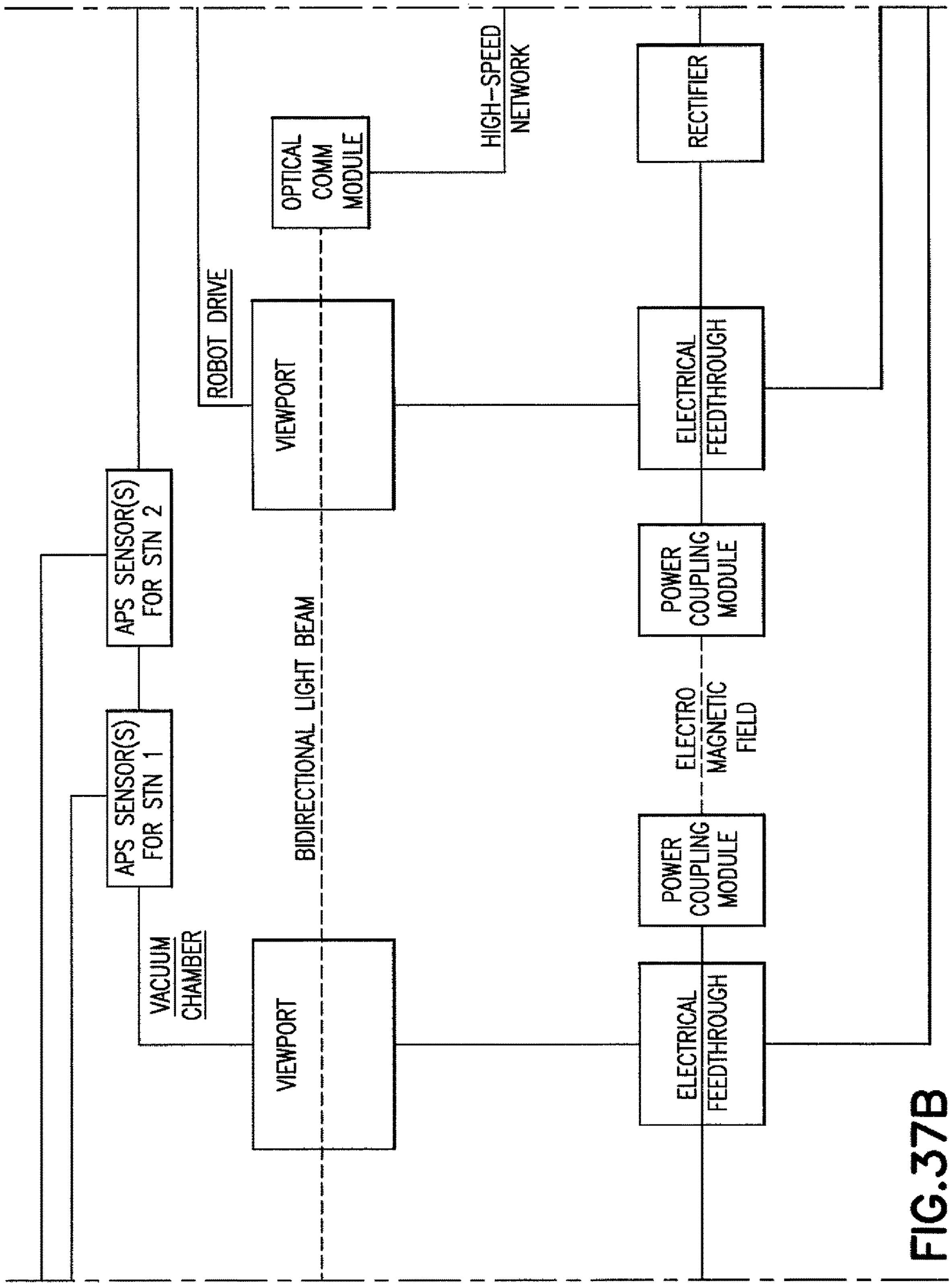
Figure 37C:
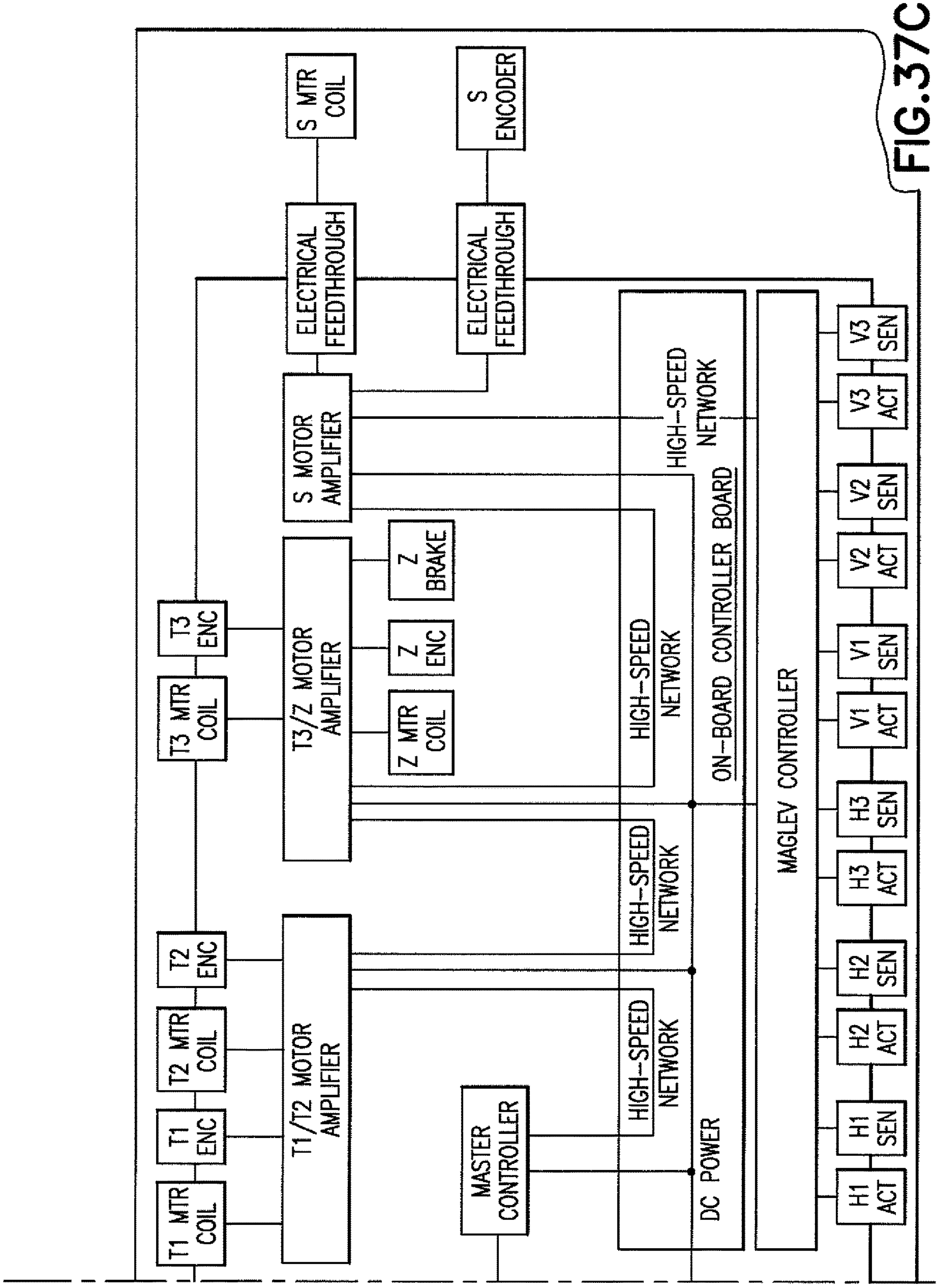
Figures 38, 38A:
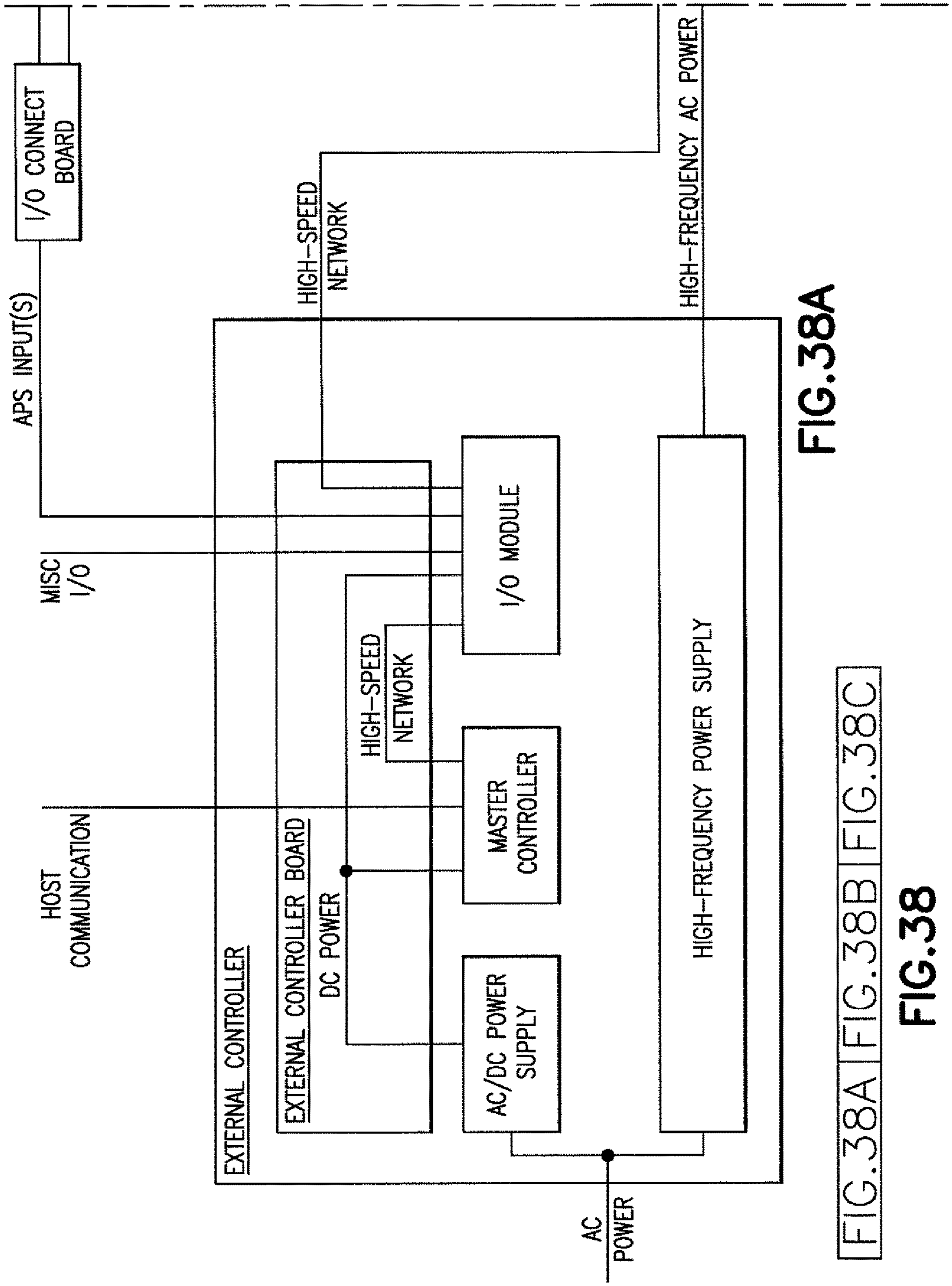
Figure 38B:
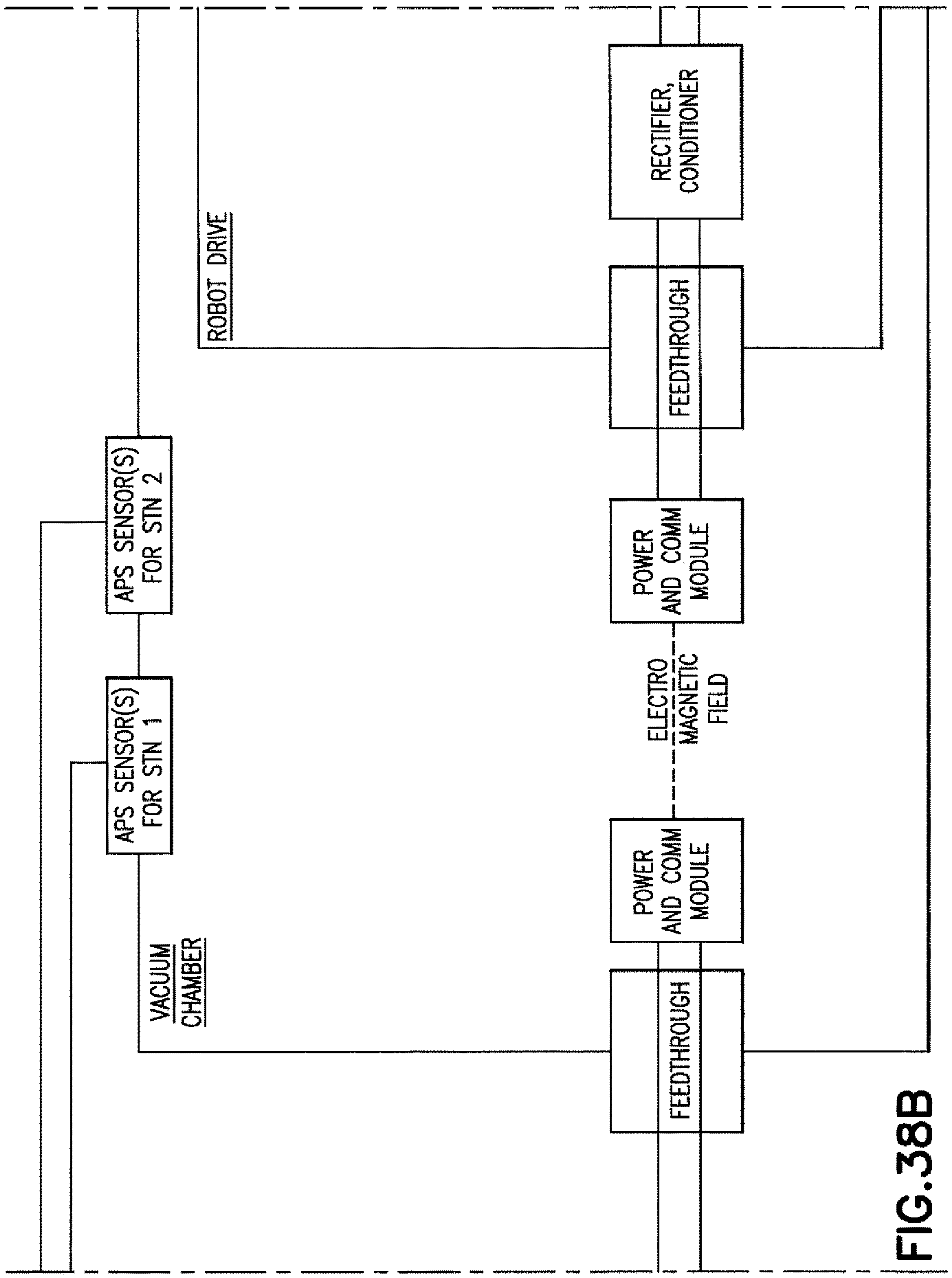
Figure 38C:
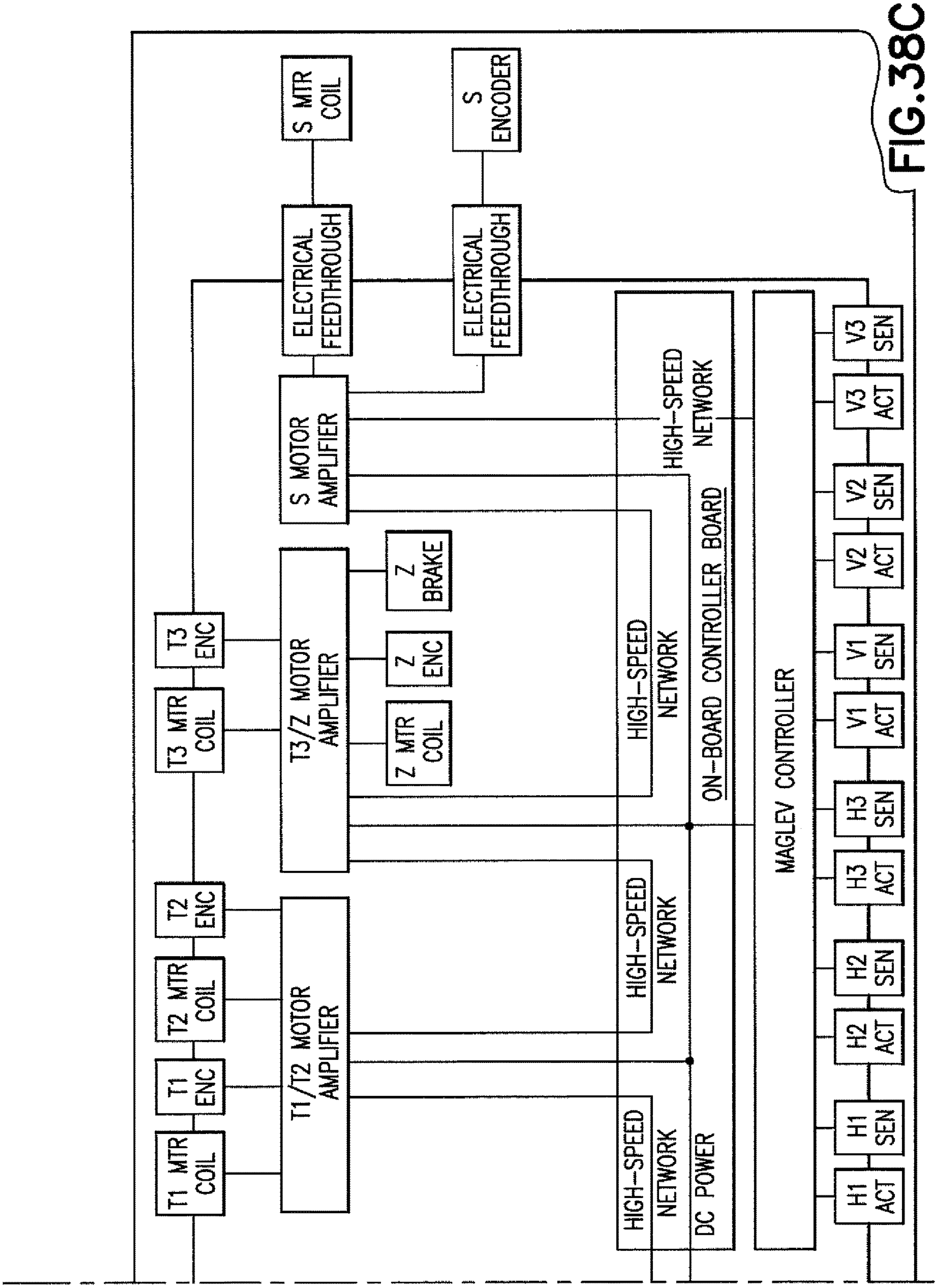
Figures 39, 39A:
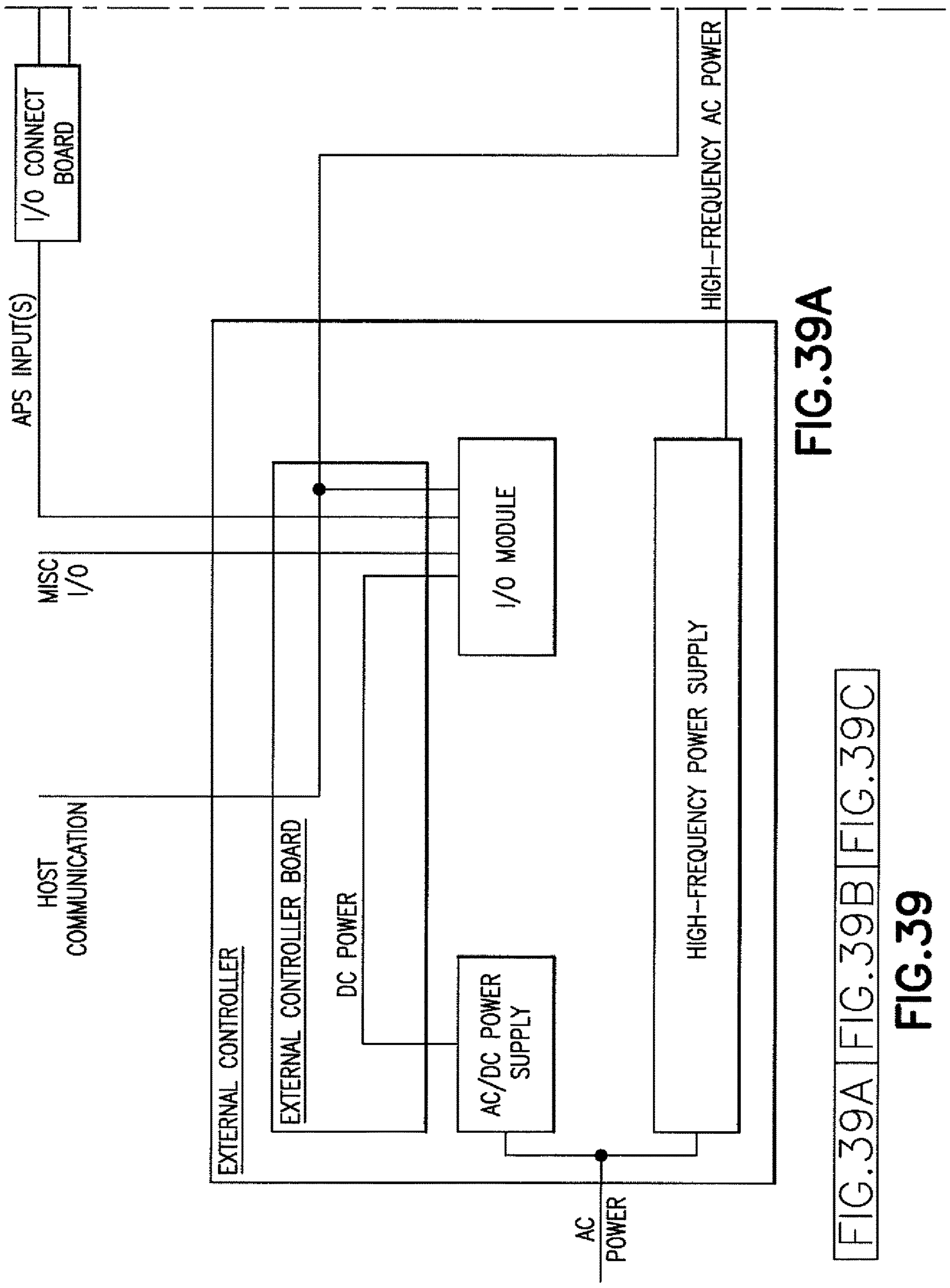
Figure 39B:
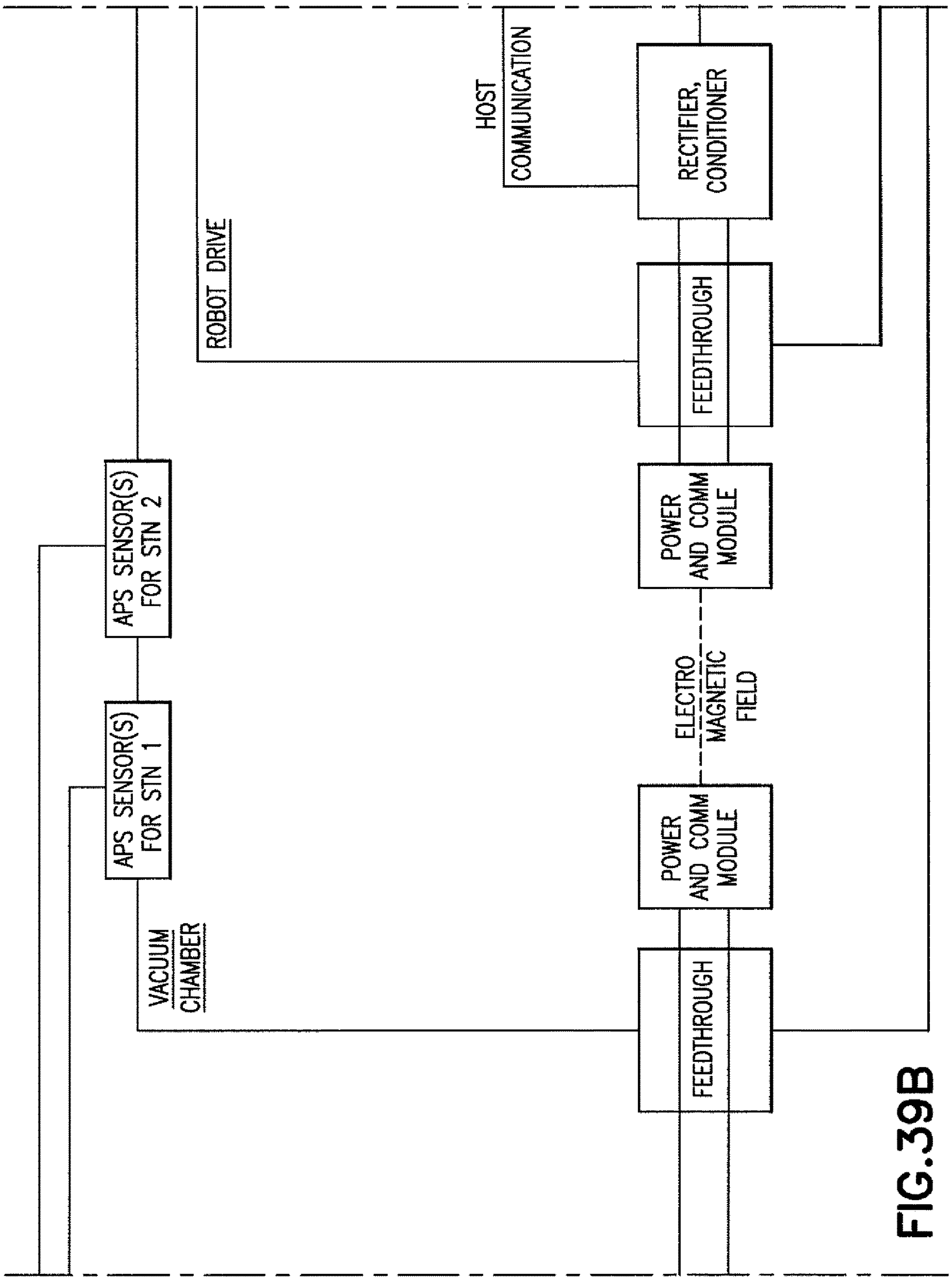
Figure 39C:
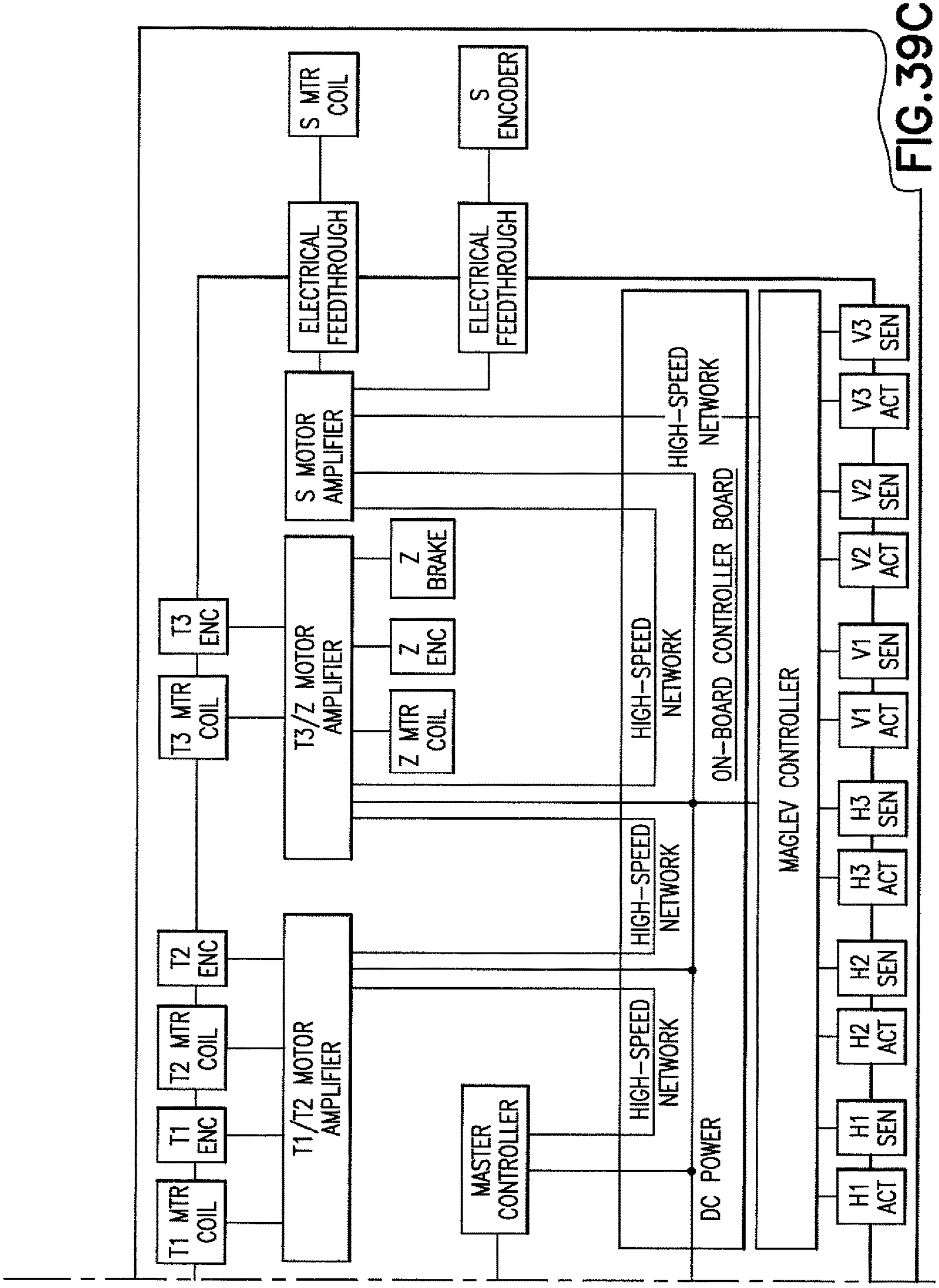

In the example embodiments of FIGS. 37 and 39, the existing high-speed communication network is utilized to facilitate the communication between the master controller and the maglev controller. However, any other suitable means of communication, such as another network or a point-to-point bus, between the two devices may be utilized.

Also, although a single maglev controller is shown in FIGS. 36-39, any suitable number of maglev controllers may be employed, each being allocated to a subset of position sensors and force actuator of the magnetic support system.

Figures 40, 40A:
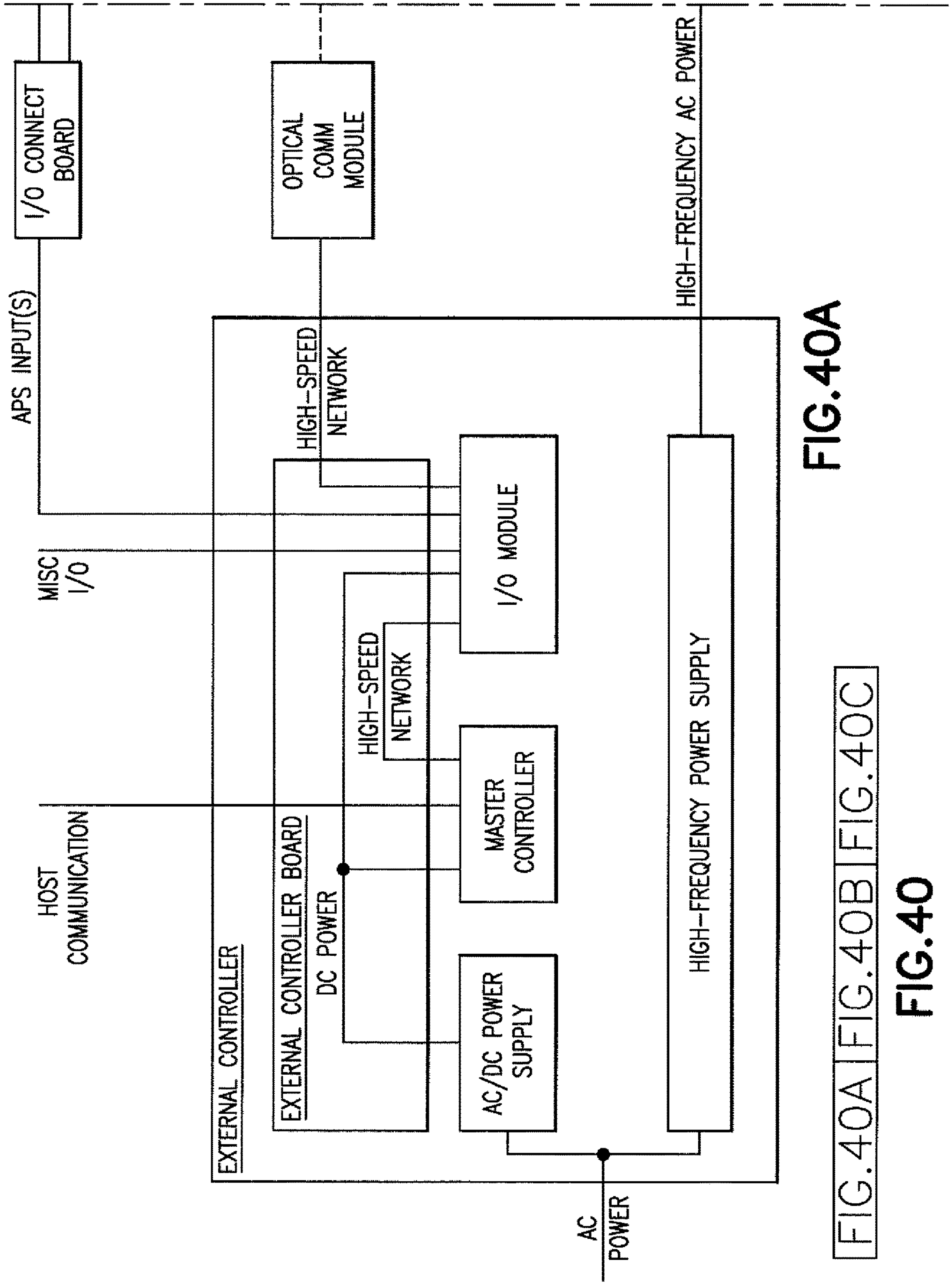
Figure 40B:
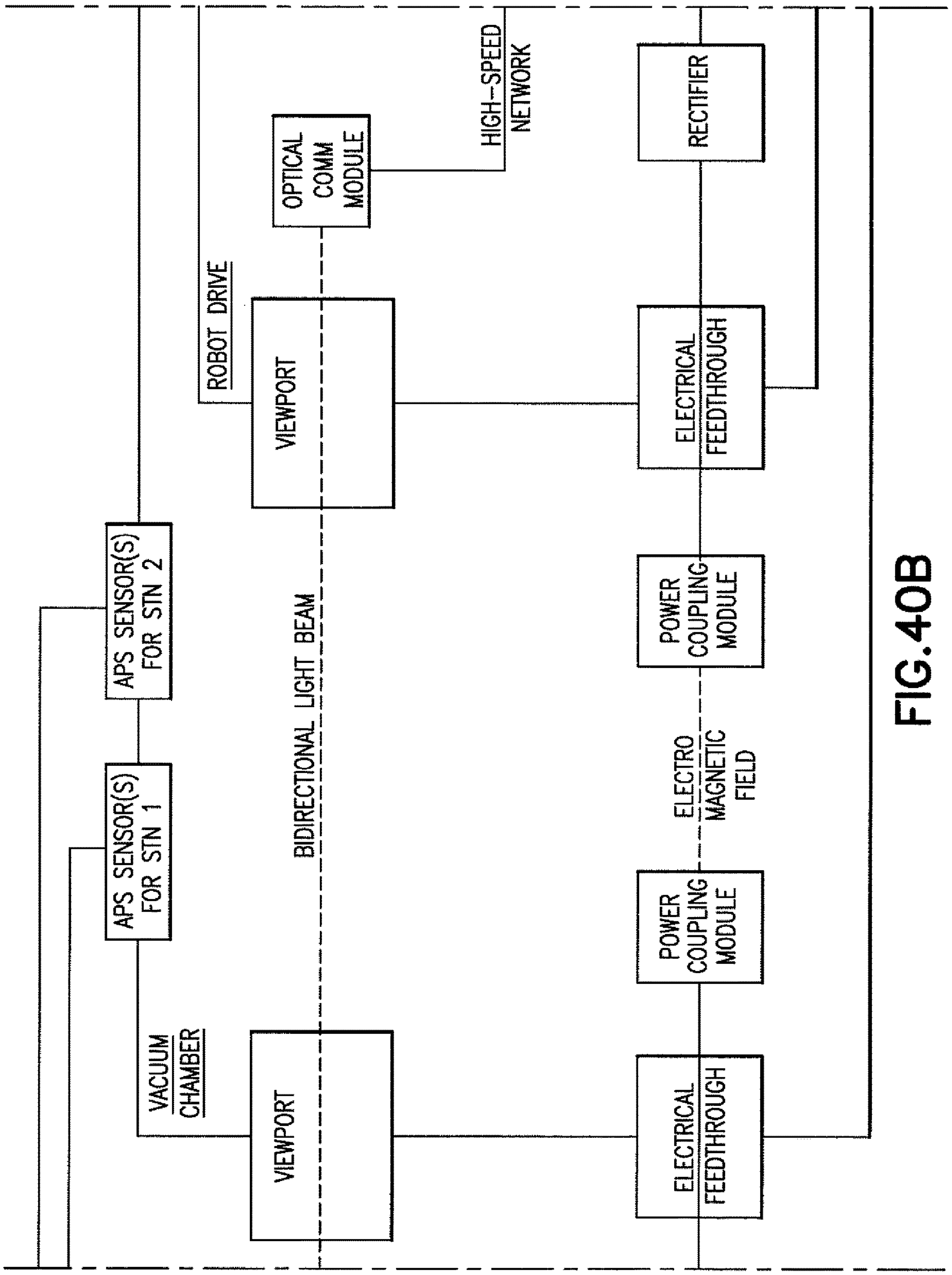
Figure 40C:
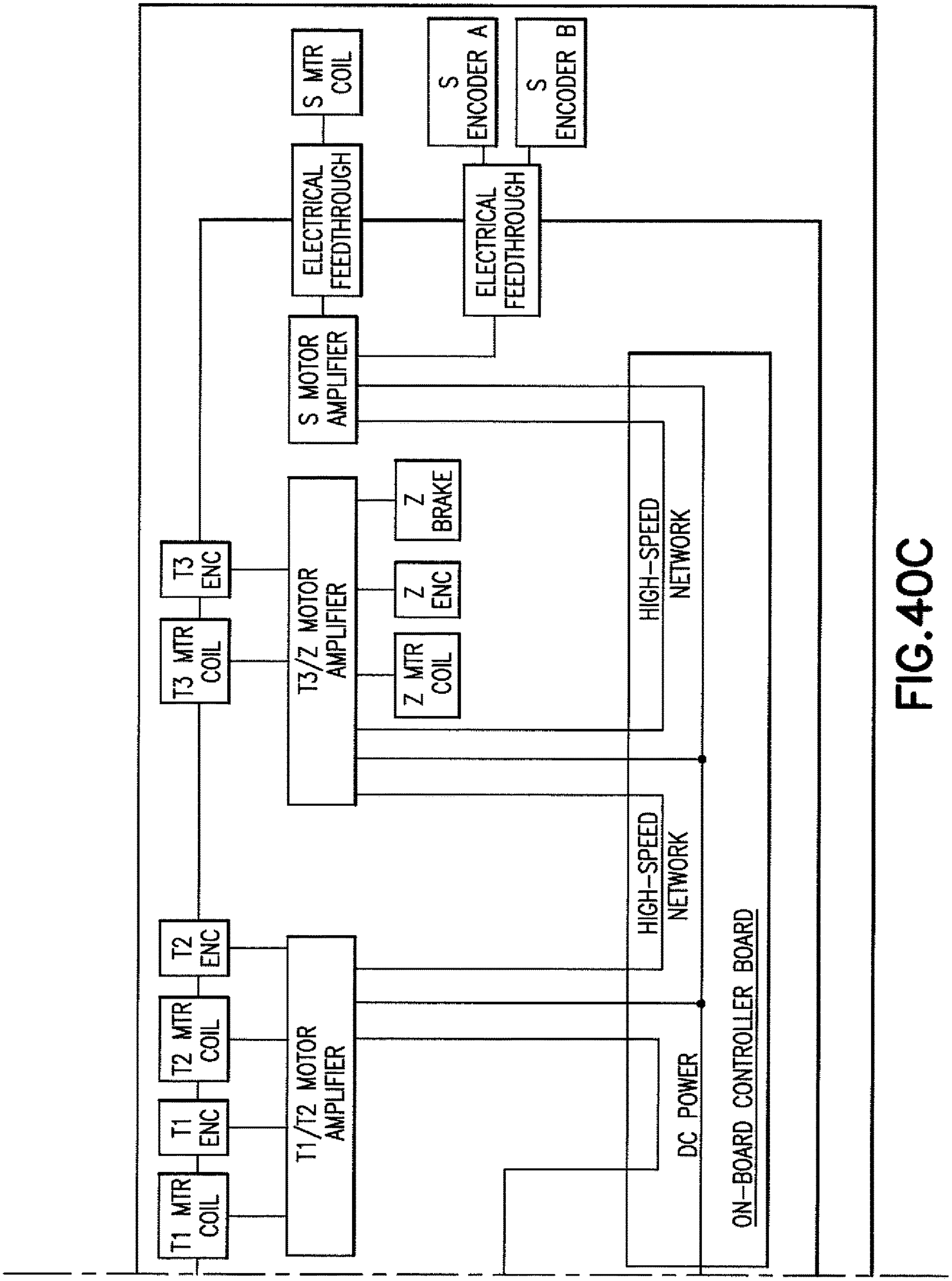
Figures 41, 41A:
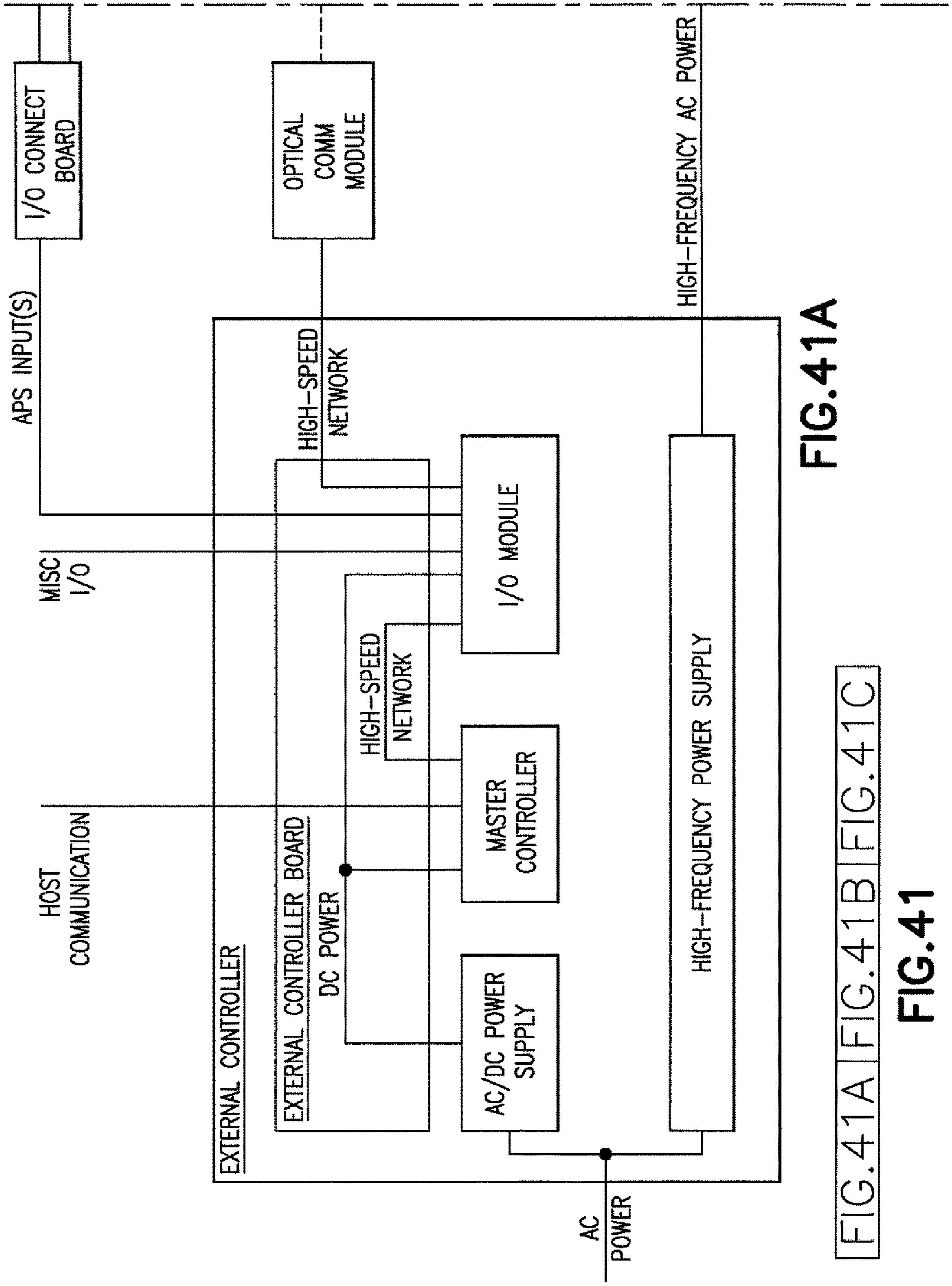
Figure 41B:
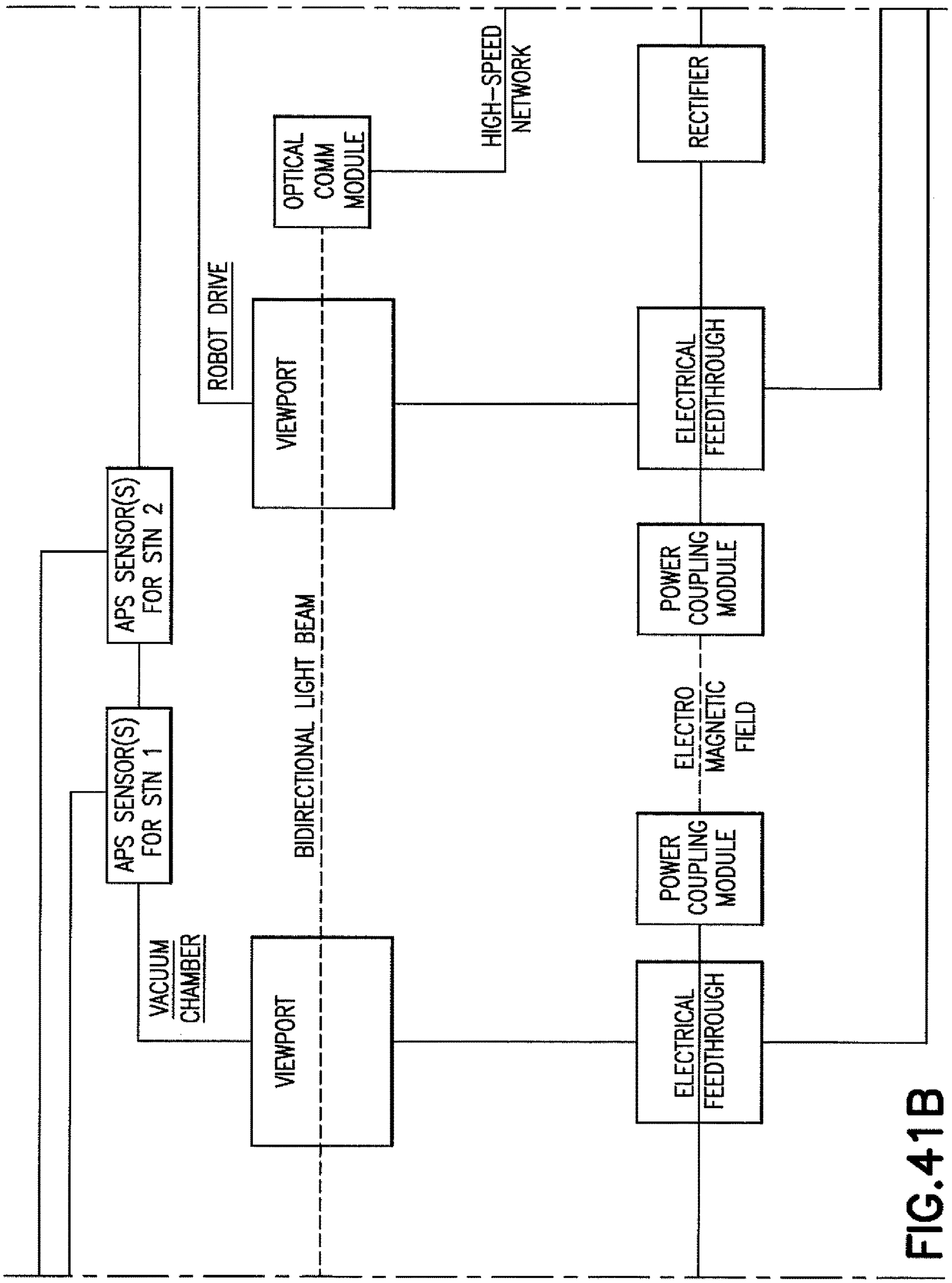
Figure 41C:
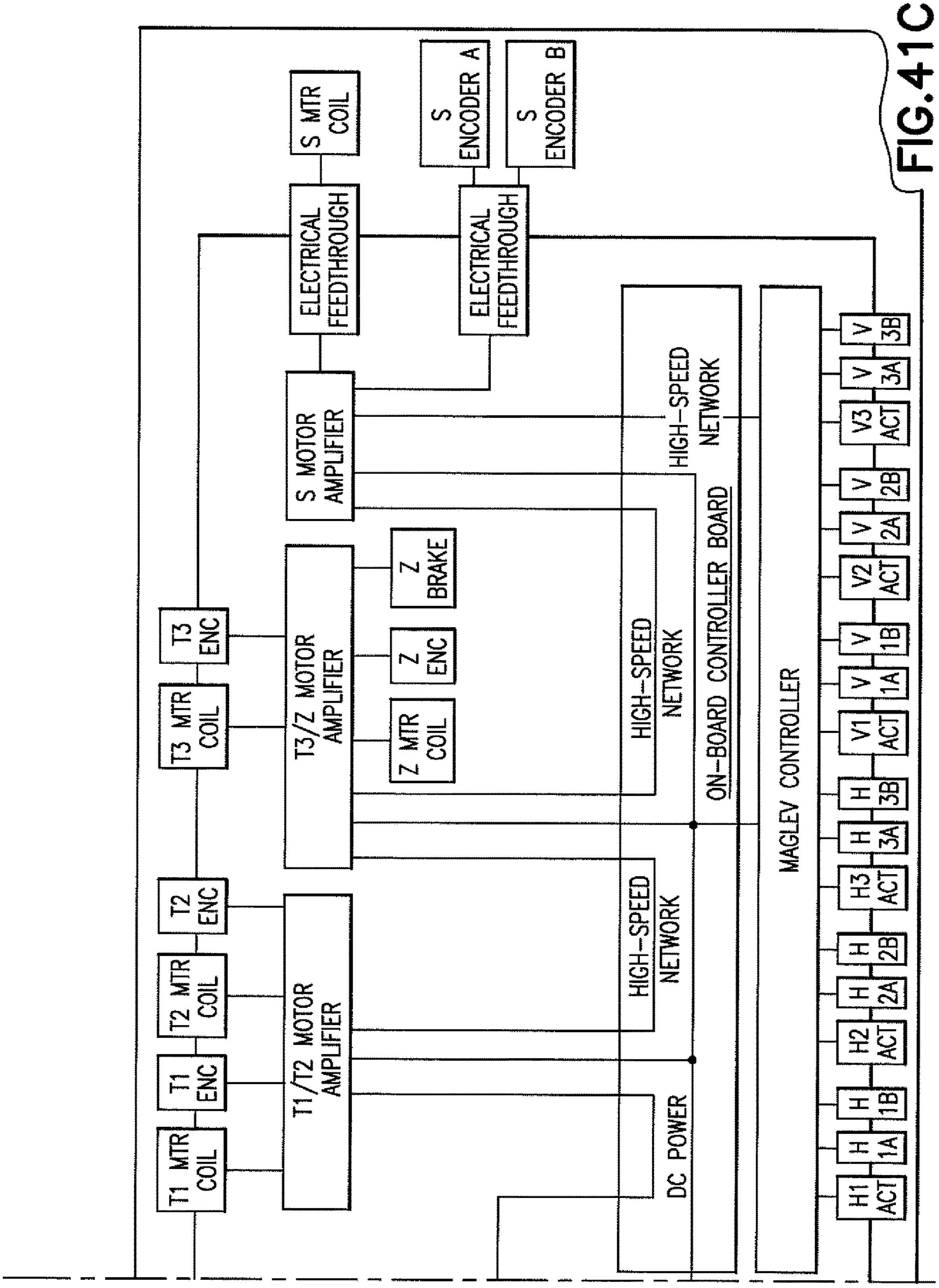

In order to support a modular design of the vacuum chamber (i.e., a vacuum chamber composed of multiple sections), an additional encoder read-head for the linear actuation system and/or additional position sensors for the magnetic support system may be utilized to enable smooth transition between individual sections of the vacuum chamber. This is diagrammatically illustrated in FIGS. 40 and 41, which build on the example embodiments of FIGS. 32 and 36, respectively.

All of the above embodiments may include additional feature that have been left from the diagrams for the sake of simplicity. For example, the external controller may include support for a teach pendant, e-stop, interlocks, safety circuitry (including solid-state components and electromechanical contactor(s)) and energy storage (e.g., batteries and/or capacitors). Similarly, the on-board controller may feature safety circuitry (including solid-state components and electromechanical contactor(s)) back emf regeneration system and power storage (e.g., batteries and/or capacitors).

Although the above example embodiments described with respect to FIGS. 32-39 show three rotary axes of motion (T1, T2 and T3), any number of rotary axes or no rotary axis may be used. Similarly, although the above example embodiments of FIGS. 32-39 show one z-axis, any number of z-axes or no z-axis may be employed. And while FIGS. 36-39 show control of a magnetic support system (maglev) with three horizontal sensor-actuator arrangements and three vertical sensor-actuator arrangements, any suitable number of discreet or integrated sensors and actuators may be used.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus, comprising:

a first device configured to support a substrate thereon;

a first transport having the first device connected thereto, where the first transport is configured to support the first device for movement along a horizontal path, where the first transport comprises:

at least two guides;

a magnetic system configured to vertically space the first device over the at least two guides with a gap between the first device and the at least two guides, where the magnetic system comprises a first electromagnetic actuator at a first corner of a first side of the first device, a second electromagnetic actuator at a second corner of the first side of the first device, and a third electromagnetic actuator at a second opposite side of the first device, where the third electromagnetic actuator is not located proximate a corner of three sides of the first device; and a linear actuator configured to move the first device in the path along the at least two guides;

where the first device comprises a robot enclosure having a robot motor therein, and a robot arm connected to the robot motor, where the robot arm is located outside of the robot enclosure, where the robot arm comprises an end effector configured to support the substate thereon, where the first side is a first lateral side of the robot enclosure and the second side is a second opposite lateral side of the robot enclosure.

2. The apparatus as in claim 1 further comprising first sensors at the first electromagnetic actuator, second sensors at the second electromagnetic actuator, and third sensors at the electromagnetic actuator, where the sensors are configured to measure a position of the first device with respect to the first and second guides.

3. The apparatus as in claim 1, further comprising a controller and a wireless communication device in communication with the first device, where the wireless communication device is configured to send to the controller positions of all axes of motion periodically from motor amplifiers of the apparatus, status of digital and analog inputs from input/output modules of the apparatus, and timing of digital input changes from the input/output modules of the apparatus.

4. The apparatus as in claim 3 where the wireless communication device is configured to send to the controller status of digital and analog inputs from the motor amplifiers and/or timing of digital input changes from the motor amplifiers.

5. The apparatus as in claim 3 where the wireless communication device is configured to receive from the controller commanded currents for each axis of motion to motor amplifiers, and information to set digital and analog outputs to input/output modules.

6. The apparatus as in claim 5 where the wireless communication device is configured to receive from the controller information to set digital and analog outputs to the motor amplifiers.

7. An apparatus, comprising:

a first device configured to support a substrate thereon;

a first transport having the first device connected thereto, where the first transport is configured to support the first device for movement along a horizontal path, where the first transport comprises:

at least two guides;

a magnetic system configured to vertically space the first device over the at least two guides with a gap between the first device and the at least two guides, where the magnetic system comprises a first electromagnetic actuator at a first corner of a first side of the first device, a second electromagnetic actuator at a second corner of the first side of the first device, and a third electromagnetic actuator at a second opposite side of the first device, where the third electromagnetic actuator is not located proximate a corner of three sides of the first device;

a linear actuator configured to move the first device in the path along the at least two guides; and a controller and a wireless communication device in communication with the first device, where the wireless communication device is configured to send to the controller positions of all axes of motion periodically from motor amplifiers of the apparatus, status of digital and analog inputs from input/output modules of the apparatus, and timing of digital input changes from the input/output modules of the apparatus.

8. The apparatus as claimed in claim 7, further comprising first sensors at the first electromagnetic actuator, second sensors at the second electromagnetic actuator, and third sensors at the electromagnetic actuator, where the sensors are configured to measure a position of the first device with respect to the first and second guides.

9. The apparatus as claimed in claim 7, where the wireless communication device is configured to send to the controller status of digital and analog inputs from the motor amplifiers and/or timing of digital input changes from the motor amplifiers.

10. The apparatus as claimed in claim 7, where the wireless communication device is configured to receive from the controller commanded currents for each axis of motion to motor amplifiers, and information to set digital and analog outputs to input/output modules.

11. The apparatus claimed in claim 10, where the wireless communication device is configured to receive from the controller information to set digital and analog outputs to the motor amplifiers.

* * * * *